United States Patent
Thielemans et al.

(10) Patent No.: US 12,119,330 B2
(45) Date of Patent: Oct. 15, 2024

(54) CONFIGURATIONS, METHODS, AND DEVICES FOR IMPROVED VISUAL PERFORMANCE OF A LIGHT-EMITTING ELEMENT DISPLAY AND/OR A CAMERA RECORDING AN IMAGE FROM THE DISPLAY

(71) Applicant: Stereyo BV, Nazareth (BE)

(72) Inventors: Robbie Thielemans, Nazareth (BE); Vince Dundee, Glendale, CA (US)

(73) Assignee: STEREYO BV, Nazareth (BE)

(*) Notice: Subject to any disclaimer, the term of this patent is extended or adjusted under 35 U.S.C. 154(b) by 0 days.

(21) Appl. No.: 18/217,201

(22) Filed: Jun. 30, 2023

(65) Prior Publication Data

US 2024/0203952 A1 Jun. 20, 2024

Related U.S. Application Data

(63) Continuation of application No. 18/216,459, filed on Jun. 29, 2023.
(Continued)

(51) Int. Cl.
*H01L 25/075* (2006.01)
*H01L 33/00* (2010.01)

(52) U.S. Cl.
CPC ........ *H01L 25/0753* (2013.01); *H01L 33/005* (2013.01); *H01L 2933/005* (2013.01); *H01L 2933/0058* (2013.01)

(58) Field of Classification Search
CPC ............. G09G 3/32; G09G 2320/0242; G09G 2320/068; G09G 2300/0452;
(Continued)

(56) References Cited

U.S. PATENT DOCUMENTS 5,767,818 A  6/1998 Nishida
6,055,071 A  4/2000 Kuwata et al.
(Continued)

FOREIGN PATENT DOCUMENTS

BE  20195196  3/2019
BE  20195142  7/2019
(Continued)

OTHER PUBLICATIONS

Baker, Simon, "Pulse Width Modulation (PWM)", Mar. 17, 2015, 13 pages, TFT Central.
(Continued)

*Primary Examiner* — Muhammad N Edun
(74) *Attorney, Agent, or Firm* — Workman Nydegger

(57) ABSTRACT

The invention relates to a light source display, comprising a plurality of light-emitting elements (LEEs), such as for example LEDs, being arranged on a horizontal and vertical grid resulting in an array or a matrix of LEEs or LEDs forming a LEE or LED board. More particularly, the invention relates to a display with a drive circuit configuration comprising at least two drive circuits, wherein at least one of the LEEs or LEDs driven by a first driver of a first drive circuit is residing physically with a second drive circuit. Herewith, improved visual performance of the display can be achieved, as well as improved interplay of the display with a camera recording an image from the display, or else the display can be enhanced for 3D application.

27 Claims, 28 Drawing Sheets

Related U.S. Application Data

(60) Provisional application No. 63/433,646, filed on Dec. 19, 2022.

(58) Field of Classification Search
CPC ......... G09G 2310/08; G09G 2320/064; G09G 2320/0693; H04N 5/222
See application file for complete search history.

(56) References Cited

U.S. PATENT DOCUMENTS

| | | |
|---|---|---|
| 6,483,555 B1 | 11/2002 | Thielemans et al. |
| 6,717,625 B1 | 4/2004 | Thielemans |
| 7,015,902 B2 | 3/2006 | Nagai et al. |
| 7,019,721 B2 | 3/2006 | Thielemans et al. |
| 7,071,620 B2 | 7/2006 | Devos et al. |
| 7,071,894 B1 | 7/2006 | Thielemans et al. |
| 7,079,092 B2 | 7/2006 | Tanghe et al. |
| 7,102,601 B2 | 9/2006 | Devos et al. |
| 7,157,838 B2 | 1/2007 | Thielemans et al. |
| 7,176,861 B2 | 2/2007 | Dedene et al. |
| 7,205,729 B2 | 4/2007 | Thielemans et al. |
| 7,227,519 B1 | 6/2007 | Kawase et al. |
| 7,262,753 B2 | 8/2007 | Tanghe et al. |
| 7,301,273 B2 | 11/2007 | Dedene et al. |
| 7,365,720 B2 | 4/2008 | Bouwens et al. |
| 7,443,466 B2 | 10/2008 | Dedene et al. |
| 7,777,691 B1 | 8/2010 | Nimmer et al. |
| D730,309 S | 5/2015 | Hochman et al. |
| 9,069,519 B1 | 6/2015 | Hall |
| D751,998 S | 3/2016 | Hochman et al. |
| 9,380,720 B2 | 6/2016 | Thielemans et al. |
| 9,477,438 B1 | 10/2016 | Hochman et al. |
| D771,844 S | 11/2016 | Hochman et al. |
| 9,524,666 B2 | 12/2016 | Hochman et al. |
| 9,660,403 B2 | 5/2017 | Hochman et al. |
| 10,325,541 B2 | 6/2019 | Hochman et al. |
| 10,333,109 B2 | 6/2019 | Hochman et al. |
| 10,892,297 B2 | 1/2021 | Chae et al. |
| 10,917,679 B2 | 2/2021 | Dunning et al. |
| 11,310,436 B2 | 4/2022 | Hochman et al. |
| 11,328,655 B2 | 5/2022 | Sugiyama et al. |
| 11,445,123 B2 | 9/2022 | Deighton |
| 11,496,726 B2 | 11/2022 | Deighton |
| 11,552,061 B2 | 1/2023 | Chae et al. |
| 11,610,543 B2 | 3/2023 | Thielemans et al. |
| 11,695,907 B2 | 7/2023 | Steudel et al. |
| 11,881,151 B2 | 1/2024 | Thielemans et al. |
| 11,924,560 B2 | 3/2024 | Thielemans et al. |
| 11,948,501 B2 | 4/2024 | Thielemans et al. |
| 11,948,506 B2 | 4/2024 | Thielemans et al. |
| 2002/0163513 A1 | 11/2002 | Tsuji |
| 2003/0095138 A1 | 5/2003 | Kim et al. |
| 2003/0128299 A1 | 7/2003 | Coleman et al. |
| 2003/0133619 A1 | 7/2003 | Wong et al. |
| 2004/0113875 A1 | 6/2004 | Miller et al. |
| 2004/0207315 A1 | 10/2004 | Thielemans et al. |
| 2004/0212582 A1 | 10/2004 | Thielemans et al. |
| 2004/0233125 A1 | 11/2004 | Tanghe et al. |
| 2004/0233148 A1 | 11/2004 | Tanghe et al. |
| 2005/0017922 A1 | 1/2005 | Devos et al. |
| 2005/0052375 A1 | 3/2005 | Devos et al. |
| 2005/0116667 A1 | 6/2005 | Mueller et al. |
| 2005/0122406 A1 | 6/2005 | Voss et al. |
| 2005/0128751 A1 | 6/2005 | Roberge et al. |
| 2005/0133761 A1 | 6/2005 | Thielemans |
| 2005/0134525 A1 | 6/2005 | Tanghe et al. |
| 2005/0134526 A1 | 6/2005 | Willem et al. |
| 2005/0213128 A1 | 9/2005 | Imai et al. |
| 2006/0022914 A1 | 2/2006 | Kimura et al. |
| 2006/0139238 A1 | 6/2006 | Chiba et al. |
| 2006/0290614 A1 | 12/2006 | Nathan et al. |
| 2007/0081357 A1 | 4/2007 | Kim et al. |
| 2007/0241988 A1 | 10/2007 | Zerphy et al. |
| 2007/0253008 A1 | 11/2007 | Edge et al. |
| 2007/0263394 A1 | 11/2007 | Thielemans et al. |
| 2008/0046217 A1 | 2/2008 | Polonskiy et al. |
| 2008/0079816 A1 | 4/2008 | Yen et al. |
| 2008/0111773 A1 | 5/2008 | Tsuge |
| 2008/0165081 A1 | 7/2008 | Lawther et al. |
| 2008/0285981 A1 | 11/2008 | Diab et al. |
| 2009/0009103 A1 | 1/2009 | McKechnie et al. |
| 2009/0066631 A1 | 3/2009 | Lianza |
| 2009/0102957 A1 | 4/2009 | Phelan |
| 2009/0103200 A1 | 4/2009 | Feklistov et al. |
| 2009/0295706 A1 | 12/2009 | Feng |
| 2010/0001648 A1 | 1/2010 | De Clercq et al. |
| 2010/0103200 A1 | 4/2010 | Langendijk |
| 2010/0243025 A1 | 9/2010 | Bhatia et al. |
| 2010/0289783 A1 | 11/2010 | Leppla |
| 2010/0302284 A1 | 12/2010 | Karaki |
| 2010/0309218 A1 | 12/2010 | Suen et al. |
| 2011/0103013 A1 | 5/2011 | Furukawa |
| 2011/0121761 A1 | 5/2011 | Zhao |
| 2011/0176029 A1 | 7/2011 | Boydston et al. |
| 2012/0019633 A1 | 1/2012 | Holley |
| 2012/0033876 A1 | 2/2012 | Momeyer et al. |
| 2012/0062622 A1 | 3/2012 | Koyama et al. |
| 2012/0133837 A1 | 5/2012 | Furukawa |
| 2012/0287289 A1 | 11/2012 | Steinberg et al. |
| 2012/0307243 A1 | 12/2012 | Elliott |
| 2012/0313979 A1 | 12/2012 | Matsuura |
| 2013/0162696 A1 | 6/2013 | Matsumoto |
| 2013/0181884 A1 | 7/2013 | Perkins et al. |
| 2013/0226495 A1 | 8/2013 | Marcu et al. |
| 2013/0249377 A1 | 9/2013 | Hamer et al. |
| 2013/0272023 A1 | 10/2013 | Lai |
| 2014/0002718 A1 | 1/2014 | Spielberg |
| 2014/0009485 A1 | 1/2014 | Asanuma |
| 2014/0009505 A1 | 1/2014 | Moon et al. |
| 2014/0049571 A1 | 2/2014 | Erinjippurath et al. |
| 2014/0049983 A1 | 2/2014 | Nichol et al. |
| 2014/0125818 A1 | 5/2014 | Friend |
| 2015/0070402 A1 | 3/2015 | Shah et al. |
| 2015/0186097 A1 | 7/2015 | Hall |
| 2015/0229919 A1 | 8/2015 | Weber et al. |
| 2015/0339977 A1 | 11/2015 | Nathan et al. |
| 2015/0348479 A1 | 12/2015 | Kim et al. |
| 2015/0371405 A1 | 12/2015 | Zhao |
| 2016/0078802 A1 | 3/2016 | Liang et al. |
| 2016/0124091 A1 | 5/2016 | Kawahito et al. |
| 2016/0182790 A1 | 6/2016 | Horesh |
| 2016/0275835 A1 | 9/2016 | Yuan et al. |
| 2016/0335958 A1 | 11/2016 | Huang et al. |
| 2017/0032715 A1 | 2/2017 | Sutherland et al. |
| 2017/0032742 A1 | 2/2017 | Piper et al. |
| 2017/0061924 A1 | 3/2017 | Lee et al. |
| 2017/0069871 A1 | 3/2017 | Yim et al. |
| 2017/0171492 A1 | 6/2017 | Naito |
| 2017/0284630 A1 | 10/2017 | Sergenese et al. |
| 2017/0318178 A1 | 11/2017 | Debevec et al. |
| 2018/0018793 A1 | 1/2018 | Min et al. |
| 2018/0060014 A1 | 3/2018 | Son et al. |
| 2018/0090102 A1 | 3/2018 | Chappalli et al. |
| 2018/0091860 A1 | 3/2018 | Stokking et al. |
| 2018/0131160 A1 | 5/2018 | Zhang et al. |
| 2018/0235052 A1 | 8/2018 | Tada |
| 2018/0240409 A1 | 8/2018 | Li et al. |
| 2018/0342224 A1 | 11/2018 | Beon et al. |
| 2019/0064923 A1 | 2/2019 | Taniguchi |
| 2019/0080656 A1 | 3/2019 | Herranz et al. |
| 2019/0098293 A1 | 3/2019 | Lee et al. |
| 2019/0132560 A1 | 5/2019 | Grosse et al. |
| 2019/0172404 A1 | 6/2019 | Zhu |
| 2019/0209858 A1 | 7/2019 | Slaughter et al. |
| 2019/0212719 A1 | 7/2019 | Ono |
| 2019/0213951 A1 | 7/2019 | Li et al. |
| 2019/0244561 A1 | 8/2019 | Zong et al. |
| 2019/0295457 A1 | 9/2019 | Li et al. |
| 2019/0306477 A1 | 10/2019 | Nordback |
| 2019/0356940 A1 | 11/2019 | Mallett |
| 2019/0364309 A1 | 11/2019 | Von Braun et al. |
| 2019/0377535 A1 | 12/2019 | Rycyna et al. |
| 2020/0014904 A1 | 1/2020 | Wetzstein et al. |
| 2020/0027386 A1 | 1/2020 | Wang et al. |

(56) References Cited

U.S. PATENT DOCUMENTS

| | | |
|---|---|---|
| 2020/0037011 A1 | 1/2020 | Zong et al. |
| 2020/0043201 A1 | 2/2020 | Tanaka et al. |
| 2020/0098333 A1 | 3/2020 | Marcu |
| 2020/0126501 A1 | 4/2020 | Yamazaki et al. |
| 2020/0160791 A1 | 5/2020 | Chung |
| 2020/0225903 A1 | 7/2020 | Cohen |
| 2020/0280761 A1 | 9/2020 | Staples |
| 2020/0286424 A1 | 9/2020 | Thielemans et al. |
| 2020/0388210 A1 | 12/2020 | Thielemans et al. |
| 2020/0403117 A1 | 12/2020 | Fabien et al. |
| 2021/0005161 A1 | 1/2021 | Lee |
| 2021/0014385 A1 | 1/2021 | Boggavarapu et al. |
| 2021/0056937 A1 | 2/2021 | Sakai |
| 2021/0124174 A1 | 4/2021 | Tokunaga et al. |
| 2021/0125545 A1 | 4/2021 | Sohn et al. |
| 2021/0125570 A1 | 4/2021 | Kang et al. |
| 2021/0185778 A1 | 6/2021 | Otten |
| 2021/0201769 A1 | 7/2021 | Morris et al. |
| 2021/0217157 A1 | 7/2021 | Han et al. |
| 2021/0225267 A1 | 7/2021 | Thielemans et al. |
| 2021/0227270 A1 | 7/2021 | Braun |
| 2021/0266624 A1 | 8/2021 | Zong et al. |
| 2021/0295766 A1 | 9/2021 | Sugiyama et al. |
| 2021/0297717 A1 | 9/2021 | Braun |
| 2021/0306394 A1 | 9/2021 | Zong et al. |
| 2021/0321032 A1 | 10/2021 | Braun |
| 2021/0345058 A1 | 11/2021 | Itakura et al. |
| 2021/0366411 A1 | 11/2021 | Yang et al. |
| 2021/0383842 A1 | 12/2021 | Han et al. |
| 2021/0397398 A1 | 12/2021 | Han et al. |
| 2022/0014728 A1 | 1/2022 | Deighton |
| 2022/0020727 A1 | 1/2022 | Noh et al. |
| 2022/0059045 A1 | 2/2022 | Kobayashi et al. |
| 2022/0059607 A1* | 2/2022 | Murugan ............ H01L 33/54 |
| 2022/0060612 A1 | 2/2022 | Hochman et al. |
| 2022/0076615 A1 | 3/2022 | Ding et al. |
| 2022/0103738 A1 | 3/2022 | Deighton |
| 2022/0150456 A1 | 5/2022 | Steudel et al. |
| 2022/0191109 A1 | 6/2022 | Chen et al. |
| 2022/0246670 A1 | 8/2022 | Chen et al. |
| 2022/0254317 A1 | 8/2022 | Hochman et al. |
| 2022/0350562 A1 | 11/2022 | Wang et al. |
| 2022/0375387 A1 | 11/2022 | Deighton |
| 2022/0375403 A1 | 11/2022 | Cheng et al. |
| 2022/0413790 A1 | 12/2022 | Cai et al. |
| 2023/0013582 A1 | 1/2023 | Wang et al. |
| 2023/0154399 A1 | 5/2023 | Thielemans et al. |
| 2023/0162400 A1 | 5/2023 | Liu et al. |
| 2023/0162662 A1 | 5/2023 | Zhang et al. |
| 2023/0163142 A1* | 5/2023 | Lu ............. H01L 27/1248 257/91 |
| 2023/0186821 A1 | 6/2023 | Hashempour et al. |
| 2023/0209207 A1 | 6/2023 | Hochman et al. |
| 2023/0274693 A1 | 8/2023 | Thielemans et al. |
| 2023/0282153 A1 | 9/2023 | Thielemans et al. |
| 2023/0298503 A1 | 9/2023 | Zhang et al. |
| 2023/0326175 A1 | 10/2023 | Zhang et al. |
| 2024/0022686 A1 | 1/2024 | Thielemans et al. |
| 2024/0044465 A1 | 2/2024 | Thielemans et al. |

FOREIGN PATENT DOCUMENTS

| | | |
|---|---|---|
| BE | 1026226 A1 | 11/2019 |
| CN | 102290003 A | 12/2011 |
| CN | 206741357 U | 12/2017 |
| CN | 207352560 U | 5/2018 |
| CN | 110602875 A | 12/2019 |
| CN | 110617000 A | 12/2019 |
| DE | 102006054856 A1 | 1/2009 |
| EP | 1172783 A1 | 1/2002 |
| EP | 1780798 A1 | 5/2007 |
| EP | 2323072 A1 | 5/2011 |
| EP | 3099058 A1 | 11/2016 |
| EP | 3139422 A2 | 3/2017 |
| GB | 2469819 A | 11/2010 |
| JP | 2007062892 A | 3/2007 |
| JP | 2019214445 A | 12/2019 |
| KR | 20170065163 A | 6/2017 |
| TW | 200608327 A | 3/2006 |
| TW | 200608328 A | 3/2006 |
| WO | 2013186278 A1 | 12/2013 |
| WO | 2015114720 A1 | 8/2015 |
| WO | 2018164105 A1 | 9/2018 |
| WO | 2019215219 A1 | 11/2019 |
| WO | 2020253249 A1 | 12/2020 |
| WO | 2021009719 A1 | 1/2021 |
| WO | 2022013191 A1 | 1/2022 |
| WO | 2022064062 A1 | 3/2022 |
| WO | 2022087322 A1 | 4/2022 |

OTHER PUBLICATIONS

Burr, David, "Motion Perception: Human Psychophysics", Apr. 18, 2013, pp. 763-776, MIT Press.

Cast, Inc., "Understanding—and Reducing—Latency in Video Compression Systems", Oct. 25, 2013, 7 pages, retrieved from <https://web.archive.org/web/20131025202911/https://www.design-reuse.com/articles/33005/understanding-latency-in-video-compression-systems.html>.

Davis et al., "Humans perceive flicker artifacts at 500 Hz", Feb. 3, 2015, 4 pages, Nature, Scientific Reports.

Kang et al., "Nanoimprinted Semitransparent Metal Electrodes and Their Application in Organic Light-Emitting Diodes, " May 21, 2007, 6 pages, Advanced Materials.

Larson, Jennifer, "How Many Frames Per Second Can the Human Eye See?", Oct. 20, 2020, 12 pages, retrieved from <https://www.healthline.com/health/human-eye-fps>.

Lee et al., "Solution-Processed Metal Nanowire Mesh Transparent Electrodes", Jan. 12, 2008, pp. 689-692, Nano Letters, vol. 8, No. 2.

Mackin et al., "High Frame Rates and the Visibility of Motion Artifacts", Jun. 30, 2017, 19 pages, SMPTE Motion Imaging Journal, vol. 126, Issue 5.

Thielemans, Robbie, "Displays Applications of LEDs", Handbook of Visual Display Technology, May 21, 2011, 14 pages.

Thielemans, Robbie, "LED Display Applications and Design Considerations", Handbook of Visual Display Technology, May 21, 2011, 5 pages, retrieved from https://link.springer.com/referenceworkentry/10.1007/978-3-540-79567-4_76.

Tobii Connect, "The speed of human visual perception", Sep. 14, 2022, 1 page, retrieved from <https://connect.tobii.com/s/article/the-speed-of-human-perception?language=en_US>.

Wilson, Derek, "Exploring Input Lag Inside Out", Jul. 16, 2019, 2 pages, retrieved from <https://www.anandtech.com/show/2803>.

Zhang, Yin, "Performance Characteristics of Lithium Coin Cells for Use in Wireless Sensing Systems", Jun. 17, 2012, 143 pages, All Theses and Dissertations, Brigham Young University.

"The Ins and Outs of HDR—Gamma Curves", Jun. 8, 2020, 3 pages, retrieved from <https://www.eizoglobal.com/library/management/ins-and-outs-of-hdr/index2.html>.

Extended European Search Report from corresponding EP Application No. EP18198749.6, Nov. 12, 2018.

International Search Report and Written Opinion from PCT Application No. PCT/EP2019/061804, Jun. 13, 2019.

Applicant's Amendment/Remarks filed at the EPO on Feb. 20, 2020 for PCT/EP2019/061804.

Applicant's Amendment/Remarks filed at the EPO on May 26, 2020 for PCT/EP2019/061804.

International Preliminary Report on Patentability from PCT/EP2019/061804, Jul. 10, 2020.

Belgian Search Report from BE Application No. 201905196, Aug. 13, 2019.

Search Report for BE 2019/05759 mailed Jan. 23, 2020, 18 pages.

Belgian Search Report for Belgian Patent Application No. BE2019/5970, Jul. 24, 2020.

(56) References Cited

OTHER PUBLICATIONS

Response to Belgian Search Report for Belgian Patent Application No. BE2019/5970, filed by Applicant at the Belgian Patent Office on Nov. 24, 2020.
Belgian Search Report from corresponding Belgian Application No. BE 202205007, Jun. 7, 2022.
Extended European Search Report from corresponding EP Application No. 22185014.2, Dec. 8, 2022.
Office Action from European Application No. 19722133.6, Jan. 19, 2023.
Extended European Search Report from Corresponding European Patent Application No. EP23218336.8, Apr. 10, 2024.
Belgian Search Report from Belgian Patent Application No. BE202305595, Nov. 21, 2023.
Response to Belgian Search Report from Belgian Patent Application No. BE2023/5595, filed Mar. 21, 2024.
Extended European Search Report from European Patent Application No. EP23185674.1, Nov. 16, 2023.
Partial European Search Report from European Patent Application No. EP23198096, Nov. 29, 2023.
Extended European Search Report from European Patent Application No. EP23198096.2, Apr. 9, 2024.
Extended European Search Report from European Patent Application No. EP23190432.7, Feb. 12, 2024.
Extended European Search Report from European Patent Application No. EP23160521, Jul. 6, 2023.
Response to Extended European Search Report from European Patent Application No. EP23160521, dated Jan. 29, 2024.
Extended European Search Report from European Patent Application No. EP23218322.8, Mar. 27, 2024.
Extended European Search Report from European Patent Application No. EP23218336.8, Apr. 10, 2024.
Partial European Search Report from European Patent Application No. EP23218348.3, Apr. 30, 2024.
Extended European Search Report from European Patent Application No. EP23218353.3, Mar. 26, 2024.
Extended European Search Report from European Patent Application No. EP23218356.6, Apr. 5, 2024.
Extended European Search Report from European Patent Application No. EP23218377.2, Apr. 24, 2024.
Wikipedia, "MAC Address", 10 pages, retrieved from <https://en.wikipedia.org/wiki/MAC_address>, retrieved May 30, 2023.

* cited by examiner

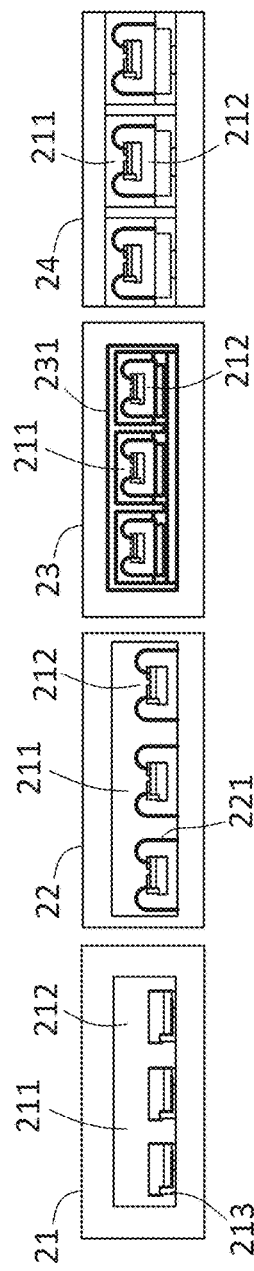
Figure 2(a)
| | MiniLED / MicroLED | COB | GOB | SMD |
|---|---|---|---|---|
| Chip size | 100 – 200μm | 100 – 200μm | > 200μm | > 200μm |
| Possible Pitch | 0.5mm – 1.25mm | 0.7mm – 2mm | 0.9mm or more | 0.9mm or more |
| Ruggedness | High | Medium | High | Low for high-res |
| Heat Dissipation | High | Medium | Low | Low |
| Repair | Possible | Difficult | Difficult | Easy |
Figure 2(b)
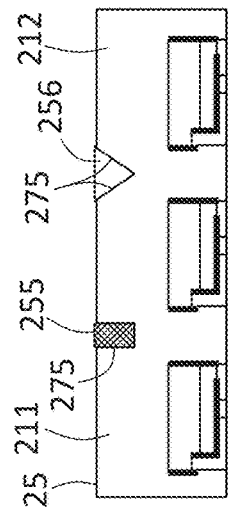
Figure 2(e)
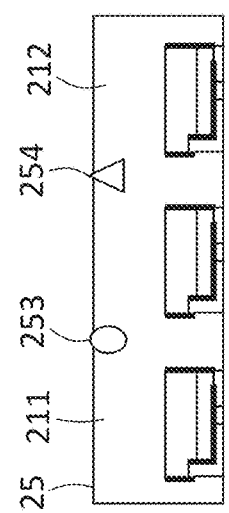
Figure 2(d)
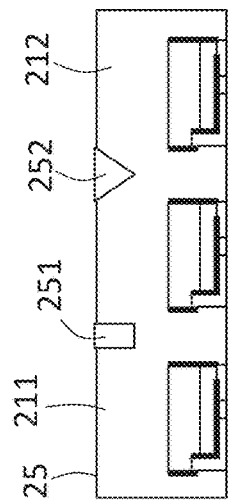
Figure 2(c)

LED RGB examples

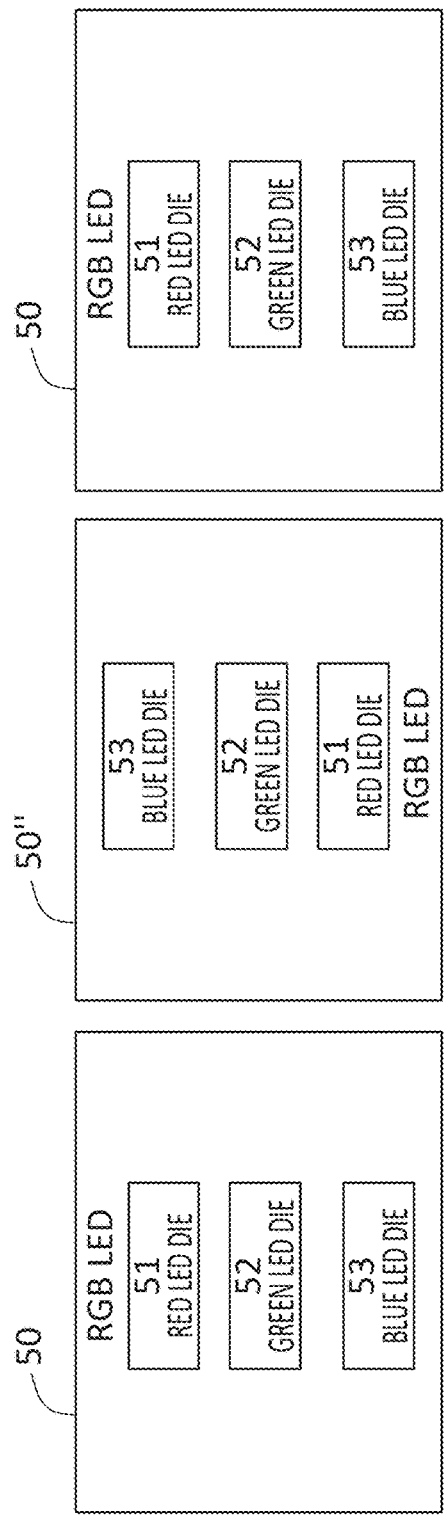
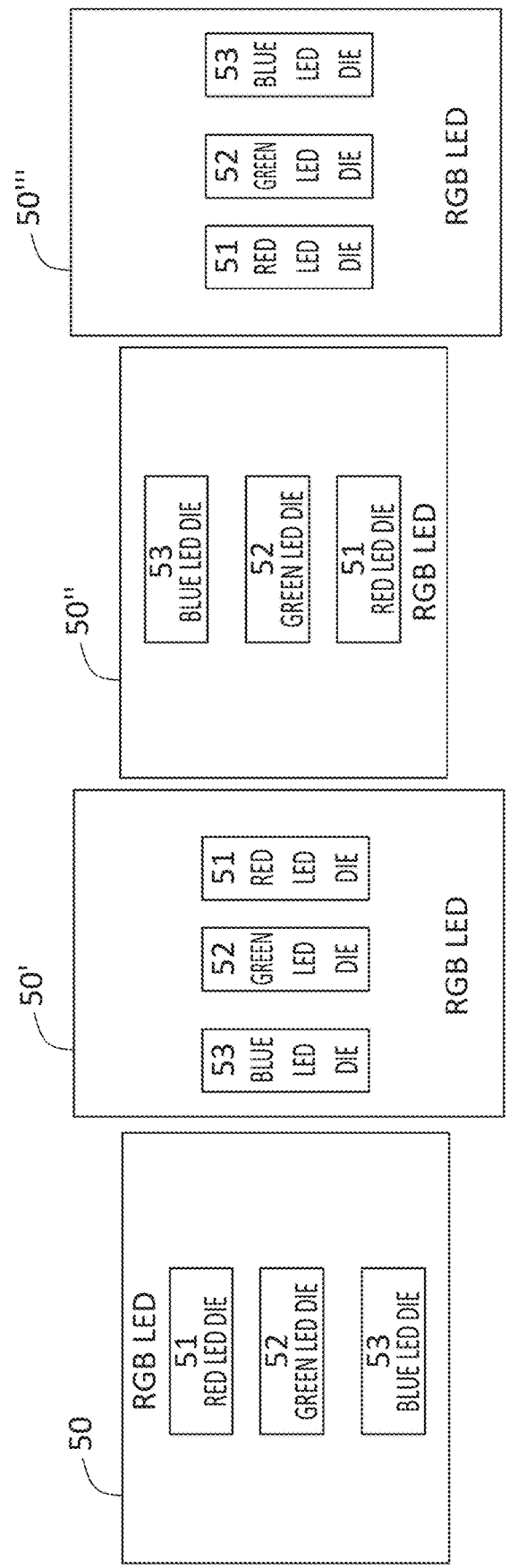
Figure 5(a)
Figure 5(b)

Multiplexing arrangement – common anode

Multiplexing arrangement – common anode

CONFIGURATIONS, METHODS, AND DEVICES FOR IMPROVED VISUAL PERFORMANCE OF A LIGHT-EMITTING ELEMENT DISPLAY AND/OR A CAMERA RECORDING AN IMAGE FROM THE DISPLAY

CROSS-REFERENCE TO RELATED APPLICATIONS

This application is a continuation of U.S. Non-provisional application Ser. No. 18/216,459 with the same title, filed Jun. 29, 2023, which claims the benefit of and priority to U.S. Provisional Patent Application Ser. No. 63/433,646 filed on Dec. 19, 2022 and entitled "Modular Display with Integrated on Camera Feature Sets," both of which are expressly incorporated herein by reference.

TECHNICAL FIELD

This disclosure relates to a light source display, comprising a plurality of light-emitting elements (LEEs) such as, for example, light-emitting diodes (LEDs). The LEEs, or in a particular example, LEDs are typically arranged on a horizontal and vertical grid resulting in an array or a matrix of LEDs forming a LED board. Moreover, the disclosure relates to displays comprising molding in between and on top of the LEEs, for example, LEDs, and in particular in manipulating this molding for improving the visual performance and/or acoustic behavior of the displays. The disclosure also relates to LEE displays, for example, LED displays of which the LEDs each comprise a plurality of LED dies (each having a die size and a die color) being stacked on top of each other, and in particular in enhancing the light output of such LED displays. The disclosure further relates to a display with a drive circuit configuration comprising at least two drive circuits, wherein at least one of the LEEs, for example, LEDs driven by a first driver of a first drive circuit is residing physically with a second drive circuit. Herewith, improved visual performance of the display can be achieved, as well as improved interplay of the display with a camera recording an image from the display, or else the display can be enhanced for 3D application. Finally, the disclosure relates to a system for driving LEEs or pixels of a display, comprising an input protocol for receiving input and a pulse-width modulation (PWM) generating module for transferring the input into signals to be delivered to pixel drivers, therewith defining and controlling the LEEs or pixels in the output to be emitted by them. In particular, the system comprises a module for improved interplay of the display with a camera recording an image from the display.

BACKGROUND

Light source displays exist having a plurality of light-emitting elements (LEEs) such as, for instance, light-emitting diodes (LEDs), being arranged in an array or matrix format. Traditional (RGB) LED packages can be provided either as a standalone or as a plurality integrated in a LED display, tile or module. Different types of LED board technologies can be represented, and may have molding on top and in between the LEDs. Such molding (epoxy or any other non-electrically conductive fill material) is usually made black and/or special coatings can be applied with anti-reflection, which may be a complex or cumbersome operation, being rather expensive, and/or else may be easily subject to wear. Especially today, further concern with this method is raised as not being climate-friendly. The inventors of the present disclosure have identified a need for an improved and sustainable way for absorbing and/or not reflecting waves from the light source display.

Currently, LEE displays, such as, for example, LED displays, are yet offered of which the LEDs comprise a plurality of LED dies being stacked on top of each other. Such configuration of stacked LED dies can improve the display resolution but also viewing angle issues. However, as such, stacked LED dies will not lead to increased performance in terms of light output. The inventors of the present disclosure have found an acute for an enhancement, in addition to improved display resolution.

Existing light source display having an array or matrix of LEEs, such as LEDs, each having an anode and a cathode, may further comprise an electronical interface, and electronics to light up the LEDs, being controlled by signals via the electronical interface. The electronical interface may be defined for an LEE display, for example, in the case of an LED display, by a LED drive circuit having electrical connections defined by rows and columns that electrically connect to the LEDs in the LED matrix. Present displays have a classical and straightforward layout for their drive circuit configuration, resulting in standard performance. Mainly because of practically reasons, it is uncommon to deviate therefore and consider different versions or even exotic layouts.

SUMMARY OF THE INVENTION

In general, an object of this disclosure is to improve visual performance of a display and/or a camera recording an image from the display. An object of this disclosure is also to improve visual and/or acoustic performance in a studio environment wherein both a display (or a plurality thereof) and a camera (or a plurality thereof) recording an image from the display (or the plurality thereof) are present.

In a first aspect of the invention, a display is provided comprising a plurality of light-emitting elements (LEEs) each of the plurality of LEEs having a first side or first connection point, and a second side or second connection point. Each of the plurality of LEEs may have the first connection point at the first side of the LEE, and the second connection point at the second side of the LEE. The LEEs can be light-emitting diodes (LEDs), although not limited thereto, and hence other light-emitting elements are not excluded. This first and second side or connection point can be anode and cathode side respectively, or vice versa. The LEEs can be connected at their first (or anode) side or first connection point to first lines and at their second (or cathode) side or second connection point to second lines. Hence, first and second lines can be anode and cathode lines respectively, or vice versa. The display further comprises at least two drive circuits, each of the drive circuits having electrical connections defined by rows and columns that electrically connect to the LEEs, wherein each of the drive circuits being configured as a drive device. The plurality of LEEs can be arranged in a matrix such that the LEEs are intermittently (or in between each other) equally spaced in the at least two drive circuits. According to an embodiment, the LEEs are arranged in a common anode configuration, wherein each of the drive circuits are configured as a common anode drive device. The first lines are then cathode lines connected to cathode side of each of the LEEs, whereas the second lines are anode lines connected to anode side of each of the LEEs. Alternatively, according to an embodiment, the LEEs are arranged in a common cathode configuration, having each of the drive circuits being configured as a common cathode drive device, wherein first lines are anode lines connected to anode side of each of the LEEs and second lines are cathode lines connected to cathode side of each of the LEEs.

Further, according to first aspect of the invention, each of the first lines is arranged to be connected to a current source, while each of the second lines is arranged to be connected to a power supply. Possibly, the power supply is a positive power supply, wherein each of the second lines is arranged to be connected to the positive power supply. Each of the power supplies drives one of the rows of one of the corresponding drive circuits and each of the current sources drives one of the columns of one of the corresponding drive circuits. Per each of the respective drive circuits, the current sources together are (defined as) a constant current driver. The at least two drive circuits comprise a first drive circuit having a first constant current driver, and a second drive circuit having a second constant current driver, wherein at least one of the plurality of LEEs driven by the first constant current driver of the first drive circuit is residing physically within the second drive circuit, or vice versa, at least one of the plurality of LEEs driven by the second constant current driver of the second drive circuit is residing physically within the first drive circuit.

According to an embodiment, a respective first switch is provided to arrange each of the first lines to be connected to the current source, and a respective second switch is provided to arrange each of the second lines to be connected to the power supply. According to further embodiment, for example in a common anode configuration, the respective first switch is provided to arrange connection of/with cathode lines, whereas the second respective switch is provided to arrange connection of/with anode lines.

The display may further comprise logic to generate separate data and separate logic received by the constant current drivers to drive the drive circuits, in particular the column lines thereof. According to an embodiment, the at least two drive circuits are each driven by corresponding constant current drivers receiving separate data, and are part of a 3D display application, wherein the first drive circuit is configured to (while being intended for) generating light output meant for a left eye, whereas the second drive circuit is configured to (while being intended for) generating light output meant for a right eye. The display may be provided with polarizers that can be put in front of the LEEs, herewith defining the LEEs light output for the left eye and the right eye, for a passive 3D display application. Alternatively, for such 3D application, the display may be provided with a lenticular lens or lenticular lens array to be provided or incorporated in front of LEEs. The display may further comprise multiple blocks of LEEs with corresponding drive circuits and corresponding lenticular lenses or lenticular lens arrays, wherein each of the multiple blocks of LEEs is defined with a different point of view.

The display may further comprise improved interplay of the display with a camera recording an image that is displayed by the display, based on a light source input signal received by the display, receiving one or more values representing a programmable off-set relative to the operation of the camera having a shutter and corresponding shutter time, and characterized by applying the light source input signal to the display, based on the one or more programmable off-set values. According to an embodiment, the programmable off-set being selected to improve the interplay of the display with the camera, in particular to reduce banding effects on the camera.

The display may further comprise one or more pulse-width modulation (PWM) drivers connected to the LEEs for controlling the power applied thereto, wherein pulse-width modulation (PWM) is generated at least two times during a programmable period, herewith increasing and/or improving the bit depth of the display.

According to an embodiment, the display is capable of receiving one or more video streams, e.g., one for each drive circuit. As part of the video processing, active receiver cards, for example, as described in U.S. patent application Ser. No. 18/322,279, filed at the USPTO on May 23, 2023 by the same Applicant and inventors, which is incorporated herein by reference, can receive one or more video streams. By means of example, according to a particular embodiment, the display is configured to (and thus capable of) receiving at least two different video streams, one for each drive circuit, e.g. a first video stream for the first drive circuit and a second video stream for the second drive circuit, because the active receiver cards can receive at least two different video streams.

According to an embodiment, the display is provided with calibration processes or techniques. Calibration over time can be provided, performed by a processing system of the display (being configured thereto), wherein the display is part of a studio environment comprising one or more cameras recording an image that is displayed by the display, the one or more cameras comprising each a shutter having a shutter opening time. Also, calibration can be provided in relation to color points for a viewing angle of one or more cameras, performed by a processing system of the display (being configured thereto), wherein the display is part of a studio environment comprising the one or more cameras recording an image that is displayed by the display, the calibration being dependent on the viewing angle of the one or more cameras.

Along with the display in accordance with the first aspect of the invention, a method is provided of displaying an image, the method comprising: providing the display, providing the current source, and providing the power supply.

Further, along with the display in accordance with the first aspect of the invention, a method is provided of producing a display, the method comprising: (i) forming a plurality of light-emitting elements (LEEs), each of the plurality of LEEs having a first connection point and a second connection point, each of the plurality of LEEs being connected at their first connection point to first lines and at their second connection point to second lines; (ii) providing at least two drive circuits, each of the drive circuits having electrical connections defined by rows and columns that electrically connect to the LEEs, each of the drive circuits being configured as a drive device, wherein each of said first lines is arranged to be connected to a current source, wherein each of said second lines is arranged to be connected to a power supply, wherein each of said power supply drives one of the rows of the corresponding drive circuits, wherein each said current source drives one of the columns of the corresponding drive circuits, and wherein per each of the respective drive circuits said current sources together are a constant current driver; (iii) providing the at least two drive circuits to comprise a first drive circuit having a first constant current driver, and a second drive circuit having a second constant current driver; and (iv) arranging at least one of the plurality of LEEs driven by the first constant current driver of the first drive circuit to reside physically within the second drive circuit, or else, arranging at least one of the plurality of LEEs driven by the second constant current driver of the second drive circuit to reside physically within the first drive circuit.

According to an aspect of the invention, a display is provided comprising a plurality of light-emitting elements (LEEs) arranged in an array, comprising a first set of LEEs configured to be driven by a first drive circuit, and a second set of LEEs configured to be driven by a second drive circuit, wherein the first set of LEEs and the second set of LEEs are multiplexed in the array such that at least a first LEE of the first set of LEEs is arranged physically at least partly or wholly between a first LEE of the second set of LEEs and a second LEE of the second set of LEEs In a further aspect of the invention, a display is provided comprising a plurality of light-emitting elements (LEEs), an electronical interface defined by a LEE drive circuit having electrical connections that electrically connect to the LEEs, and electronics to light up the LEEs, and being controlled by signals via the electronical interface, wherein the display further comprises molding in between and on top of the LEEs, and wherein the molding comprises notches in areas where none of the LEEs are present. The notches may result from removal of parts of the molding, defined as intermittent parts in areas where none of the LEEs are present.

The intermittent parts can be randomly chosen. The plurality of LEEs can be arranged in an array, and the pattern of the array can be rectangular. The intermittent parts removed may have regular or irregular shape, moreover, they may have a rectangular, triangular, circular or random cross section. The display may further comprise a non-volatile memory. The LEEs can be light-emitting diodes (LEDs), and hence the display may be a LED display.

In a further aspect of the invention, methods for use and manufacturing of a display in accordance with second aspect are also provided. Moreover, methods are provided for enhancing the acoustic and/or visual performance, for example in a studio environment comprising at least one display in accordance with second aspect and at least one camera for at least in part recording what is displayed on the at least one display.

According to an aspect of the invention, a light-emitting diode (LED) display is provided comprising a plurality of LEDs, an electronical interface defined by a LED drive circuit having electrical connections that electrically connect to the LEDs, and electronics to light up the LEDs, and being controlled by signals via the electronical interface, wherein each of the LEDs comprises a plurality of LED dies, wherein the LED dies for each LED are configured in that they are stacked on top of each other. The LEDs may comprise at least three color LED dies (although less or more are not excluded), and they may be stacked according to a preferred order. Each of the LED dies can be defined by a die size and a die color. The die size of one or more of the LED dies may be optimized in efficiency towards a predetermined color temperature. According to an embodiment, a lenticular lens array is applied in front of the LEDs of the LED display.

In a further aspect of the invention, a method is also provided for manufacturing of such display with stacked LED dies. In addition, a method is provided for increasing the light output of such LED display with stacked LED dies.

According to an aspect of the invention, a system is provided for a light-emitting display, in particular for driving light-emitting elements or pixels thereof, comprising an input protocol for receiving input and a PWM generating module for transferring the input into signals to be delivered to pixel drivers, herewith defining and controlling the light-emitting elements or pixels in the output to be emitted by them, characterized in that the system comprises a module for improved interplay of the display with a camera recording an image that is displayed by the display, based on a light source input signal received by the display, receiving one or more values representing a programmable off-set relative to the operation of the camera having a shutter and corresponding shutter time, and characterized by applying the light source input signal to the display, based on the one or more programmable off-set values. The programmable off-set may be selected to improve the interplay of the display with the camera, in particular to reduce banding effects on the camera, wherein a logic for start and stop PWM generation is included. The system may further comprise a module for performing calibration and herewith determining calibration matrices to be used in defining the output to be emitted by the light-emitting elements or pixels. The system may further comprise memory to store the start and stop logic.

BRIEF DESCRIPTION OF THE DRAWINGS

FIG. 2(a) illustrates different types of LED board technologies.

FIG. 2(b) illustrates specifications for these different types of LED board technologies.

FIGS. 2(c), 2(d), and 2(e) illustrate embodiments of an LED board technology comprising notches in areas where none of the LEDs are present, in accordance with an embodiment.

FIGS. 5(a) and 5(b) show examples of related LED configurations, wherein RGB LEDs are rotated intermittent in FIG. 5(a) for 180° clockwise, and in FIG. 5(b) for 90° clockwise.

FIG. 10(b) shows a physical layout of the LED display having such schematical multiplexing arrangement.

FIG. 12(b) shows an embodiment of a physical layout of the LED display having such schematical multiplexing arrangement, in accordance with the invention.

FIG. 13 corresponds operationally to the embodiment of FIGS. 10(a) and 10(b), being a simplified version thereof.

FIG. 14 corresponds operationally to FIG. 11, being a simplified version thereof.

FIG. 15 corresponds operationally to the embodiment of FIGS. 12(a) and 12(b), being a simplified version thereof.

DETAILED DESCRIPTION

Figure 1:
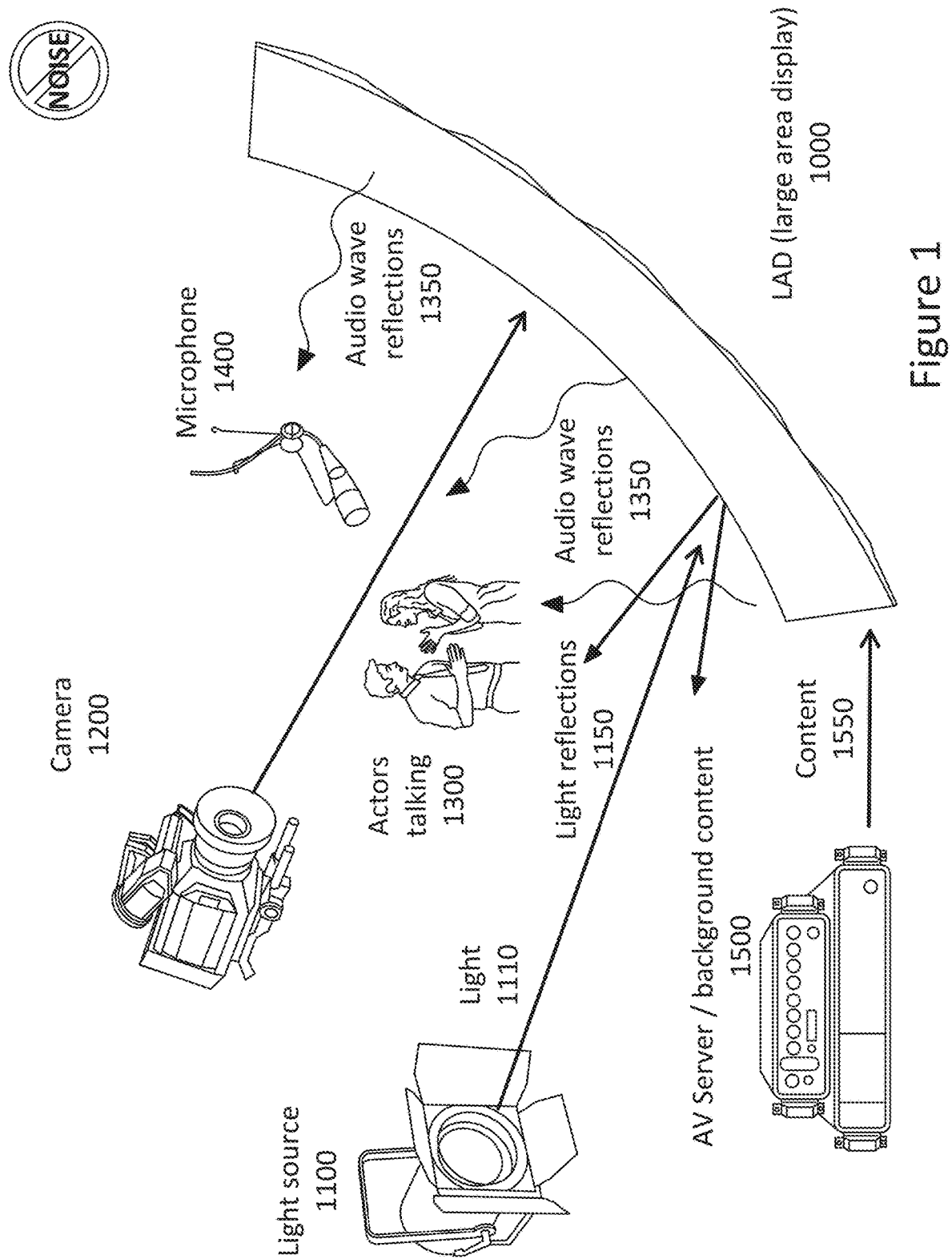
FIG. 1 shows a studio setting according to related art, wherein a camera is surveying actors talking and a display wall, being provided with acoustic absorbing and/or diffusing material, or having an open structure, is suppressing or reducing noise, in that audio wave reflections from the surface of the display wall are suppressed or reduced.

This patent application builds further on the same Applicant's earlier filed U.S. patent application Ser. No. 16/895,872, filed at the USPTO on Jun. 8, 2020 (which is referred to herein as the "Studio display" application), the contents of which are incorporated herein by reference, and U.S. patent application Ser. No. 17/865,096 (which is referred to herein as the "Studio2" application), filed at the USPTO on Jul. 14, 2022, which claims the benefit of priority to U.S. Provisional Patent Application 63/221,822, which was filed at the USPTO on Jul. 14, 2021, the contents of each of which are incorporated herein by reference. But the present disclosure further focuses on the system and integration of the 'on camera feature sets'. Focus is made on a display system, modular in this case, as this is most complex to handle (as compared to non-modular). With modular display system is meant here that just one display can be considered, or a plurality of displays can be combined to appear together as one (large) screen or unity. Hence, the display system can be as small or as big as wanted, or as the particular application of the display system requires. Nevertheless, it can also be done on non-modular displays, for example, one single display to be used as such (e.g. standalone), not in combination with other displays. An object of this disclosure is to derive a method, implementation and chipset for on camera use of the display system (for instance in a studio environment) related to:

Stacked LED dies and/or 3D configuration of a display with lenticular lenses or lenticular lens array;

The reduction of on camera color Moiré effect (to protect stacked LED dies such that real-time color correction is less of an issue and might become negligible) known as artificial color banding that can appear with repetitive patterns of high spatial frequencies; and The reduction of on camera banding effects for PWM driven devices and its chipset (for e.g. stretch applications, applications related to PWM LED drivers).

In the following description, the "Studio display" and "Studio2" patent applications (U.S. patent application Ser. No. 16/895,872 and U.S. patent application Ser. No. 17/865,096, respectively) will be particularly referred to, and specific aspects and/or features thereof, whenever relevant for explaining the concepts of the present disclosure. Both the "Studio display" and "Studio2" patent applications are from the same Applicant are in general relevant background wherein problems related to banding effects, Moiré effect, color shift and acoustic properties are yet introduced. Whenever appropriate, reference is also made to U.S. patent application Ser. No. 16/813,113, filed by the same Applicant at the USPTO on Mar. 9, 2020, and which granted as U.S. Pat. No. 11,610,543 (which is referred to herein as the "Stretch display" patent application), regarding a real-time deformable and transparent display, the contents of which are incorporated herein by reference.

Display with Acoustic and/or Light Trap

A first problem now discussed is related to reflective light and acoustic performance. In FIG. 1, an example is shown of a large area display (LAD) 1000 in an environment with a studio light source 1100 together with a camera 1200, microphone 1400 herewith illustrating audio wave reflections 1350 and light reflections 1150. Moreover, FIG. 1 shows a schematic representation of a studio setting, wherein a camera 1200 is surveying actors talking 1300 and a display wall having the large area display 1000 of which the noise is suppressed or reduced by means of, for example, fan regulation or light output adaptation, as yet described in the "Studio display" patent application (U.S. patent application Ser. No. 16/895,872). Large area display 1000 receives content 1550 from av server 1500. The wall surface of the display wall facing the studio environment and/or the actors, can also reflect sound or audio waves. Particularly when the display wall having the large area display 1000 is curved (as depicted here), the effect of reflection on e.g. the actors will be even stronger. Acoustic reflections 1350 can be very annoying. As a solution, the display wall can be provided with acoustic absorbing and/or diffusing material (e.g. as a surface layer or in between the LEDs), or the display wall may have an open structure, such that audio wave reflections from the surface of the display wall are suppressed or reduced.

While referring to FIG. 2, high-resolution LEE displays, for example, (LED) displays often use micro-LEDs or chip-on-board (COB) LEDs wherein multiple LEDs are bonded to a circuit board without the LEDs being separate individual packages. Contrary to that, in FIG. 3, related RGB LED packages are illustrated, either standalone in FIGS. 3(a) and (b), or as a plurality thereof integrated in a LED tile or display in FIG. 3(c). In FIGS. 2(a) and (b) different types of LED board technologies are shown, i.e. MiniLED/MicroLED 21, COB 22, glue-on-board (GOB) 23, and surface-mounted device (SMD) 24. As indicated, such LED board technologies 21, 22, 23, 24 have molding 211 on top and in between the LEDs 212. Such molding (epoxy or any other non-electrically conductive fill material) is usually made black and special coatings are sometimes applied with anti-reflection. In the MiniLED/MicroLED 21 representation of FIG. 2(a), eutectic bonding 213 by means of a special solder technique is also indicated. In the COB 22 image of FIG. 2(a) bonding wires 221 are shown. In the GOB 23 of FIG. 2(a) the glue (or epoxy) in between and/or around the LEDs is clearly depicted. The table of FIG. 2(b) lists specs for each of the LED board technologies, that are herewith compared amongst each other. In accordance with an aspect of the invention, as shown in FIGS. 2(c) and 2(d), a LED module 25 is provided containing molding 211 in between and on top of the LEDs (as standardly in mini-LED/micro-LED and COB boards), wherein intermittent parts of the molding 211 are removed, meaning (multiple small or tiny) parts of the molding 211 in (multiple) areas where none of the LEDs 212 nor electronics or any other component, such as e.g. bonding wires 221, in between are present. Literally, the word 'intermittent' refers to places or locations (of the molding) in between the LEDs, hence where the LEDs are not present. The intermittent parts can be randomly chosen, for example, in shape and/or in location, as long they are not too large and/or not too close to the LEDs (and hence not interfering therewith). As shown in FIGS. 2(c) and 2(d), as a result of removing such intermittent parts, gaps or notches 251, 252 and 253, 254 are formed in the molding 211. Hence, the molding 211 comprises gaps or notches 251, 252, 253, 254 in areas where none of the LEDs are present. In other words, the gaps or notches are characterized by removal of parts of the molding, defined as intermittent parts in areas where none of the LEDs are present. According to an embodiment, the shape of the intermittent parts of the molding 211 being removed can be—although not being limited thereto—rod-like, spherical, or random, they can have either rectangular (see notch 251), stepped, triangular (see notches 252 or 254), circular, rounded, or curved (see notch 253) or random cross section, and in general they can be regular or irregular in shape. The notches are for example created by carving or etching techniques, i.e. molding material being carved out or etched away in the molding where no LEDs are lying underneath. A LED display or tile may comprise of multiple LED modules 21, 22, 23, 24 as for example illustrated in FIG. 2, in particular as shown in FIG. 2(c) in relation to an embodiment discussed herewith. A LED module comprises multiple LEDs arranged on a horizontal and/or vertical grid. Whereas usually, the multiple LED modules are also arranged (within the LED display or tile) on a horizontal and/or vertical grid, the encompassing LED display or tile can be interpreted as comprising multiple LEDs arranged on a horizontal and vertical grid. According to an embodiment, the pattern of the horizontal and vertical grid is rectangular. Hence, an array or matrix of LEDs is formed and determines the architecture of the LED module, and the LED display or tile. Each LED has an anode and a cathode (not shown here). In general, a LED display comprises an electronical interface, and electronics to light up the individual LEDs, and is controlled by signals on the electronical interface. The electronical interface can be defined by a LED drive circuit having electrical connections, defined by rows and columns that electrically connect to the LEDs in the LED array or matrix. Further, the LED display may comprise a non-volatile memory (possibly omitted).

Current aspect of the invention, being characterized by removal of material, i.e. intermittent parts of the molding, for example, in the form of notches in LED modules and/or LED display has the potential effect of:

acting as a light trap, meaning that the (perceived) contrast of the display is increasing because less light gets reflected to the viewer, and acting as an acoustic trap, capturing the acoustic waves by the shape of the notches, hence making the reflection of the sound much more diffused.

In a further embodiment, as shown in FIG. 2(e), all or part of the notches, for example, notch 255 may be filled with, partially or fully, with an absorbing material 275. Absorbing material may be a light absorbing material or a sound absorbing material, or both a light and sound absorbing material. As a sound absorbing material, the material 275 may be wholly of a single material or may be composed of a layers or a laminate material. Material 275 may be a porous or open cell material. Absorbing material 275, as a light absorbing material, may be absorbent in all or part of the infrared, visible, and/or ultraviolet light ranges. As a light absorbing material, material may be composed of black paint, ink, carbon nanotubes, or light-capturing devices. In an embodiment, one or more faces or sidewalls of a notch 256 may be provided with an absorbing material 275. The absorbing material may be an additional or different material from the molding material 211, or in an embodiment, the absorbing material 275 is formed from the same material as the molding material 211 but with a surface treatment that provides a surface structure from material 211 that provides light absorbing or diffusing, such as a matter surface.

According to another embodiment, an absorbing material is provided on a surface of the molding material without the presence of a notch.

According to an embodiment, at least 10% of the (surface) molding area comprises notches e.g. in the form of dots or scratches or a random dot and/or scratch pattern, wherein the notches having any particular size and occurring in any particular amount. Preferably 1% to 30% of the (surface) molding area comprises notches, more preferably 5% to 25% of the (surface) molding area comprises notches, even more preferably 5% to 20% of the (surface) molding area comprises notches, even more preferably 5% to 15% of the (surface) molding area comprises notches. By means of example, lots of little dots, matting, or scratches can be provided, or else only one microcavity or few much larger scratches can be provided in the molding area. According to an embodiment, the surface of the molding where notches are provided, is at least 10% of the molding area, preferably 5% to 15% of the molding area, possibly where LEDs are not present, but not necessarily and thus not limited thereto.

Stacked Pixels to Reduce Viewing Angle Difference

A second problem now discussed is related to viewing angle difference. Herewith is again referred to FIG. 1, depicting a typical setup wherein a camera, whether moving or not, is looking at the screen. In relation to moving, it is noted that in the metadata of a video processing system for a studio LED screen, for example (x, y, z) coordinates of a camera moving arbitrary in front of the studio screen and/or of a user can be embedded (into the processing system) to be sent to the LED tiles, as, e.g., discussed into detail in U.S. patent application Ser. No. 18/322,279, filed at the USPTO on May 23, 2023 by the same Applicant and inventors, which is incorporated herein by reference.

Figure 3B:
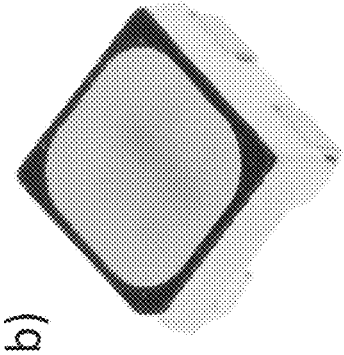
FIGS. 3(a), 3(b), and 3(c) show examples of related RGB LED packages, in FIGS. 3(a) and 3(b) standalone, and in FIG. 3(c) as a plurality integrated in a LED tile or module.
Figure 3A:
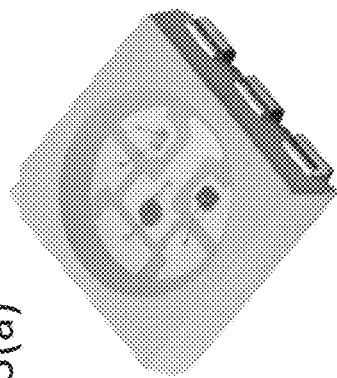
Figure 3C:
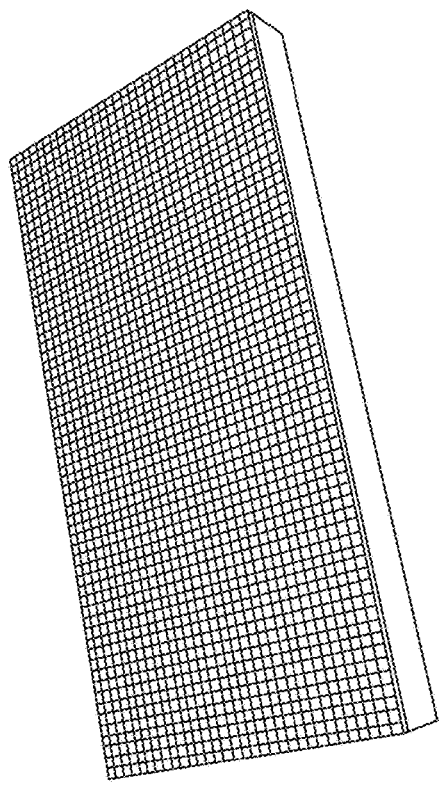
Figure 4:
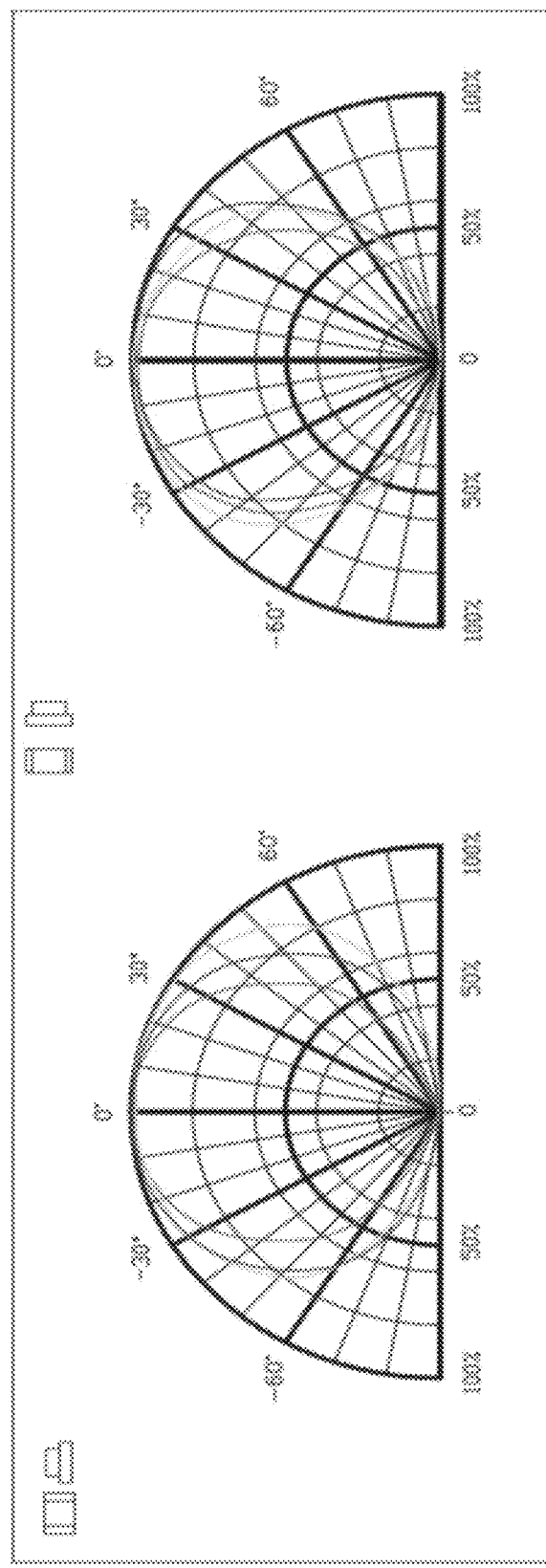
FIG. 4 illustrates a viewing angle graph of an exemplary LED.

Regarding viewing angle problems in related LEDs, and real-time viewing angle calibration, Applicant's earlier "Stretch display" patent application (U.S. patent application Ser. No. 16/813,113, now U.S. Pat. No. 11,610,543) is referenced. In FIG. 3 of the present application, examples of SMD RGB LEDs are illustrated, either standalone in FIGS. 3(a) and (b), or as a plurality thereof integrated in a LED tile or display in FIG. 3(c). An example of measurement of RGB colors for the kind of LEDs as depicted in FIG. 3, typically depending on viewing angle, is given in FIG. 4. In the LED viewing angle graph of FIG. 4, it can be seen that under an angle, the brightness of the individual colors is different. This fact becomes even more important in case of a display or screen continuously moving position. By moving position, an observer watching the display will also perceive different brightness for the individual pixels. When there are multiple primaries shown, this in fact means that the color points are not accurate anymore.

A solution on how to real-time correct viewing angle differences, has already been proposed in previous applications from the same Applicant, as e.g. in the "Stretch display" (U.S. patent application Ser. No. 16/813,113, now U.S. Pat. No. 11,610,543), which is incorporated herein by reference. In addition to concepts of the "Stretch display" application, now, according to an aspect of the present application, focus is made on reducing viewing angle effects in a different way, in particular by means of different LED configurations. Related LED configurations are shown in FIGS. 5(a) and (b), wherein related RGB LEDs are rotated intermittently, here by means of for example either 180° (clockwise) for adjacent or neighboring LEDs in FIG. 5(a), or 90° (clockwise) for adjacent or neighboring LEDs in FIG. 5(b). In FIG. 5(a) a first RGB LED 50 is shown having on top a red LED die 51, adjacent there below a green LED die 52 and next under a blue LED 53. Next to this first RGB LED 50, a second RGB LED 50" is shown being the equivalent of RGB LED 50 but rotated for 180° (clockwise), and hence now having blue LED die 53 on top, there below green LED die 52, and as lowest red LED die 51. A third RGB LED 50 is depicted next to the second one, being 180° rotated as compared to RGB LED 50", or else 360° or 0° rotated as compared to the first RGB LED 50. In FIG. 5(b) a similar methodology is applied, although now rotating each RGB LED for 90° (clockwise) compared to previous one. The second RGB LED 50' is rotated for 90° as compared to the first RGB LED 50, whereas the third RGB LED 50" is rotated for 90° as compared to the second RGB LED 50', or else 180° as compared to the first RGB LED 50. The fourth RGB LED 50''' is rotated for 90° as compared to the third RGB LED 50", or else 180° as compared to the second RGB LED 50', or else 270° as compared to the first RGB LED 50. This intermittent rotating of LEDs might be a solution, but it causes an unpleasant checkered board effect on related screens when looked thereat with a camera and/or the human eye. Moreover, there are still viewing angle differences, although they are now inter-LED and not globally (over all LEDs together) anymore.

Figure 6:
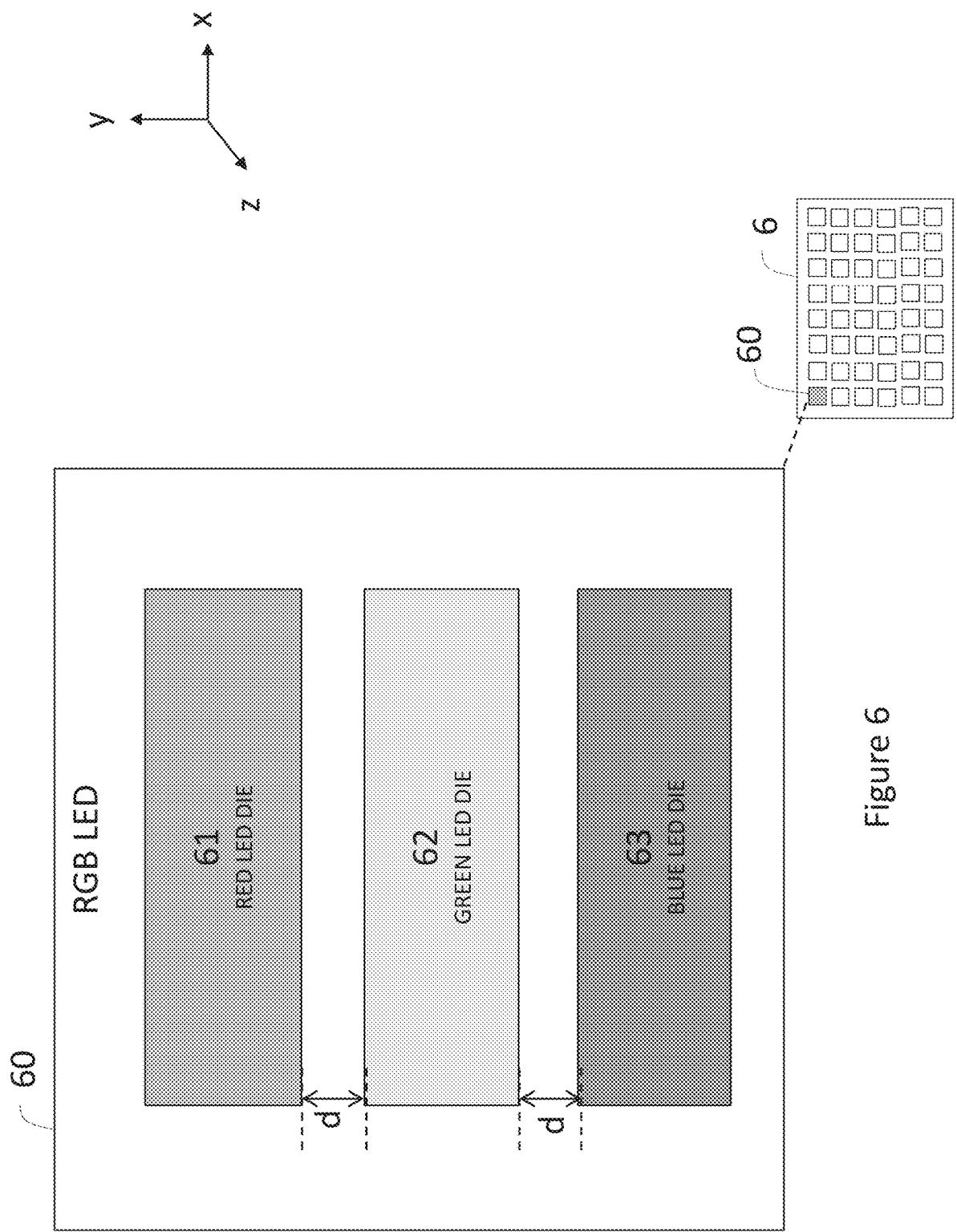
FIG. 6 shows an example of schematic representation of a related RGB LED in front view, as part of a LED display, wherein the LED comprises a red, green and blue LED die placed next to each other, separated at a distance d from each other.

FIG. 6 shows an example of a schematic representation of a related RGB LED 60, in front view, as part of a LED display 6. It is noted that front view or front side, being the view or side at which a person is looking at, and onto which the images are displayed. The LED 60 itself is shown on the display 6 as well as zoomed out in enlarged version. In FIG. 6, xyz-coordinates are given to facilitate the description. In this particular LED example, along vertical y-axis, the red LED die 61 is positioned first, adjacent below the green LED die 62 is placed (in the middle), and next under the blue LED die 63 is positioned (at the lowest). All LED dies 61, 62, 63 are placed next to each other, here vertically along the y-axis, and a little spaced (here at distance d) from each other, in a particular (predetermined) order, i.e. first red 61, then green 62, and then blue 63 LED die.

Alternatively, LED dies can be put i.e. stacked on top of each other with side bonding techniques, herewith bonding sides or surfaces of the LED dies. Hence, from a physical point of view, there is no viewing angle difference between the red, green and blue LED dies. Different methods of bonding may be used. Die bonding is a manufacturing process used in the packaging of semiconductors. Here in particular, one die is attached to another one, such that a stacking of attached dies is achieved. After die bonding, wire bonding or electrical bonding is performed to secure electrical signals. In general, wire or electrical bonding is used to transmit power and signal between substrates and chips (here dies), which is vital to interconnect die-to-substrate (here die-to-die) in LED packaging. Bonding wires or making the electrical connections also helps to dissipate heat during LED operation. In relation to an aspect of the invention, each of the LEDs comprise a plurality of LED dies, wherein the LED dies for each LED are configured in that they are stacked on top of each other. The LED dies and the stacking thereof are now further described. Each of the LEDs may comprise for example three color LED dies, e.g. a red LED die, a green LED die and a blue LED die. In case of three colors, as mentioned, this could be red, green and blue (RGB) while not excluding other colors and/or color combinations. By means of example, according to an embodiment, each of the LEDs comprise four color LED dies, e.g. a red LED die, a green LED die, a blue LED die and an orange LED die. The LED stack is comprised of stacked LED dies, which can also be referred to as LED sub-units. The LED stack may comprise a plurality of stacked LED dies or LED sub-units. Three or four stacked LED dies or LED sub-units are common, although a lower or higher number of stacked layers is not excluded.

Figure 7:
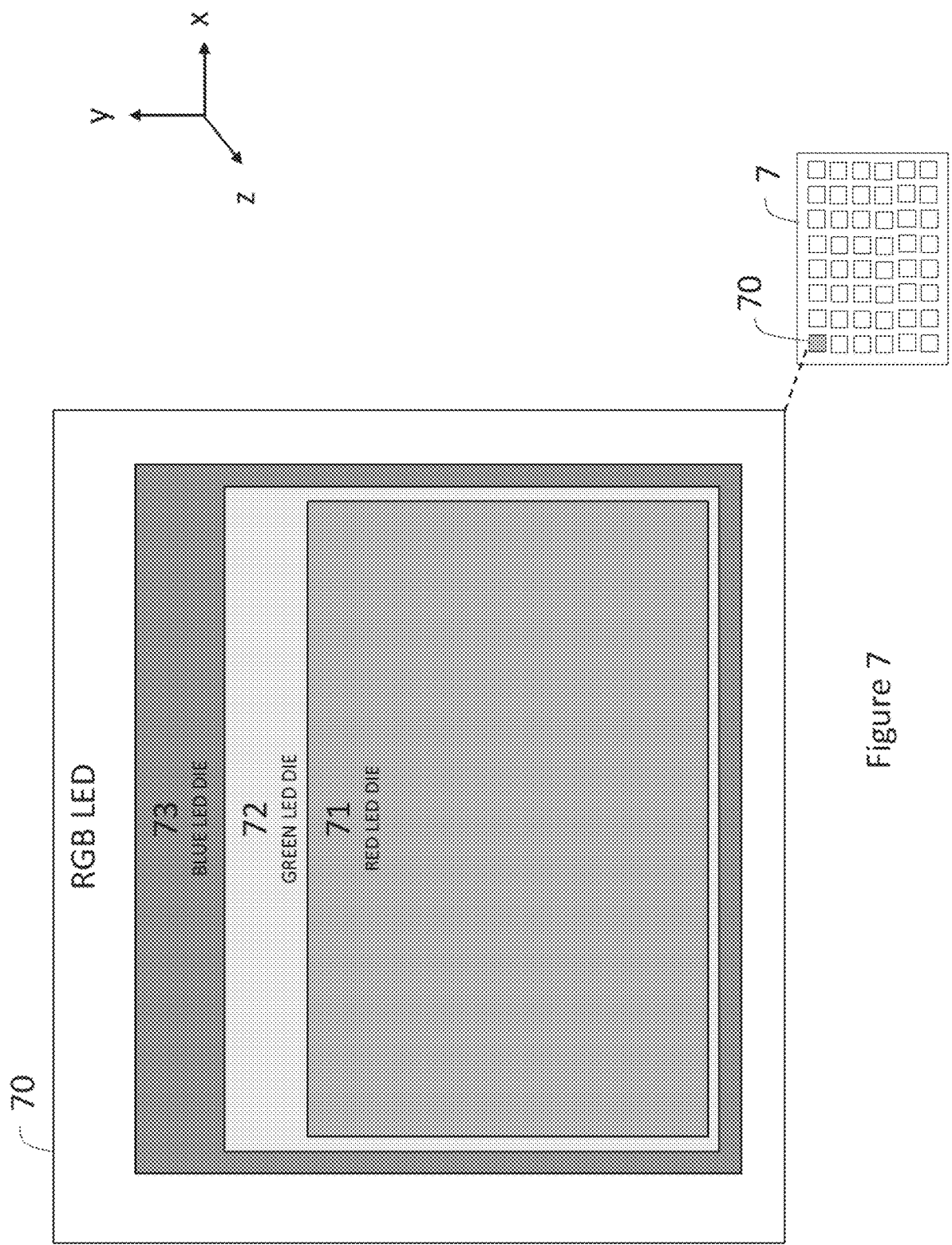
FIG. 7 illustrates an embodiment of a RGB LED in front view, as part of a LED display, wherein the LED comprises a red, green and blue LED die (layer) positioned on top of each other, in accordance with the invention.

FIG. 7 illustrates an embodiment of a RGB LED 70 in front view, as part of a LED display 7, wherein the LED 70 comprises a red 71, green 72 and blue 73 LED die (layer) positioned on top of each other, in accordance with an embodiment. The LED 70 itself is shown on the display 7 as well as zoomed out in enlarged version. Again, an xyz-coordinate system is given to facilitate the description. The LED dies 71, 72, 73 can be considered as separate or individual parts. The LED dies 71, 72, 73 can, for example, be seen, considered or interpreted as separate (surface) layers, of which their surfaces being positioned parallel to each other, in or parallel with (or along) xy-plane and perpendicular to z-axis. The dies or die layers 71, 72, 73 can be bonded by means of bonding techniques as mentioned above. As an alternative, the dies or die layers are positioned at a distance from each other, while having molding in between. All die layers can be separated at the same distance, although it is not excluded that a difference in distance (separating the layers from each other) occurs. The LED dies may be surrounded by molding, including in between the LED dies, molding can be provided. The top of the stack is at the front of the LED display, where the eye (or a person) is looking at (images being displayed thereon). Considering again FIG. 7, this means that in this case, the red LED die 71 is on top of the stack, whereas the blue LED die 73 is at the bottom (towards the back of the display) and the green LED die 72 being positioned in the middle, in between the red and blue LED die layers. According to an embodiment, if the LED dies are thin enough, they can be transparent (or have a high level of transparency) and the most transparent LED die (with highest level of transparency) is then preferably placed on top. The degree or level of transparency will depend on the manufacturing process of the individual color LED dies.

According to an embodiment, the LED display (and/or module) comprises multiple LEDs arranged on a horizontal and vertical grid. Hence, an array or matrix of LEDs is formed and determines the architecture of the LED display (and/or module). Each LED has an anode and a cathode (not shown here). In general, such LED display comprises an electronical interface, and electronics to light up the individual LEDs, and is controlled by signals on the electronical interface. The electronical interface can be defined by a LED drive circuit having electrical connections, defined by rows and columns that electrically connect to the LEDs in the LED array or matrix. The LED display (and/or module) may comprise molding in between the LEDs.

As shown in FIG. 7, the red, green and blue LED dies 71, 72, 73 each have a different individual die size. The LED die size determines the amount of light emitted by that particular LED die. Assume we want to show D65 white light and assuming the LED die size determines the maximum white light. Given the same drive level, then we can increase the size. For example, for D65 white light we need 100% of red light, 80% of green light and 80% of blue light drive, we can increase the red die size so that it also needs 80%. Making the red die larger, it will be able to emit more light, and hence 100% light output for the smaller red die size will for example correspond to 80% light output for the larger red die size. As a result, we can now have 80% of red light, 80% of green light and 80% of blue light drive. We can then bring all colors to 100% light output again and hence we can increase to 100% for all individual colors.

Since now with the stacked configuration, all LED dies (per LED) are not next to each other, but are on top of each other, the distance between two pixels (or LEDs) can be decreased, which increases resolution. By increasing the resolution, lenticular lenses may more easily be used in front of the LEDs, in accordance with an embodiment of the invention. This can be done horizontally and/or vertically, and might be useful for 3D application, but also for e.g. sync-banding solutions, for eliminating banding effects as, e.g., discussed in "Studio display" and "Studio2" patent applications (U.S. patent application Ser. No. 16/895,872 and U.S. patent application Ser. No. 17/865,096, respectively). As yet mentioned in these previous patent applications, "Studio display" and "Studio2" patent applications (U.S. patent application Ser. No. 16/895,872 and U.S. patent application Ser. No. 17/865,096, respectively) from the same Applicant, existing displays that are used for studio applications, meaning within. for example. a broadcasting environment, in general show defects on the final screen (resulting from camera recording) that is seen by the public or user. Complex and cumbersome manipulation is then often performed to make images acceptable again for the viewer, whereas only a mere acceptability is provided by lack of better availability. However, a robust and simple solution is yet described in the "Studio display" patent application (U.S. patent application Ser. No. 16/895,872) in relation to the sync-banding principle, i.e., Vertical Sync Update as described in therein. Synchronization can be provided by means of having a programmable update time of new entering images or the sync signal with which new images are scanned. The programmable aspect implies that it can be programmed such that certain amount of time is waited until images are viewed or represented. Moreover, in the "Studio2" patent application (U.S. patent application Ser. No. 17/865,096), one or more programmable off-set values can be selected to improve the interplay of a light source display with a camera recording the image displayed by the light source display, in order to improve energy efficiency and/or to reduce banding effects. One or more programmable off-set values represent a programmable off-set (of the light source display input signal or the image being displayed on the light source display) relative to the operation of the camera having a shutter and corresponding shutter time.

Figure 8:
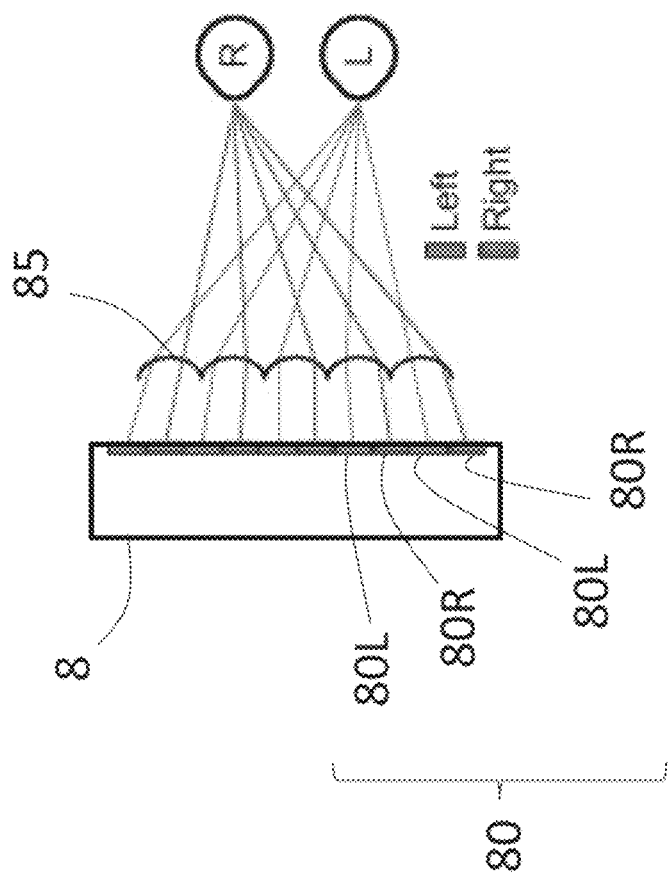
FIG. 8 illustrates a schematic embodiment in side view of a LED display comprising LEDs with stacked LED dies and being provided with a lenticular lens array, in accordance with the invention.

Referring back now to the embodiment of the present invention, using lenticular lenses in front of the LEDs. An example is shown in FIG. 8, wherein a lenticular lens array 85 is put on top of the LED display 8 comprising a plurality of LEDs 80. The lenticular lens array 85 is provided in front of the LEDs 80, whereas the LEDs comprise each a stack of LED dies such as e.g. three color dies. Amongst the LEDs 80 two different types of LEDs 80R, 80L can be distinguished. One type of LED 80R is intended for the right eye R, while another type of LED 80L is intended for the left eye L. The alternate appearance of left eye LED 80L and right eye LED 80R in combination with the lenticular lens array 85 forms the configuration for the 3D display application. It is noted here that—since the LED dies are on top of each other—the lenticular lens array design (or using lenticular lenses) is much simpler whereas all colors or color dies have the same viewing angle, and hence having much less LEDs image/color cross talk between the pixels meant for left eye and for right eye. According to an embodiment, two different video streams are provided for left eye L and right eye R (or left and right eye pixel) respectively. The image doesn't need to be intermittently changed between left and right eye pixel. One video stream can be for the left eye pixel, the other one can be for the right eye pixel (as will be further elaborated in the next chapter, herewith particularly referring to FIG. 24 and corresponding description). Further, the LED display may comprise a non-volatile memory (which may also possibly be omitted).

According to an embodiment, the size of the pixels and/or pixel dies, is comparable with or in the range of the dimensions as presented in FIG. 2(*b*) (see e.g. chip size mentioned therein). However, as schematically illustrated in FIG. 7, although being more or less in the same order of magnitude (of the RGB LED), the individual LED dies may slightly differ in size, for e.g. 1 to 5%, or 1 to 10%, or 1 to 20%. The comparative ratio of pixels or pixel dies, or the area of the stacked pixel dies, can be modified and optimized to obtain the desired color ratios or color brightness ratios.

Multiplexing and Staggered Multiplexing

Figure 9:
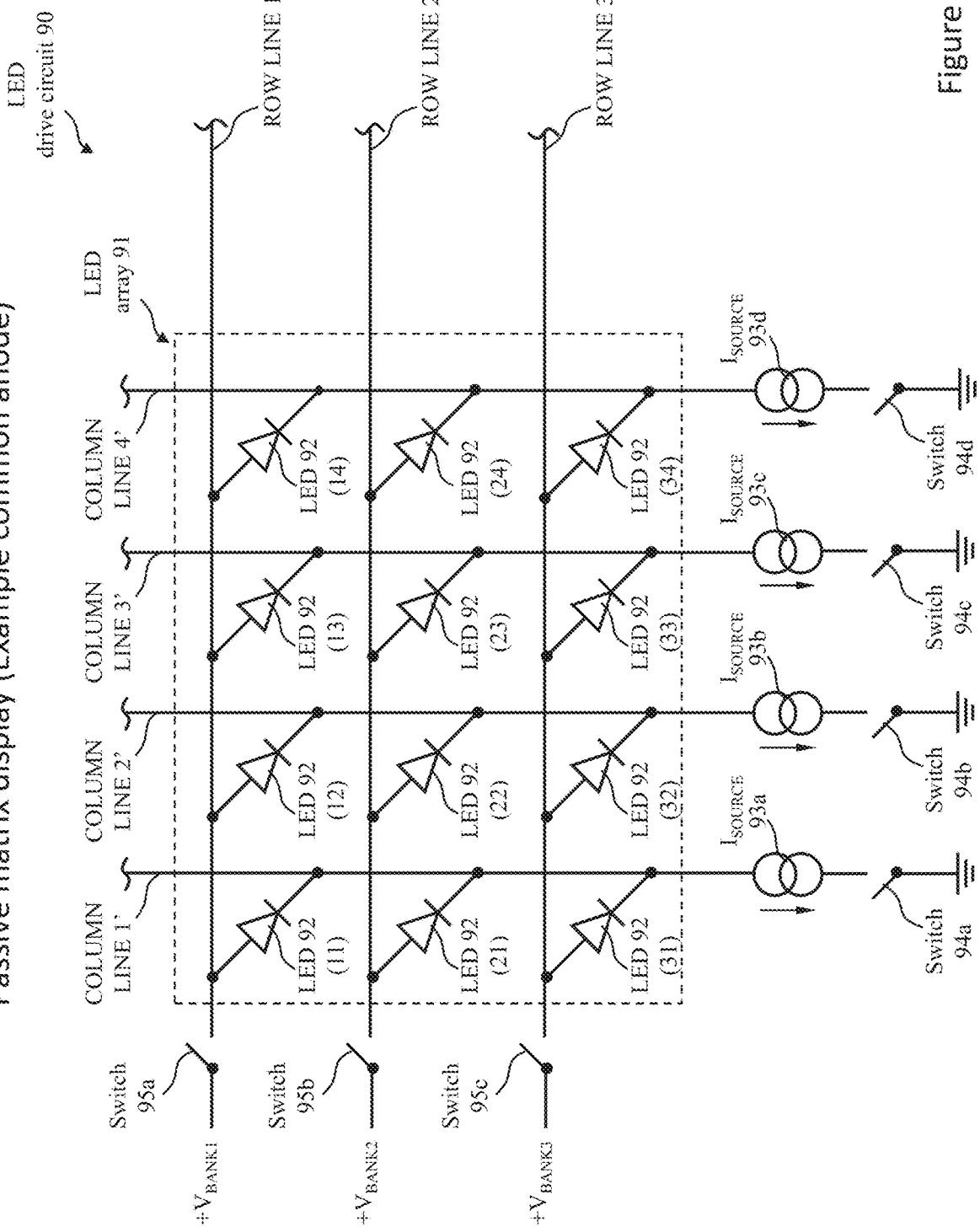
FIG. 9 shows a schematic diagram of a related common anode LED drive circuit.

In a passive matrix display, pixels are addressed row by row, which is called time multiplexing. This means that all pixels on row 1 (or first row) are updated first, then all pixels on row 2 (or second row), etc. meaning that for a display with three rows, each row is only addressed ⅓ of the total time. FIG. 9 shows a picture embodiment of a related multiplexing schematic used for LEDs within a display matrix. A LED drive circuit 90 for a LED display is represented, comprising multiple LEDs 92 arranged on a horizontal and vertical grid, i.e. in a LED array 91. Each of the LEDs 92 are indicated with their respective position in the LED array 91 (between brackets), e.g. on position 'first row, first column' the LED 92 is indicated with '11' between brackets. Within the LED drive circuit 90, the LEDs 92 are sharing a common anode in the same row or row line 1, 2, 3 via which they are driven by power supply Vbank1, Vbank2, Vbank3, and sharing a (constant current) driver 93a, 93b, 93c, 93d per column or column line 1', 2', 3', 4'. A positive voltage is electrically connected to each respective row 1, 2, 3 via a plurality of switches 95a, 95b, 95c. The LED drive circuit 90 comprises a plurality of drivers or current sources 93a, 93b, 93c, 93d, such as for example current source 93a which may be coupled to column l' via a switch 94a. By analogy, other current source 93b, 93c, 93d may be coupled via respective switch 94b, 94c, 94d. Each LED 92 has an anode and a cathode. In general, the LED display comprises an electronical interface, and electronics to light up the individual LEDs 92, and is controlled by signals on the electronical interface. The electronical interface can be defined by a LED drive circuit 90 having electrical connections, here in FIG. 9 defined by rows 1, 2, 3 and columns 1', 2', 3', 4' that electrically connect to the LEDs 92 in the LED array 91. Related LEDs in display applications are generally driven using a passive matrix structure, herewith referring for example to the common anode principle, although common cathode is also possible. Applying multiplexing within the passive matrix LED display, will result in lots of connections. FIG. 9 illustrates the electrical connections for a 3 by 4 pixel display.

Figure 10A:
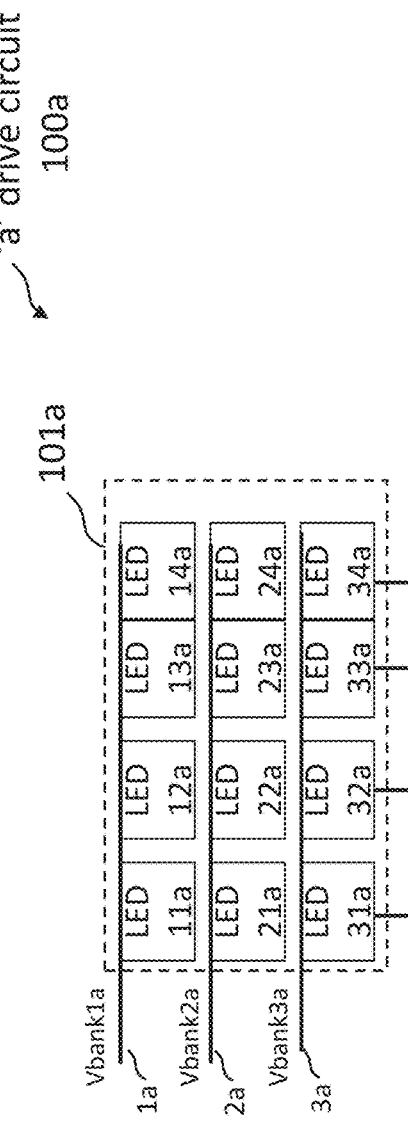
FIGS. 10(a) and 10(b) show a schematical multiplexing arrangement of a LED display having two LED drive circuits, wherein the LEDs are arranged in a common anode configuration, wherein each of the LED drive circuit being configured as a common anode drive device.
Figure 10B:
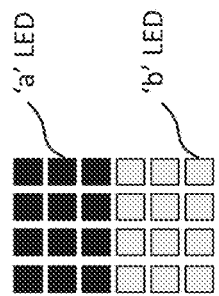

In FIGS. 10(*a*) and 10(*b*) (and FIG. 13) a related (multi) LED display is depicted with 24 LEDs, i.e. twice a 3×4 matrix pf LEDs or twice an array of 12 LEDs arranged as 3×4. FIG. 10(*a*) shows a schematical multiplexing arrangement of a LED display having two LED drive circuits 100a, 100b (i.e. 'a' and 'b' circuit), wherein the LEDs are arranged in a common anode configuration, and wherein each of the LED drive circuits 100a, 100b being configured as a common anode drive device. Although, here again, common anode is shown by means of example, a common cathode configuration and common cathode drive device is not excluded, and can also be applied alternatively. For each drive circuit 100a, 100b, the LEDs are arranged in corresponding LED array 101a, 101b. Each of the LEDs are indicated with their respective position in one of the LED arrays 101a, 101b of either 'a' or 'b' circuit respectively. In this example, a first constant current driver 105a drives cathode side of all LEDs xxa (or 'a' LEDs) wherein the rows 1a, 2a, 3a are selected by Vbank1a, Vbank2a, Vbank3a power supply respectively (together Vbanka power supplies). Since all 'a' LEDs are part of the LED array 101a of the first drive circuit 100a, the first constant current driver 105a is (to be) connected to the 'a' drive circuit 100a. A second constant current driver 105b drives cathode side of the LEDs xxb (or 'b' LEDs) and the rows 1b, 2b, 3b are selected by Vbank1b, Vbank2b, Vbank3b power supply respectively (together Vbankb power supplies). While all 'b' LEDs are part of the LED array 101b of the second drive circuit 100b, the second constant current driver 105b is (to be) connected to the 'b' drive circuit 100b. In FIG. 10(*b*), an example of a physical layout is shown of the LED display (or LED board) having the schematical multiplexing arrangement of FIGS. 10(*a*) and 10(*b*). For better visibility purposes, 'a' LEDs are represented in black, whereas 'b' LEDs are depicted in gray, herewith not implying that 'a' LEDs are black and/or 'b' LEDs are gray. They are only represented this way to easily distinguish them from one another.

Figure 13:
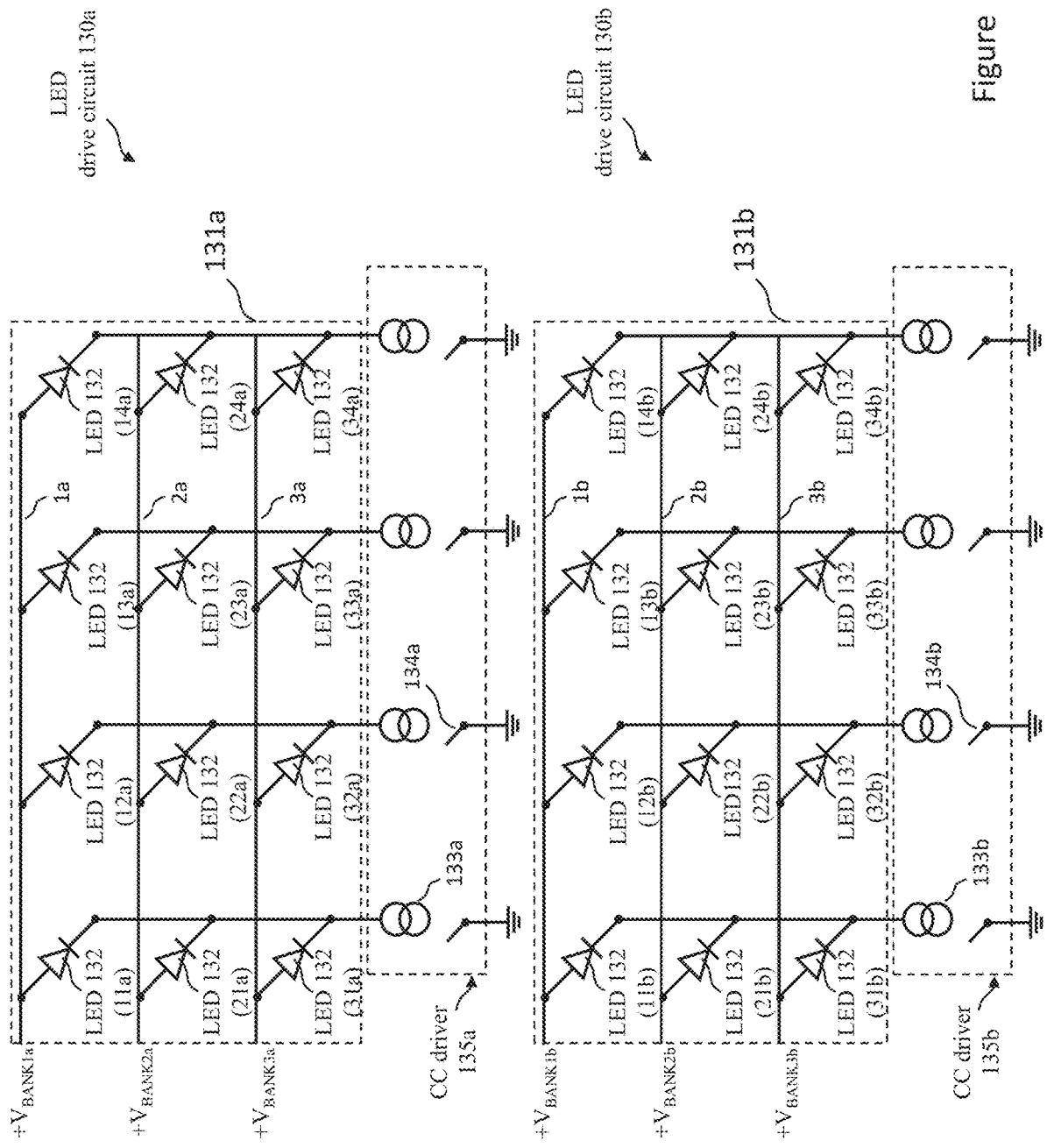
FIG. 13 shows a schematic diagram of a LED display having two LED drive circuits, wherein the LEDs are arranged in a common anode configuration, wherein each of the LED drive circuit being configured as a common anode drive device.
Figure 18:
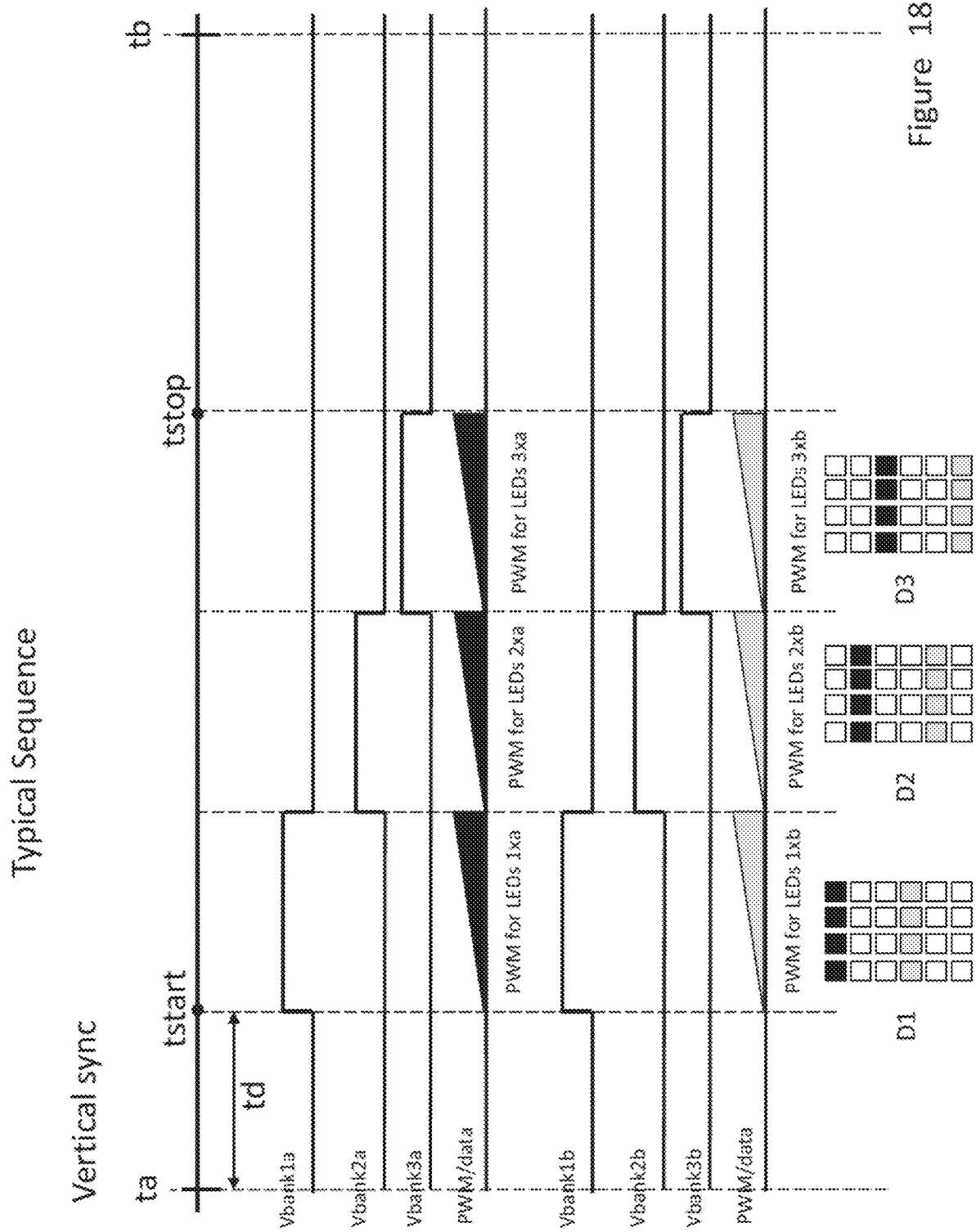
FIG. 18 shows a typical time scheme used for related multiplexed displays.

FIG. 10(*a*) is rather a simplified version of what is represented in more detail in FIG. 13. Corresponding FIG. 13 shows a schematic diagram of the same LED display with 6 rows and 4 columns having two LED drive circuits 130a, 130b (i.e. 'a' and 'b' circuit), wherein the LEDs 132 are arranged in a common anode configuration, and wherein each of the LED drive circuits 130a, 130b being configured as a common anode drive device. Each of the LEDs 132 are indicated with their respective position (between brackets) in one of the LED arrays 131a, 131b. A first constant current (CC) driver 135a drives cathode side of all LEDs xxa (or 'a' LEDs) wherein the rows 1a, 2a, 3a are selected by Vbank1a, Vbank2a, Vbank3a power supply respectively (together Vbanka power supplies). Since all 'a' LEDs are part of the LED array 131a of the first drive circuit 130a, the first CC driver 135a is (to be) connected to the 'a' drive circuit 130a. A second constant current (CC) driver 135b drives cathode side of the LEDs xxb (or 'b' LEDs) and the rows 1b, 2b, 3b are selected by Vbank1b, Vbank2b, Vbank3b power supply respectively (together Vbankb power supplies). While all 'b' LEDs are part of the LED array 131b of the second drive circuit 130b, the second CC driver 135b is (to be) connected to the 'b' drive circuit 130b. In FIG. 13 is further shown that the first constant current driver 135a comprises individual current sources or drivers 133a (here, four in total) that may be coupled via respective switches 134a (also four in total here). The second constant current driver 135b comprises individual current sources or drivers 133b (again here, four in total) that may be coupled via respective switches 134b (also four in total here). It is noted that Vbanka power supplies may have a different or at least separate start-stop sequence in comparison to Vbankb power supplies, as is depicted in FIG. 18 which will be further discussed below with the description thereof.

Figure 11:
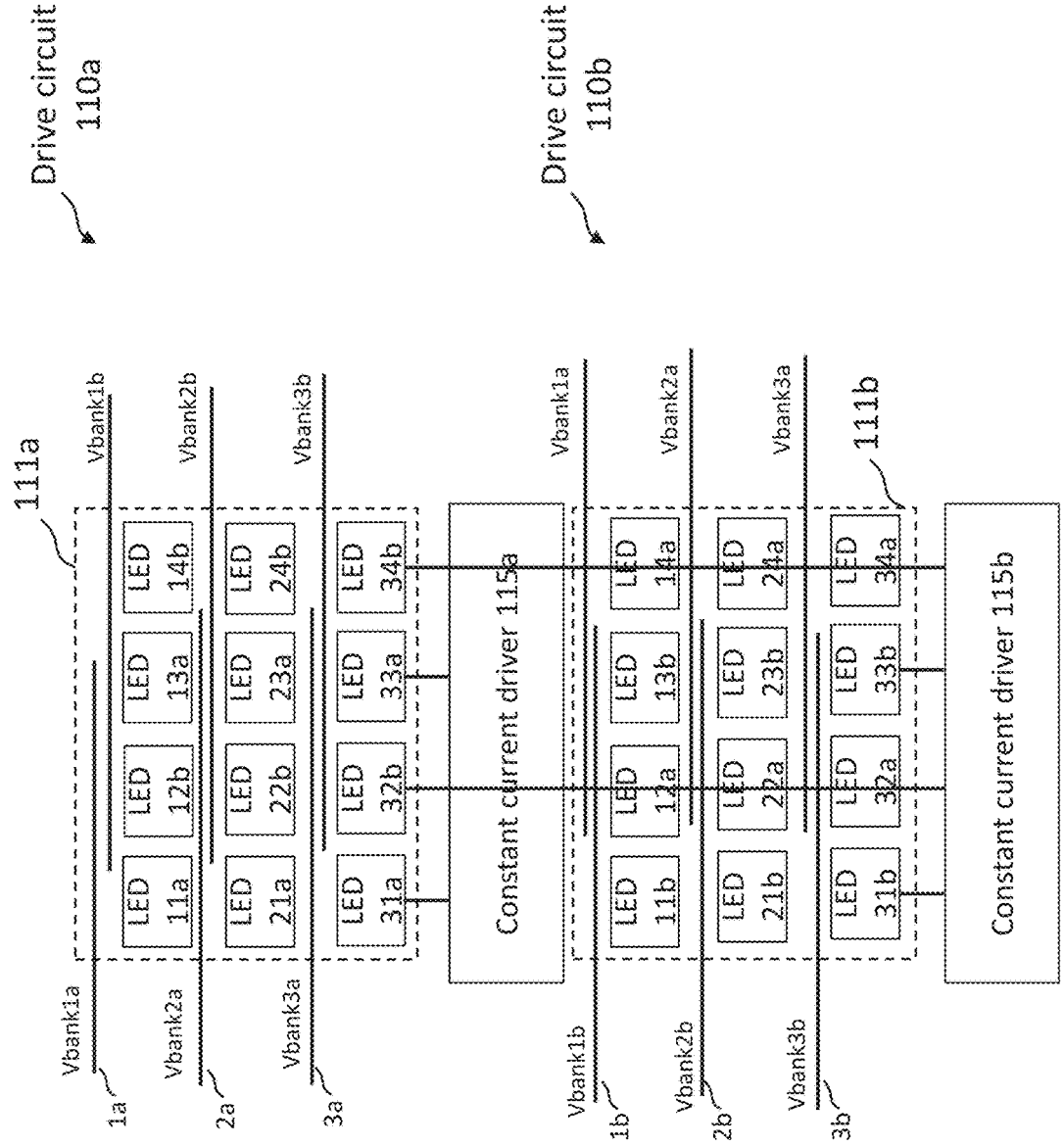
FIG. 11 shows an embodiment of a schematical multiplexing arrangement of a LED display having two LED drive circuits, wherein the LEDs are arranged in a common anode configuration, wherein each of the LED drive circuit being configured as a common anode drive device, and wherein LEDs driven by a first driver of a first drive circuit are residing physically with a second drive circuit, in accordance with the invention.

In accordance with an embodiment of the invention, FIG. 11 (and FIG. 14) is a new configuration wherein LEDs with connection to a first (constant current) driver are intermittently placed in between those driven by a second (constant current) driver and vice versa. FIG. 11 shows an embodiment of a schematical multiplexing arrangement, or what may be termed an interleaving arrangement, of a LED display having two LED drive circuits 110a, 110b, wherein the LEDs are arranged in a common anode configuration, and wherein each of the LED drive circuits 110a, 110b being configured as a common anode drive device. Although, here again common anode is shown by means of example, a common cathode configuration and common cathode drive device is not excluded, and can also be applied alternatively in accordance with an embodiment of the invention. For each drive circuit 110a, 110b, the LEDs are arranged in a LED array 111a, 111b. Each of the LEDs are indicated with their respective position in one of the LED arrays 111a, 111b of either first or second drive circuit respectively. In the embodiment, 'a' and 'b' LEDs are both shown either in the LED array 111a of the first drive circuit 110a, as in the LED array 111b of the second drive circuit 110b. A first constant current (CC) driver 115a drives cathode side of all LEDs xxa (or 'a' LEDs) wherein the rows 1a, 2a, 3a are selected by Vbank1a, Vbank2a, Vbank3a power supply respectively (together Vbanka power supplies). A second constant current (CC) driver 115b drives cathode side of the LEDs xxb (or 'b' LEDs) and the rows 1b, 2b, 3b are selected by Vbank1b, Vbank2b, Vbank3b power supply respectively (together Vbankb power supplies). Hence, 'a' LEDs are driven by the first CC driver 115a, whereas 'b' LEDs are driven by a second CC driver 115b. The first CC driver 115a is drawn as being part of the first drive circuit 110a. However, according to the embodiment, a few 'a' LEDs driven by the first CC driver 115a of the first drive circuit 110a are residing physically within the second drive circuit 110b. In addition, although the second CC driver 115b is drawn as being part of the second drive circuit 110b, a few 'b' LEDs driven by the second CC driver 115b of the second drive circuit 110b are residing physically within the first drive circuit 110a. This means that some of the LEDs xxa (or 'a' LEDs) are now appearing in the second drive circuit 110b, whereas some of the LEDs xxb (or 'b' LEDs) are now appearing in the first drive circuit 110a. The 'a' LEDs are although still (to be) connected to one of the respective Vbanka power supplies via one of the corresponding rows 1a, 2a, 3a, whereas 'b' LEDs are (to be) connected to one of the respective Vbankb power supplies via one of the corresponding rows 1b, 2b, 3b. As a result, in FIG. 11, 'a' and 'b' rows are shown for each of the drive circuits 110a, 110b. As shown, for the second and fourth column respectively of the LED arrays 111a, 111b, 'a' LEDs that are driven by the first CC driver 115a are appearing in the second drive circuit 110b, whereas 'b' LEDs that are driven by the second CC driver 115b are appearing in the first drive circuit 110a.

Figure 14:
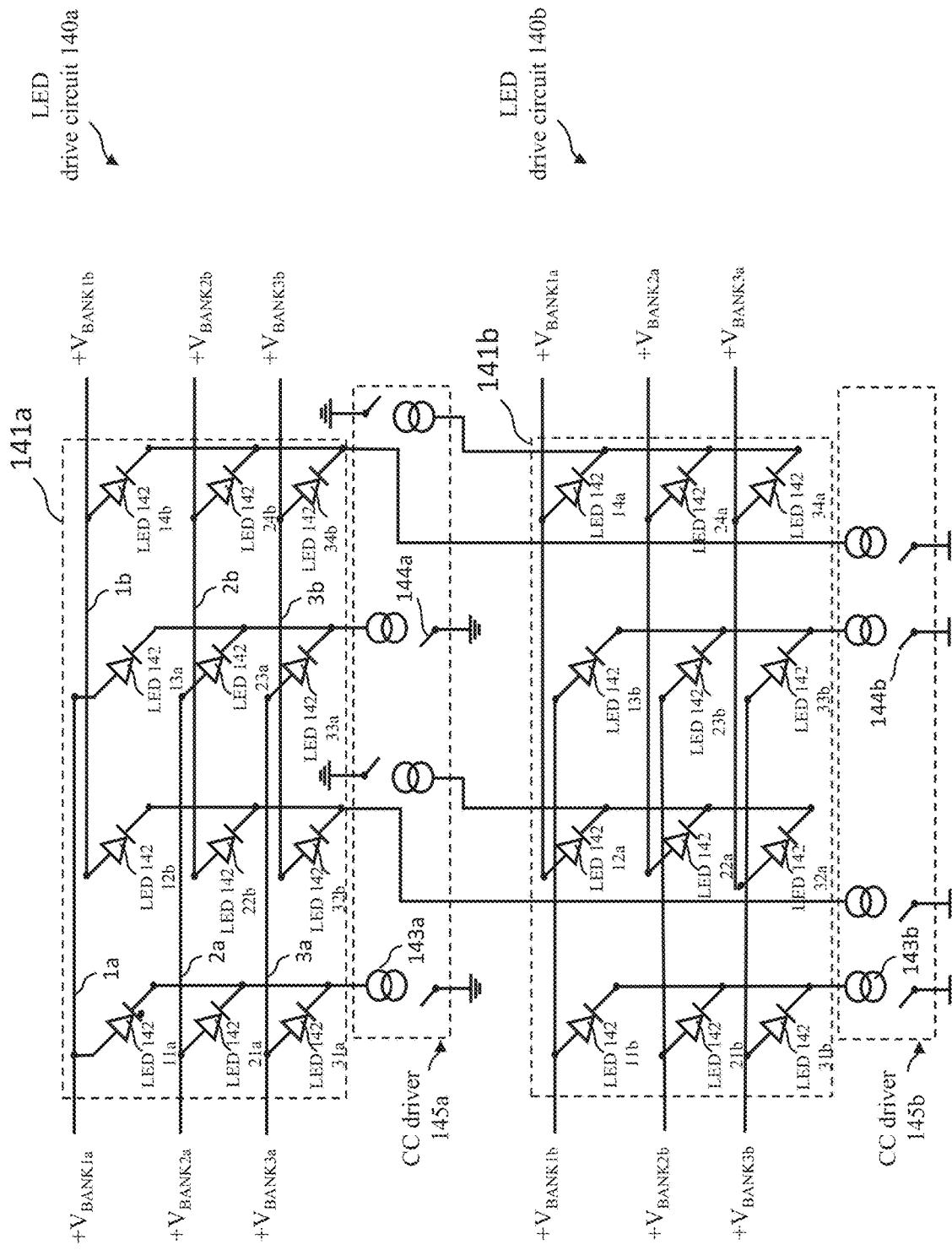
FIG. 14 shows an embodiment of a schematic diagram of a LED display having two LED drive circuits, wherein the LEDs are arranged in a common anode configuration, wherein each of the LED drive circuit being configured as a common anode drive device, and wherein LEDs driven by a first driver of a first drive circuit are residing physically with a second drive circuit, in accordance with the invention.

FIG. 11 is rather a simplified version of what is depicted more clearly in FIG. 14. Corresponding FIG. 14 shows a schematic diagram embodiment of the same LED display having two LED drive circuits 140a, 140b, wherein the LEDs 142 are arranged in a common anode configuration, and wherein each of the LED drive circuits 140a, 140b being configured as a common anode drive device. Again, the LEDs 142 are arranged in a LED array 141a, 141b, wherein the LEDs 142 are indicated with their respective position in the array 141a, 141b. Two LED arrays 141a, 141b are shown, one for each drive circuit 140a, 140b, wherein again (as in FIG. 11) both 'a' and 'b' LEDs are appearing both in each of the LED arrays 141a, 141b. A first CC driver 145a is drawn for the first drive circuit 140a, whereas a second CC driver 145b is drawn with the second drive circuit 140b. Nevertheless, not all LEDs 142 from the first drive circuit 140a are driven by first CC driver 145a, and not all LEDs 142 from second drive circuit 140b are driven by second CC driver 145b. Some of the LEDs 142 driven by the first driver 145a of the first drive circuit 140a are residing physically within the second drive circuit 140b. Vice versa, some of the LEDs 142 driven by the second driver 145b of the second drive circuit 140b are residing physically within the first drive circuit 140a. Whereas the 'a' LEDs are always driven by first CC driver 145a, some of the LEDs xxa (or 'a' LEDs) are now appearing in the second drive circuit 140b. Whereas the 'b' LEDs may be driven by second CC driver 145b, some of the LEDs xxb (or 'b' LEDs) are now appearing in the first drive circuit 140a. On the other hand, 'a' LEDs remain (to be) connected to one of the respective Vbanka power supplies via one of the corresponding rows 1a, 2a, 3a, whereas 'b' LEDs are still (to be) connected to one of the respective Vbankb power supplies via one of the corresponding rows 1b, 2b, 3b. As a result, in FIG. 14, 'a' and 'b' rows (with respective Vbanka and Vbankb power supplies) are appearing for each of the drive circuits 140a, 140b. As shown, for the second and fourth column respectively of the LED arrays 141a, 141b, 'a' LEDs that are driven by the first CC driver 145a are appearing in the second drive circuit 140b, whereas 'b' LEDs that are driven by the second driver 145b are appearing in the first drive circuit 140a. In conclusion, 'a' and 'b' LEDs are now mixed together for each LED array 141a, 141b of the drive circuits 140a, 140b. In FIG. 14 is further shown that the first CC driver 145a comprises individual current sources or drivers 143a (here, four in total) that may be coupled via respective switches 144a (also four in total here). The second CC driver 145b comprises individual current sources or drivers 143b (again here, four in total) that may be coupled via respective switches 144b (also four in total here). Again, it is noted that Vbanka power supplies may have a different or at least separate start-stop sequence in comparison to Vbankb power supplies.

Figure 12:
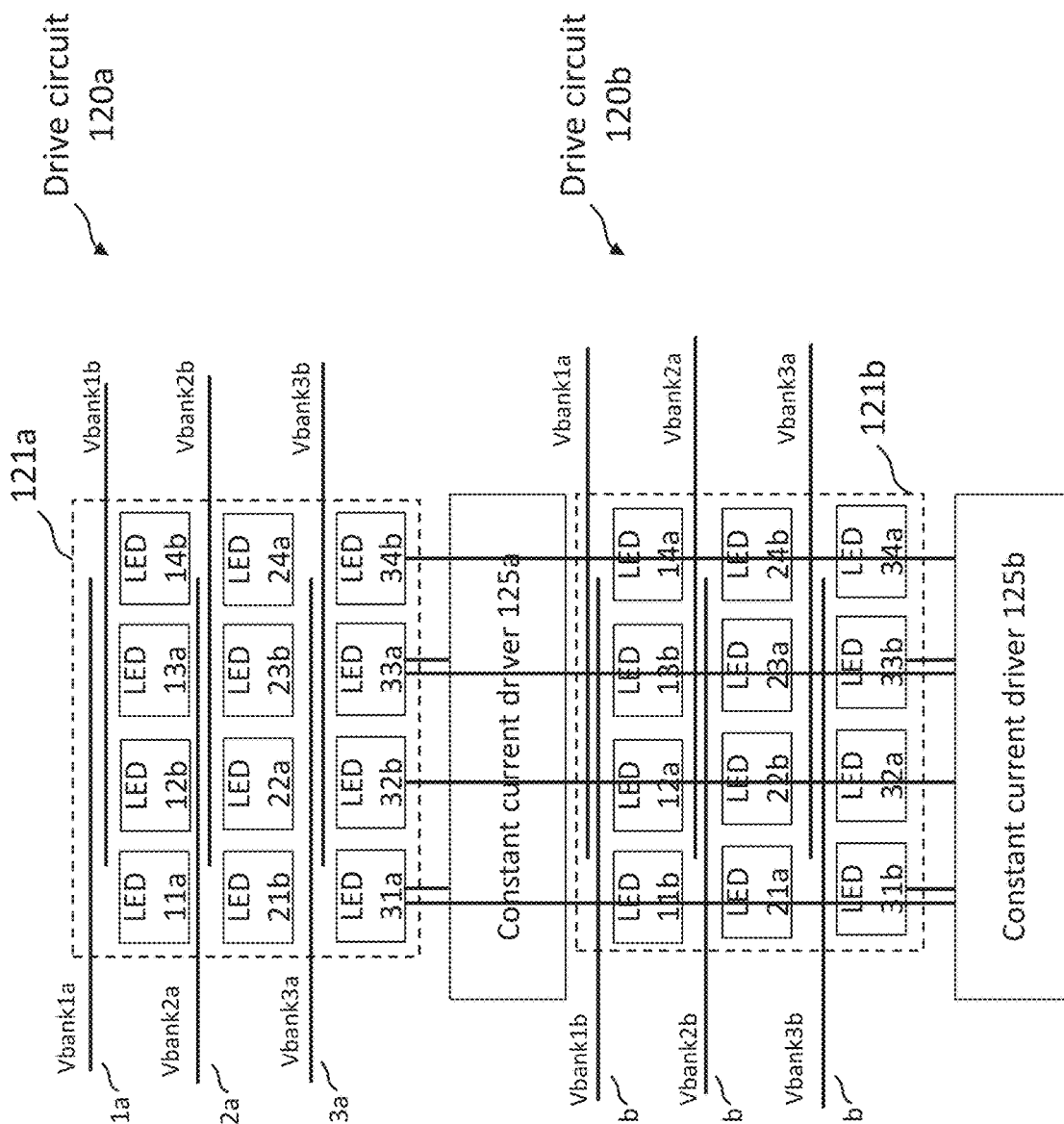
FIGS. 12(a) and 12(b) show another embodiment of a schematical multiplexing arrangement of a LED display having two LED drive circuits, wherein the LEDs are arranged in a common anode configuration, wherein each of the LED drive circuit being configured as a common anode drive device, and wherein LEDs driven by a first driver of a first drive circuit are residing physically with a second drive circuit, in accordance with the invention.
Figure 12:
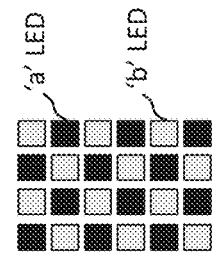

Another embodiment of the invention is shown FIGS. 12(a) and 12(b) (and FIG. 15) being a variation of this new configuration described here above. Again, LEDs with connection to a first CC driver are intermittently placed in between those driven by a second CC driver, and vice versa. FIGS. 12(a) and 12(b) show an embodiment of a schematical multiplexing arrangement of a LED display having two LED drive circuits 120a, 120b, wherein the LEDs are arranged in a common anode configuration, and wherein each of the LED drive circuits 120a, 120b being configured as a common anode drive device. Although, here again common anode is shown by means of example, a common cathode configuration and common cathode drive device is not excluded, and can also be applied alternatively in accordance with an embodiment of the invention. For each drive circuit 120a, 120b, the LEDs are arranged in a LED array 121a, 121b, wherein each of the LEDs being indicated with their respective position therein. In the embodiment, 'a' and 'b' LEDs are both shown either in the LED array 121a of the first drive circuit 120a, as in the LED array 121b of the second drive circuit 120b. Moreover, the 'a' and 'b' LEDs are further mixed as compared to previous embodiment illustrated in FIG. 11. A first CC driver 125a drives cathode side of all LEDs xxa (or 'a' LEDs) wherein the rows 1a, 2a, 3a are selected by Vbank1a, Vbank2a, Vbank3a power supply respectively (together Vbanka power supplies). A second CC driver 115b drives cathode side of the LEDs xxb (or 'b' LEDs) and the rows 1b, 2b, 3b are selected by Vbank1b, Vbank2b, Vbank3b power supply respectively (together Vbankb power supplies). Hence, 'a' LEDs are driven by the first CC driver 125a, whereas 'b' LEDs are driven by a second CC driver 125b. The first CC driver 125a is shown as being part of the first drive circuit 120a. However, according to the embodiment, a few 'a' LEDs driven by the first CC driver 125a of the first drive circuit 120a are residing physically within the second drive circuit 120b. In addition, although the second CC driver 125b is drawn as being part of the second drive circuit 120b, a few 'b' LEDs driven by the second CC driver 125b of the second drive circuit 120b are residing physically within the first drive circuit 120a. This means that some of the LEDs xxa (or 'a' LEDs) are now appearing in the second drive circuit 120b, whereas some of the LEDs xxb (or 'b' LEDs) are now appearing in the first drive circuit 120a. On the other hand, 'a' LEDs are still (to be) connected to one of the respective Vbanka power supplies via one of the corresponding rows 1a, 2a, 3a, whereas 'b' LEDs are (to be) connected to one of the respective Vbankb power supplies via one of the corresponding rows 1b, 2b, 3b. As a result, in FIG. 12(*a*), 'a' and 'b' rows are shown for each of the drive circuits 120a, 120b. As shown, per row and per column of each of the LED arrays 121a, 121b, 'a' LEDs and 'b' LEDs are shown alternatingly. In other words, here, next to each 'a' LED, a 'b' LED is shown, and next to is understood as left or right from the other LED as well as above or below the other LED. Hence, we no longer have only 'a' or 'b' LEDs per column, wherein 'a' and 'b' columns are alternatingly appearing in each of the LED arrays as in previous embodiment illustrated in FIG. 11. In FIG. 12(*a*), for example, in LED array 121a, 'b' LEDs appear in row 1 in second and fourth position, in row 2 in first and third position, and in row 3 again in second and fourth position. These 'b' LEDs being mixed up with 'a' LEDs in LED array 121a are driven by the second CC driver 125b (of the second drive circuit 120b), whereas 'a' LEDs therein are driven by the first CC driver 125a (of the first drive circuit 120a). In LED array 121b, 'a' LEDs appear in row 1 in second and fourth position, in row 2 in first and third position, and in row 3 again in second and fourth position. These 'a' LEDs being mixed up with 'b' LEDs in LED array 121b are driven by the first CC driver 125a (of the first drive circuit 120a), whereas 'b' LEDs therein are driven by the second CC driver 125b (of the second drive circuit 120b).

Figure 15:
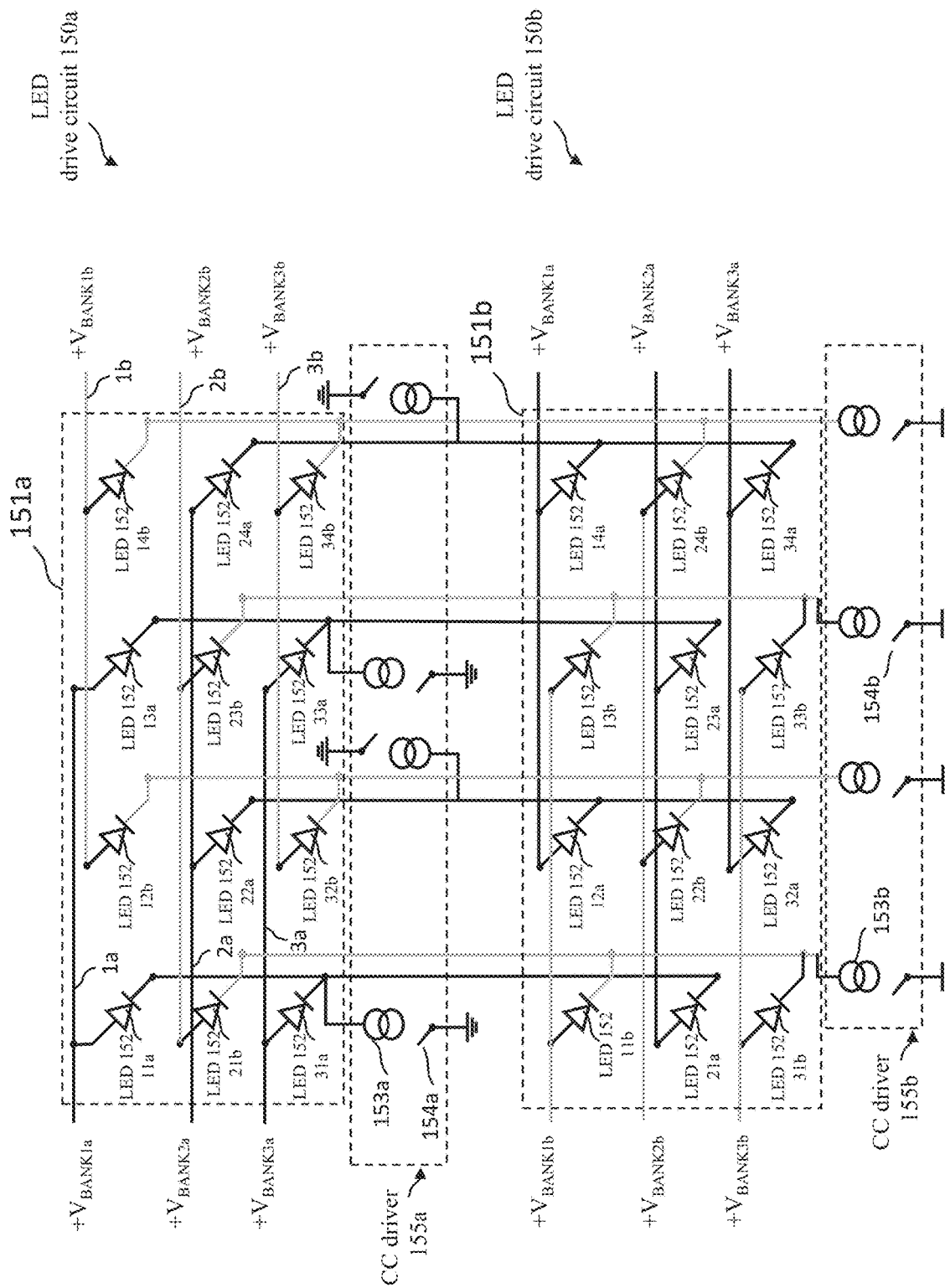
FIG. 15 shows another embodiment of a schematic diagram of a LED display having two LED drive circuits, wherein the LEDs are arranged in a common anode configuration, wherein each of the LED drive circuit being configured as a common anode drive device, and wherein LEDs driven by a first driver of a first drive circuit are residing physically with a second drive circuit, in accordance with the invention.

The embodiment of FIGS. 12(*a*) and 12(*b*) is rather a simplified version of what is depicted with more detail in FIG. 15. Corresponding FIG. 15 shows a schematic diagram embodiment of the same LED display having two LED drive circuits 150a, 150b. Again, a common anode configuration for the LEDs 152 is applied, wherein each of the LED drive circuits 150a, 150b being configured as a common anode drive device. The LEDs 152 are arranged in a LED array 151a, 151b and being indicated with their respective position therein. Two LED arrays 151a, 151b are shown, one for each drive circuit 150a, 150b, wherein again both 'a' and 'b' LEDs are appearing both in each of the LED arrays 151a, 151b. A first CC driver 155a is drawn for the first drive circuit 150a, whereas a second CC driver 155b is drawn with the second drive circuit 150b. Nevertheless, not all LEDs 152 from the first drive circuit 150a are driven by first CC driver 155a, and not all LEDs 152 from second drive circuit 150b are driven by second CC driver 155b. Some of the LEDs 152 driven by the first CC driver 155a of the first drive circuit 150a are residing physically within the second drive circuit 150b. Vice versa, some of the LEDs 152 driven by the second CC driver 155b of the second drive circuit 150b are residing physically within the first drive circuit 150a. Whereas the 'a' LEDs are always driven by first CC driver 155a, some of the LEDs xxa (or 'a' LEDs) are now appearing in the second drive circuit 150b. Whereas the 'b' LEDs may be driven by second CC driver 155b, some of the LEDs xxb (or 'b' LEDs) are now appearing in the first drive circuit 150a. On the other hand, 'a' LEDs remain (to be) connected to one of the respective Vbanka power supplies via one of the corresponding rows 1a, 2a, 3a, whereas 'b' LEDs are still (to be) connected to one of the respective Vbankb power supplies via one of the corresponding rows 1b, 2b, 3b. As a result, in FIG. 15, 'a' and 'b' rows (with respective Vbanka and Vbankb power supplies) are appearing for each of the drive circuits 150a, 150b. As shown, per row and per column of each of the LED arrays 151a, 151b, 'a' LEDs and 'b' LEDs are appearing alternatingly. In other words, here, next to each 'a' LED, a 'b' LED is shown, and next to is understood as left or right from the other LED as well as above or below the other LED. Hence, we no longer have only 'a' or 'b' LEDs per column, wherein 'a' and 'b' columns are alternatingly shown in each of the LED arrays as in previous embodiment illustrated in FIG. 14.

In FIG. 15, for example, in LED array 151a, 'b' LEDs appear in row 1 in second and fourth position, in row 2 in first and third position, and in row 3 again in second and fourth position. These 'b' LEDs being mixed up with 'a' LEDs in LED array 151a are driven by the second CC driver 155b (of the second drive circuit 150b), whereas 'a' LEDs therein are driven by the first CC driver 155a (of the first drive circuit 150a). in LED array 151b, 'a' LEDs shown in row 1 in second and fourth position, in row 2 in first and third position, and in row 3 again in second and fourth position. These 'a' LEDs being mixed up with 'b' LEDs in LED array 151b are driven by the first CC driver 155a (of the first drive circuit 150a), whereas 'b' LEDs therein are driven by the second CC driver 155b (of the second drive circuit 150b). In FIG. 15 is further shown that the first CC driver 155a comprises individual current sources or drivers 153a (here, four in total) that may be coupled via respective switches 154a (also four in total here). The second CC driver 155b comprises individual current sources or drivers 153b (again here, four in total) that may be coupled via respective switches 154b (also four in total here). Again, it is noted that Vbanka power supplies may have a different or at least separate start-stop sequence in comparison to Vbankb power supplies.

Figure 16:
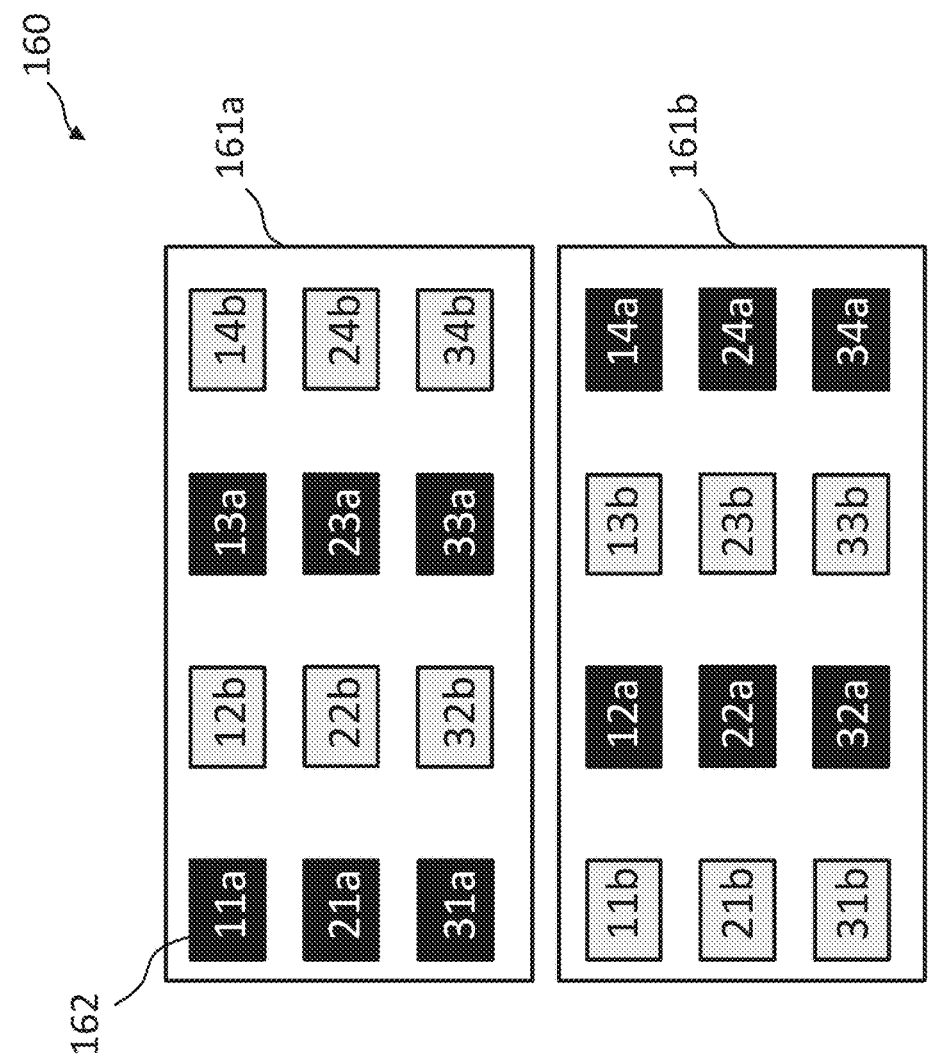
FIG. 16 shows an embodiment of a physical layout of the LED display having schematical multiplexing arrangement from FIG. 11, or schematic diagram from FIG. 14, in accordance with the invention.
Figure 17:
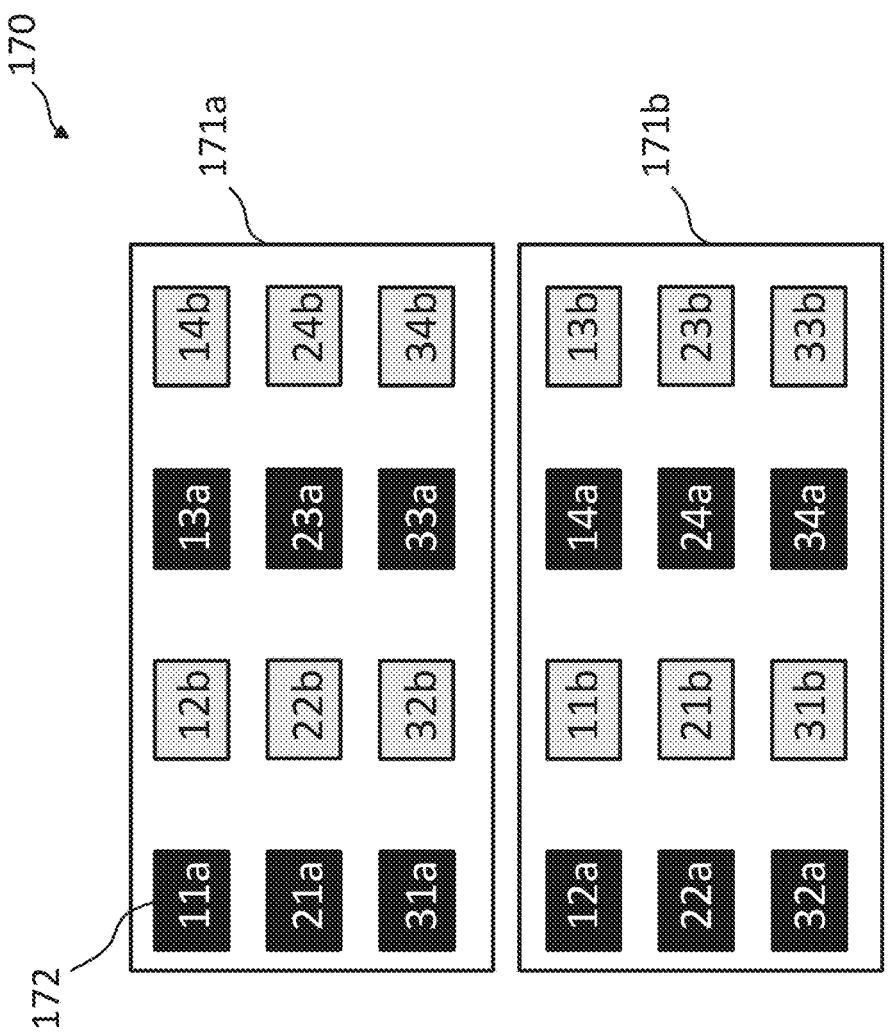
FIG. 17 shows another embodiment of a physical layout of the LED display having schematical multiplexing arrangement from FIG. 11, or schematic diagram from FIG. 14, in accordance with the invention.

Although the term 'physically residing' is used above in the description of the schematic logic FIGS. 11, 12 and FIGS. 14, 15, the real physical layout of the LEDs in a display (or part thereof) can be either the same (as the logic scheme), or (slightly) differ therefrom. In FIG. 12(*b*), an embodiment of a physical layout is shown of the LED display (or LED board) having the schematical multiplexing arrangement of FIG. 12(*a*). The appearance of the LEDs in the LED display corresponds entirely with the position representation of the LEDs in logic scheme of FIG. 12(*a*). To have a better view of the outcome, 'a' LEDs are represented in black, whereas 'b' LEDs are depicted in gray, herewith not implying that 'a' LEDs are black and/or 'b' LEDs are gray. They are only represented this way to easily distinguish them from one another. FIG. 16 shows an embodiment of a physical layout of the LED display with six rows and four columns having schematical multiplexing arrangement from FIG. 11, or schematic diagram from FIG. 14, in accordance with the invention. Here the appearance of the LEDs 162 in the LED display 160, in one or the other matrix 161*a*, 161*b*, correspond entirely with the position representation of the LEDs in FIG. 11 and FIG. 14 (between brackets) respectively. This is not the case in FIG. 17, showing another embodiment of a physical layout of the LED display with six rows and four columns having schematical multiplexing arrangement from FIG. 11, or schematic diagram from FIG. 14, in accordance with the invention. Here the appearance of the LEDs 172 in the LED display 170 does not fully correspond with the position representation of the LEDs in FIG. 11 and FIG. 14 (between brackets) respectively. For the upper matrix 171*a*, the position representation of all LEDs 172 has remained. However, for the lower matrix 171*b*, the LEDS 172 of first and second column, as well as those of third and fourth column have been switched in position. As a result, in the entire LED display 170, the first and third column now comprise only 'a' LEDs, while the second and fourth column comprise only 'b' LEDs. For improving visibility of what is described here, all 'a' LEDs are represented in black, whereas all 'b' LEDs are depicted in gray. It is particularly noted that this does not mean or imply that 'a' LEDs are black and/or 'b' LEDs are gray. They are only represented this way to easily distinguish them from each other.

Figure 19:
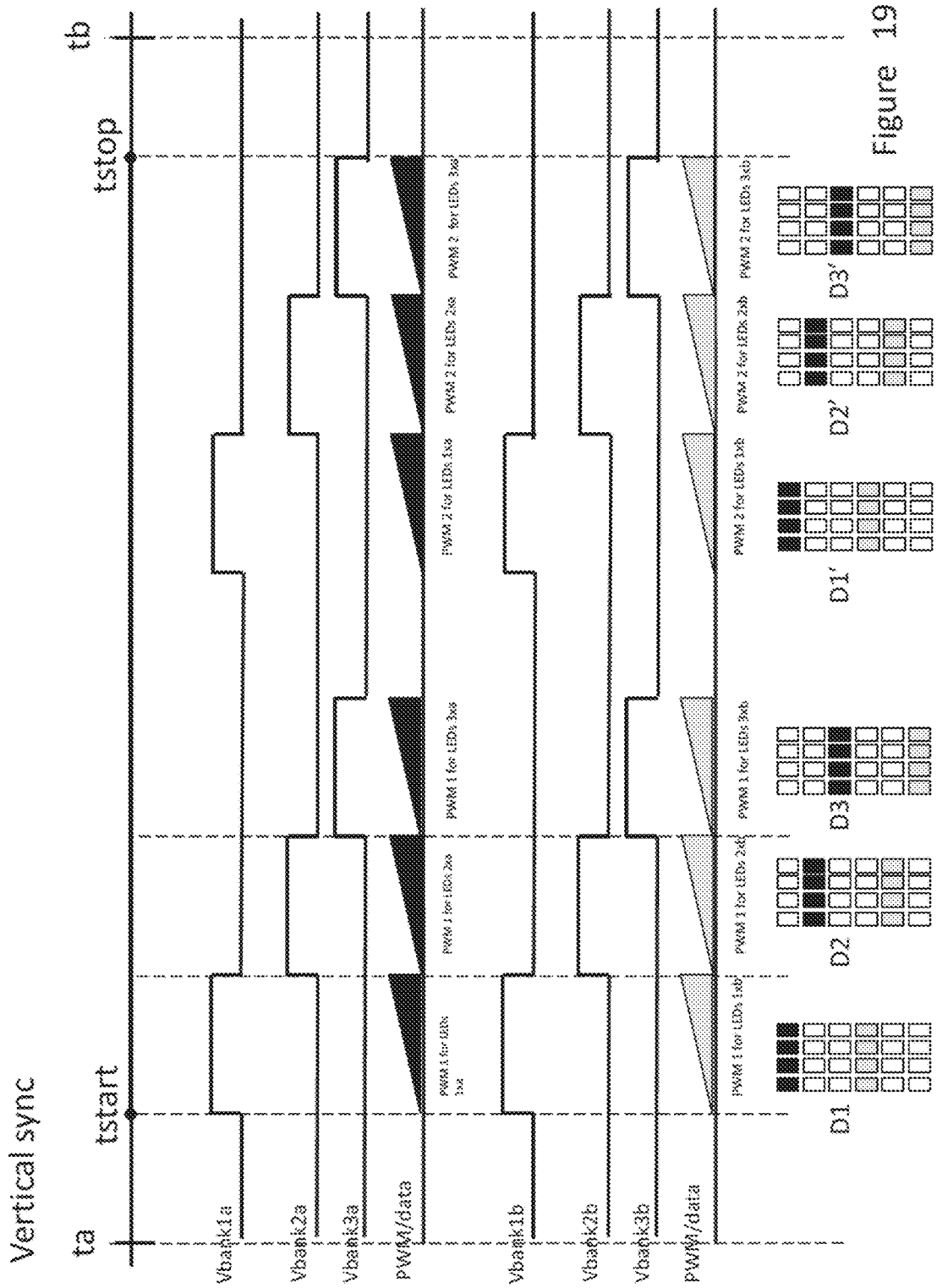
FIG. 19 shows an embodiment (for increasing display bit depth) in the time domain of the drive signals for lighting up the LEDs per row, and PWM generation, including corresponding display output, in accordance with the invention.

FIG. 18, corresponding to the logic circuit of FIG. 10(*a*), or FIG. 13, shows a time scheme used for related multiplexed displays. As mentioned above, Vbanka power supplies may have a different or at least separate start-stop sequence as compared to Vbankb power supplies. In this case of FIG. 18 e.g. Vbank1*a* is asserted together with Vbank1*b*. Moreover, here, the datastreams of Vbank1*a*, Vbank2*a*, Vbank3*a* are overlapping respectively with the datastreams of Vbank1*b*, Vbank2*b*, Vbank3*b* within the tstart-tstop period, during which the light output of the LEDs is represented by the respective below picture D1, D2, D3 (cfr. physical layout of the LED board) in a 6×4 matrix. The constant current drivers generate PWM signals to drive the LEDs. The below picture D1, D2, D3 shows what LEDs light up in a particular time slot or time period. The pictures D1, D2, D3 being the LED array representation for three different consecutive time slots within tstart-tstop period. According to the sync-banding method explained earlier (for eliminating banding effects e.g. in "Studio display" (U.S. patent application Ser. No. 16/895,872), and "Studio2" (U.S. patent application Ser. No. 17/865,096)), at time ta (also known as the vertical sync) a programmable delay td occurs, whereafter the multiplexing and PWM generation will start at time tstart. The start of (showing) the image (on the display) can be delayed or moved to avoid so-called banding or banding effects and thus to ensure that the image is in the visibility window (i.e. part or ribbon viewed on camera) of the camera shutter (opening) time. Banding is known in the art, being the effect that banding or bands appears on camera when recording a display image (in the background). When watching the news or sports on TV for example, and behind the speaker or journalist is a (LED) screen mounted with video or image displayed thereon, it is common that the screen in the back shows the video or image with banding effects. In case of a LED screen for example, this banding phenomena is (mainly) caused by the PWM (pulse-width modulation) signal of the image being shown on the display, in particular because the shutter (opening) time of the camera may start at different positions of the PWM (i.e. at lower power/brightness versus higher power/brightness), hence showing alternatingly brighter and darker images, resulting in images shown with bands having brighter and darker strips or parts. In addition to time ta, a next vertical sync time tb is shown in the drawing. Also, according to this sync-banding method, there is a programmable end at time tstop. In between these tstart and tstop times, PWM generation occurs to light up the LEDs. In FIG. 18 is shown that, by means of example, Vbank1*a* (and Vbank2*a*, Vbank3*a*) is only one time slot 'high' in one tstart-tstop period. The 'high' moments can be repeated although for multiple times (or time slots), as illustrated in FIG. 19. In the repetition time e.g. PWM1 for LEDs 1*xa* and PWM2 for LEDs 1*xa* can be different. In FIG. 19, both PWM cycles PWM1 and PWM2 for LEDs 1*xa* occur within one tstart-tstop period. FIG. 19 shows an embodiment (for increasing display bit depth) in the time domain of the drive signals for lighting up the LEDs per row, and PWM generation, including corresponding display output, in accordance with the invention. Consider for example that both PWM cycles are 8 bit. This means that, when 'seen' in time, you will have eye integration of 2 times 8 bit sequence, so the visual resolution or bit depth increases to 9 bit. Hence, this is a way to increase gray scales when e.g. the constant current drivers with PWM generation have limited PWM counter (e.g. only 8 bit, but 2× within the same period this results into 9 bit). The below picture D1, D2, D3 for PWM1 and the below picture D1', D2', D3' for PWM2 show what LEDs light up in the particular time period ta-tb.

Figure 20:
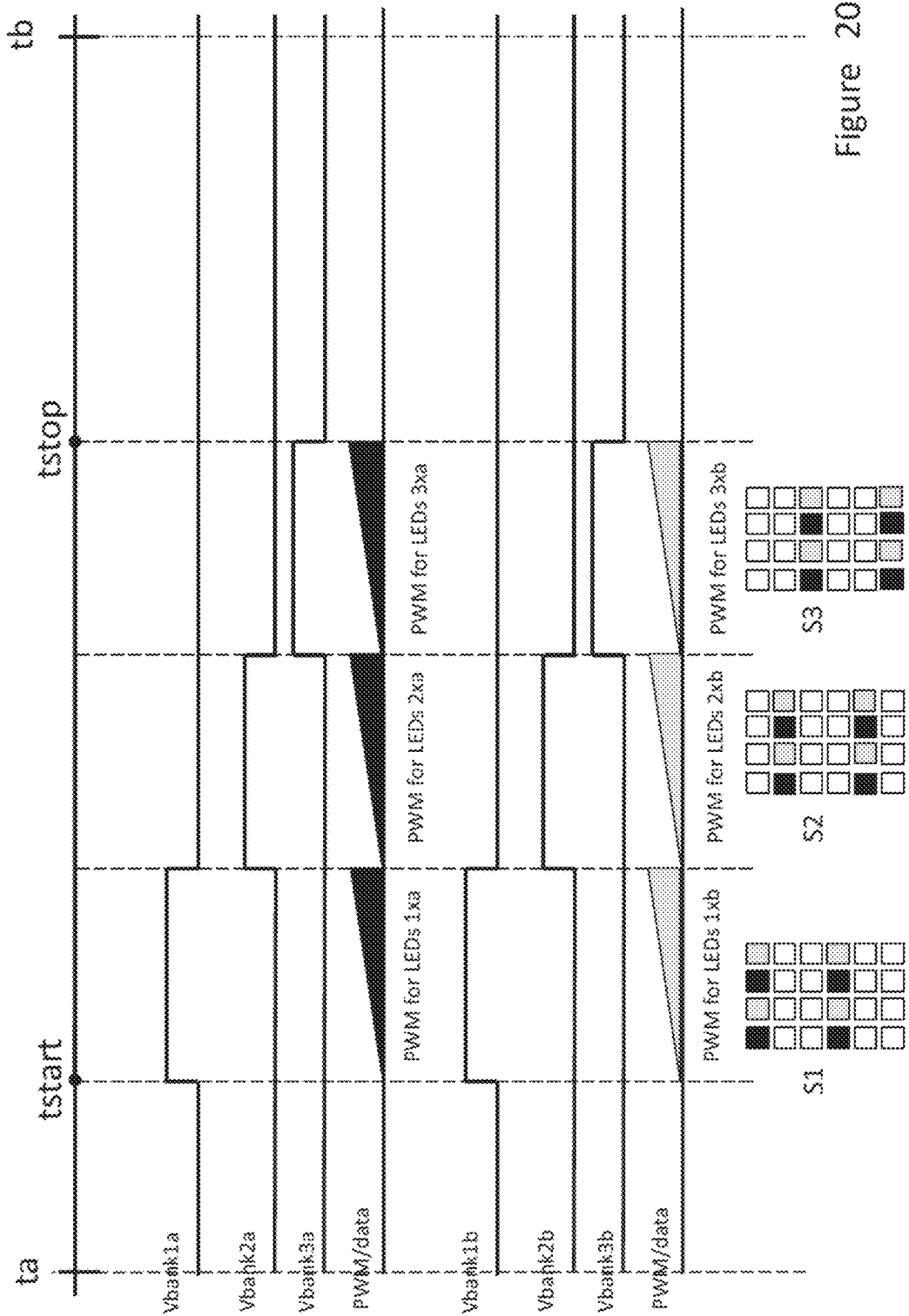
FIG. 20 shows another embodiment (for 3D display application) in the time domain of the drive signals for lighting up the LEDs per row, and PWM generation, including corresponding display output (for schematical multiplexing arrangement from FIG. 11, or schematic diagram from FIG. 14), in accordance with the invention.

FIG. 20 shows another embodiment (for 3D display application) in the time domain of the drive signals for lighting up the LEDs per row, and PWM generation, including corresponding display output (for schematical multiplexing arrangement from FIG. 11, or schematic diagram from FIG. 14), in accordance with the invention. More specifically, FIG. 20, corresponding to the logic circuit of FIG. 11, or FIG. 14, shows an example for e.g. 3D application wherein a lenticular lens (array), as e.g. depicted in FIG. 8, or polarizers are put in front of the LEDs. Hence, pairs of adjacent LEDs (one LED next to the other in a row) can be used for the light output and hence image to be seen for left and right eye respectively. Again, Vbanka power supplies may have a different or at least separate start-stop sequence as compared to Vbankb power supplies. The below picture S1, S2, S3 (cfr. physical layout of the LED board) for a 6×4 LED array, shows what LEDs light up in the tstart-tstop time period. It is noted that for the physical layout of the LED board, e.g. here the configuration as depicted in FIG. 17 is chosen (although another configuration such as e.g. shown in FIG. 16 is not excluded from the invention). The pictures S1, S2, S3 being the LED array representation for three different consecutive time slots within tstart-tstop time period. The 'black' or 'a' LEDs light output in S1, S2, S3 can be e.g. for the left eye, whereas the 'gray' or 'b' LEDs light output is then for the right eye. This is a way not to go to 120 Hz, but showing all data in 60 Hz (i.e. half of 120 Hz)

without loss of brightness, since left and right eye light output is given simultaneously having two dedicated LEDs or LED sets therefor. Traditionally however, left and right eye light output are given at a different time with a 120 Hz frequency.

Figure 21:
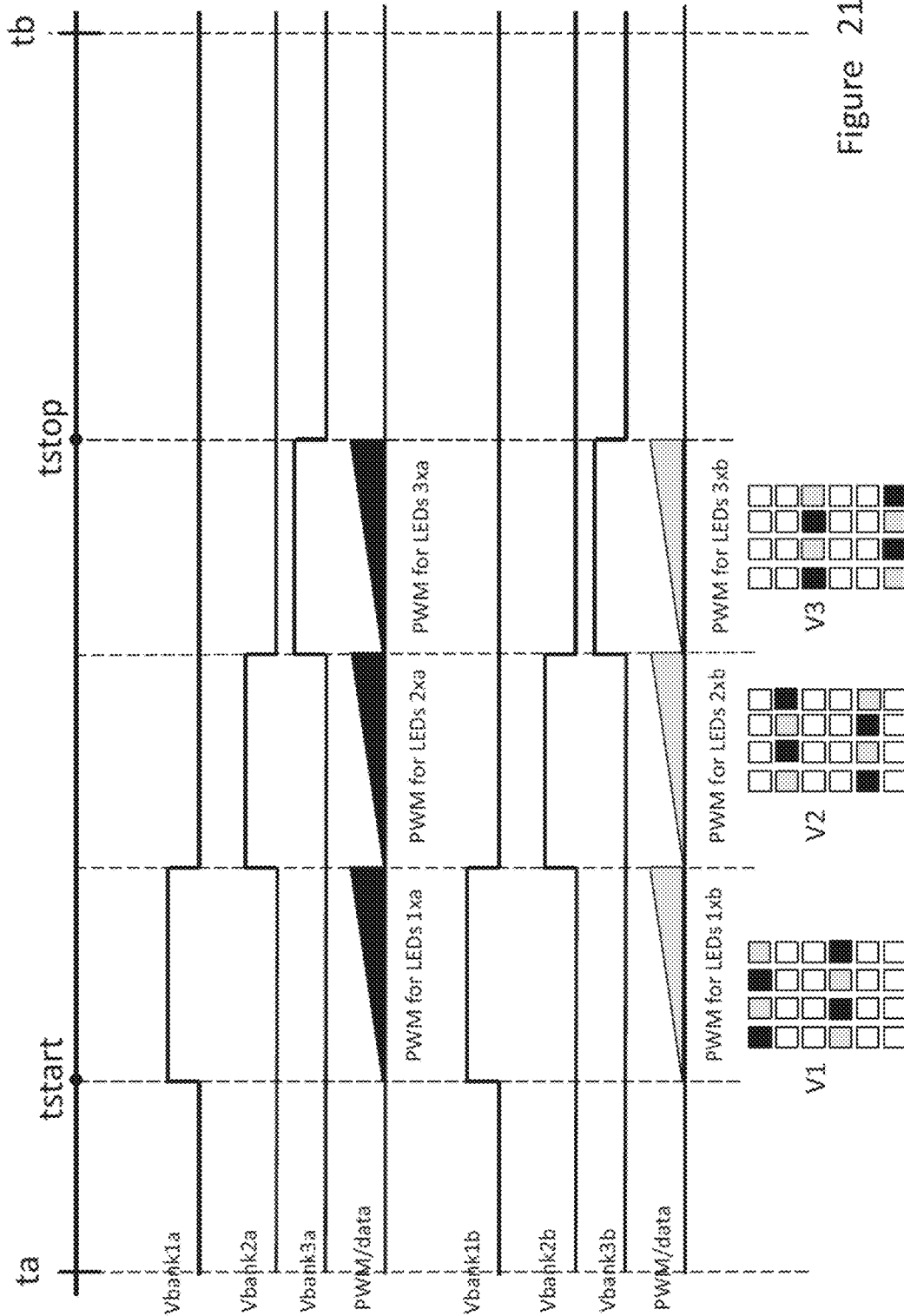
FIG. 21 shows yet another embodiment (for 3D display application) in the time domain of the drive signals for lighting up the LEDs per row, and PWM generation, including corresponding display output (for schematical multiplexing arrangement from FIG. 12(a), or schematic diagram from FIG. 15), in accordance with the invention

FIG. 21 shows yet another embodiment (for 3D display application) in the time domain of the drive signals for lighting up the LEDs per row, and PWM generation, including corresponding display output (for schematical multiplexing arrangement from FIG. 12(a), or schematic diagram from FIG. 15), in accordance with the invention. FIG. 21 thus shows an example of the elaboration in time corresponding to the LED logic scheme illustrated in FIG. 12(a), or FIG. 15 (general scheme, technical drawing/datasheet). The below picture V1, V2, V3 (cfr. physical layout of the LED board) shows what LEDs light up at consecutive time slots in the tstart-tstop time period. It is noted that for the physical layout of the LED board, e.g. here the configuration as depicted in FIG. 12(b) is chosen (although other configurations are not excluded from the invention).

Figure 22:
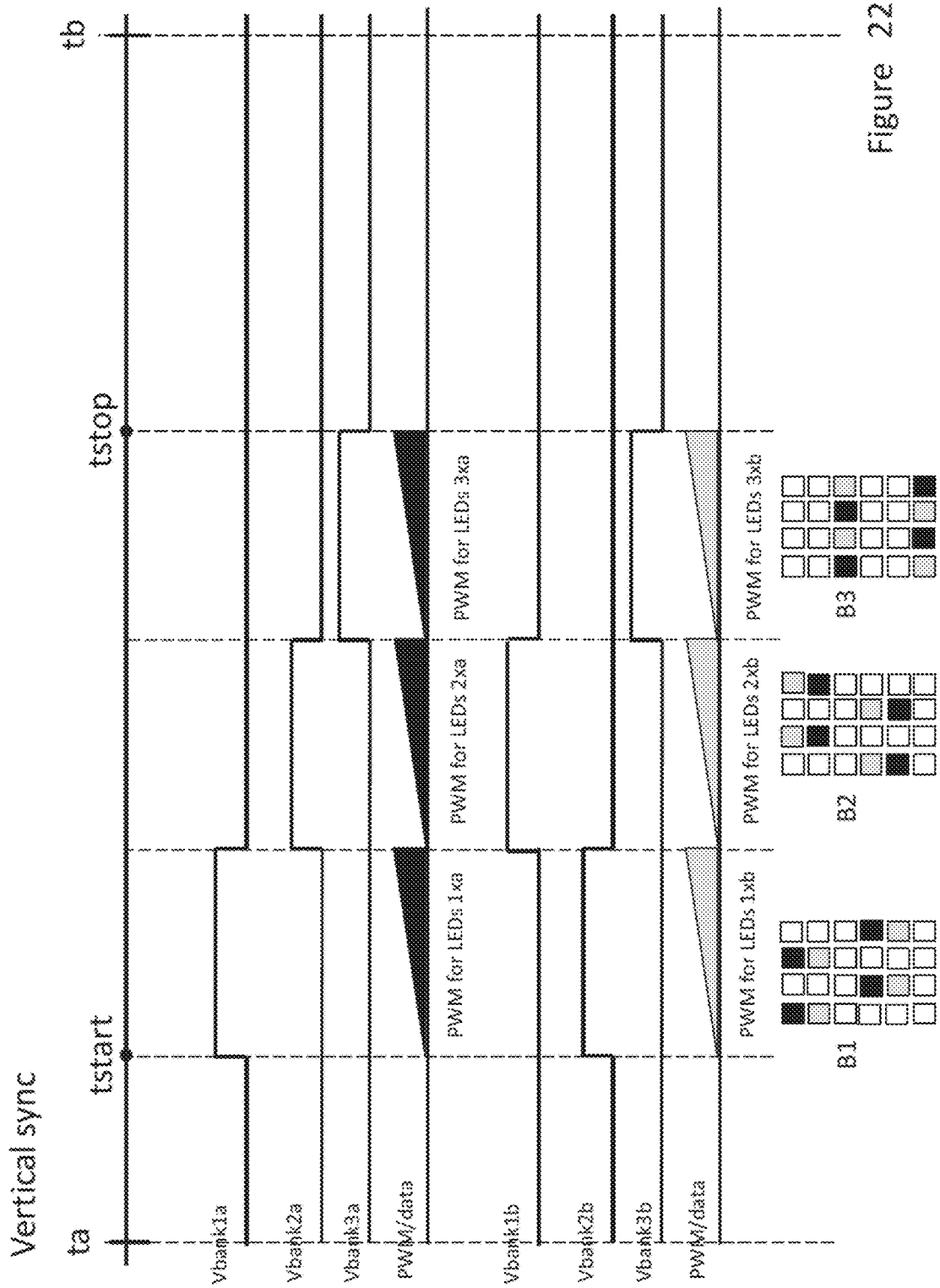
FIG. 22 shows a further embodiment (for reducing banding effect) in the time domain of the drive signals for lighting up the LEDs per row, and PWM generation, including corresponding display output, in accordance with the invention.

FIG. 22 shows a further embodiment (for reducing banding effect) in the time domain of the drive signals for lighting up the LEDs per row, and PWM generation, including corresponding display output (for schematical multiplexing arrangement from FIG. 12(a), or schematic diagram from FIG. 15), in accordance with the invention. FIG. 22 is hence an example of a temporal drive scheme wherein sync-banding is visually reduced. The below picture B1, B2, B3 (cfr. physical layout of the LED board) shows what LEDs light up in the tstart-tstop time period. It is noted that for the physical layout of the LED board, e.g. here again the configuration as depicted in FIG. 12(b) is chosen. Instead of lighting up four LEDs per row, e.g. for row 1 and row 4 in D1 of FIG. 18 (or in S1 of FIG. 20), the four LEDs to be shown are now distributed over two rows, i.e. here (by means of example) row 1 and 2 (instead of only row 1), and row 4 and 5 (instead of only row 4) respectively in B1 of FIG. 22. The same principle is applied in B2, whereas in B3 we have again four LEDs per row, e.g. for row 3 and row 6. In picture B1, B2 always two rows of LEDs light up and overall, on average, the physical 'distance' between rows lighting up is substantially reduced. The line jump between picture B1 and B2 is zero, whereas from picture B2 to B3 this is 1.5. On average, amongst B1-B3, we have 1.5/3=0.5 line jump. Hence, the line jump here is averagely less than one line (which is e.g. the case in FIG. 18 and FIG. 20). Having less line jump may result in reducing banding effects. In FIG. 22, (distributed) LEDs of row 1 and row 2, and of row 4 and row 5, light up in parallel or simultaneously in picture B1, B2 except for B3. Further, it is noted that Vbank1a, 2a timing is different than Vbank1b, 2b timing, i.e. the on-time of Vbank1a is no longer overlapping with the on-time of Vbank1b, whereas the on-time of Vbank2a is no longer overlapping with the on-time of Vbank2b.

Figure 23:
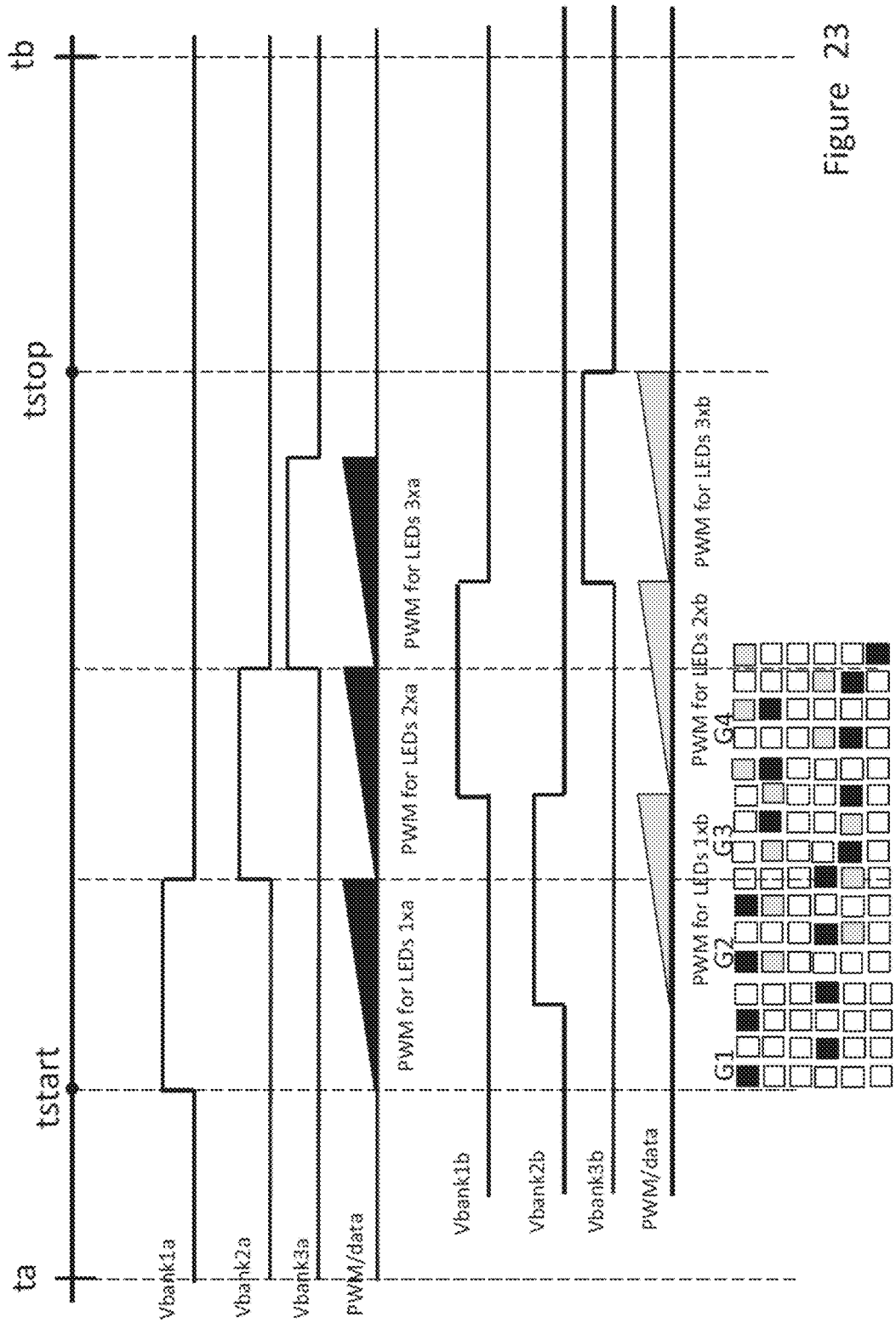
FIG. 23 shows yet further embodiment (for reducing banding effect with time shift) in the time domain of the drive signals for lighting up the LEDs per row, and PWM generation, including corresponding display output, in accordance with the invention.

FIG. 23 shows yet further embodiment (for reducing banding effect with time shift) in the time domain of the drive signals for lighting up the LEDs per row, and PWM generation, including corresponding display output (for schematical multiplexing arrangement from FIG. 12(a), or schematic diagram from FIG. 15), in accordance with the invention. More particularly, FIG. 23 is a variation of the temporal drive scheme wherein sync-banding is visually reduced, wherein timings of Vbank a and Vbank b signals are out of phase, resulting into an 'gradual' shift in light output and even less line jump, because of the gradual distribution of the LEDs light output amongst adjacent or neighboring rows. The below picture G1, G2, G3, G4 (cfr. physical layout of the LED board) shows what LEDs light up for part of the tstart-tstop time period. It is noted that for the physical layout of the LED board, e.g. here again the configuration as depicted in FIG. 12(b) is chosen.

Macroblock with Sync-Banding (in 3D)

Figure 24:
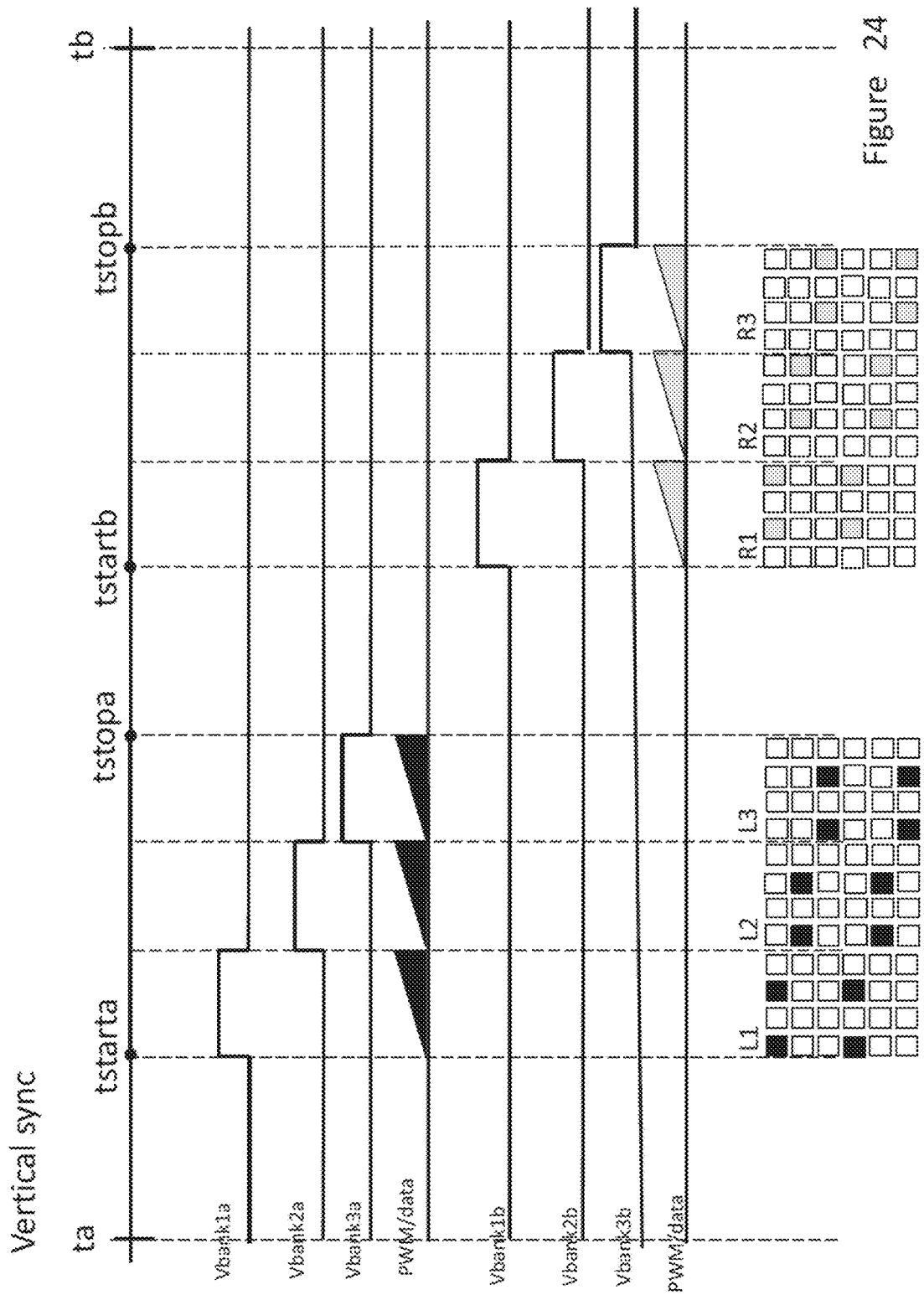
FIG. 24 shows an embodiment (with multiple datastreams for 3D display application) in the time domain of the drive signals for lighting up the LEDs per row, and PWM generation, including corresponding display output, in accordance with the invention.

Starting from the embodiment shown FIG. 20, we split up Vbanka and Vbankb in two separate time periods, i.e. Vbanka with tstarta-tstopa period and Vbankb with tstartb-tstopb period. It is herewith recalled that FIG. 20 corresponds to the logic circuit of FIG. 11 (or FIG. 14). FIG. 24 shows a related sequence wherein e.g. two starts and stops (or two start-stop periods) are used in one Vsync (Vertical sync) period. The basic principle of such sequence (within time domain) has been elaborated extensively in "Studio2" patent application (U.S. patent application Ser. No. 17/865, 096), which is herein incorporated by reference. The sequence as depicted in FIG. 24 can be used e.g. for active 3D application, wherein the 'black' or 'a' representation for PWM and the lit op LEDs in picture below L1, L2, L3 (cfr. physical layout of the LED board) is related to the light output (and image eventually) intended for the left eye. It is noted that for the physical layout of the LED board, here the configuration as depicted in FIG. 17 is chosen. The datastream of Vbanka is entirely overlapping or within tstarta-tstopa period during which the light output is given for the left eye. The 'gray' or 'b' representation for PWM and the lit op LEDs in picture below R1, R2, R3 (cfr. physical layout of the LED board) is related to the light output (and image eventually) intended for the right eye. The datastream of Vbankb is entirely overlapping or within tstartb-tstopb period during which the light output is given for the right eye.

Figure 25:
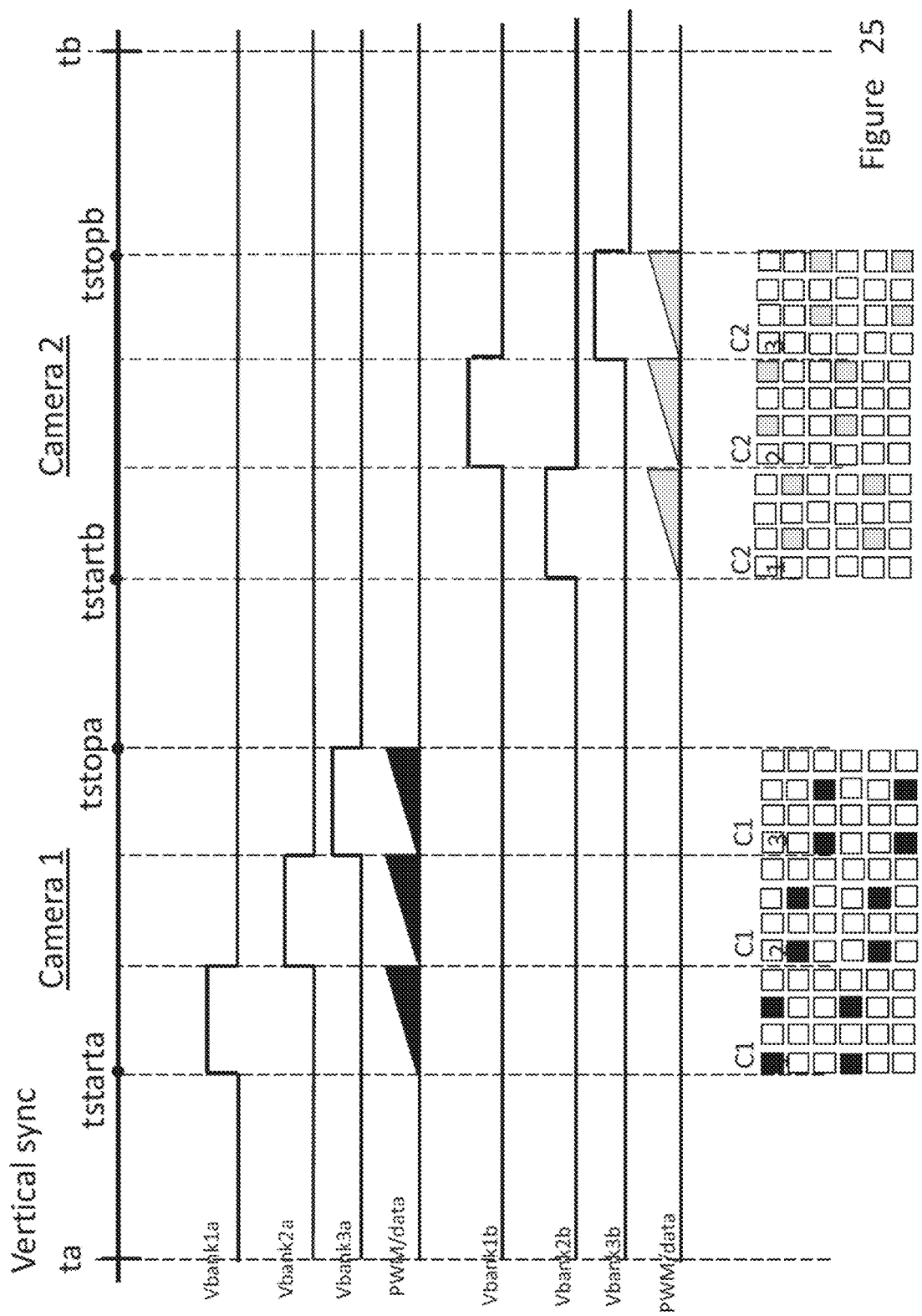
FIG. 25 shows an embodiment (with multiple datastreams for multiple cameras) in the time domain of the drive signals for lighting up the LEDs per row, and PWM generation, including corresponding display output, in accordance with the invention.

Such type of sequence can also be used for showing images (on a display) to be recorded by one or more cameras, each having an active shutter opening time (which can be different for a few or for all cameras). A variation of the sequence on timing, while referring to the camera example from above, is illustrated in FIG. 25. A first camera with a first active shutter opening time will see and record images during tstarta-tstopa period, whereas a second camera with a second active shutter opening time will see and record images during tstartb-tstopb period. The datastream of Vbanka is entirely overlapping or within shutter opening time of the first camera, i.e. tstarta-tstopa period. The below picture C11, C12, C13 (cfr. physical layout of the LED board) shows what LEDs light up and are seen on the first camera for the tstarta-tstopa time period. It is noted that for the physical layout of the LED board, here again the configuration as depicted in FIG. 17 is chosen. The datastream of Vbankb is entirely overlapping or within shutter opening time of the second camera, i.e. tstartb-tstopb period. The below picture C21, C22, C23 (cfr. physical layout of the LED board) shows what LEDs light up and are seen on the second camera for the tstartb-tstopb time period. According to an embodiment, the human eye sees what both cameras can see, or even the human may see everything on the timeline (also outside the camera shutter opening time of both cameras).

Figure 26:
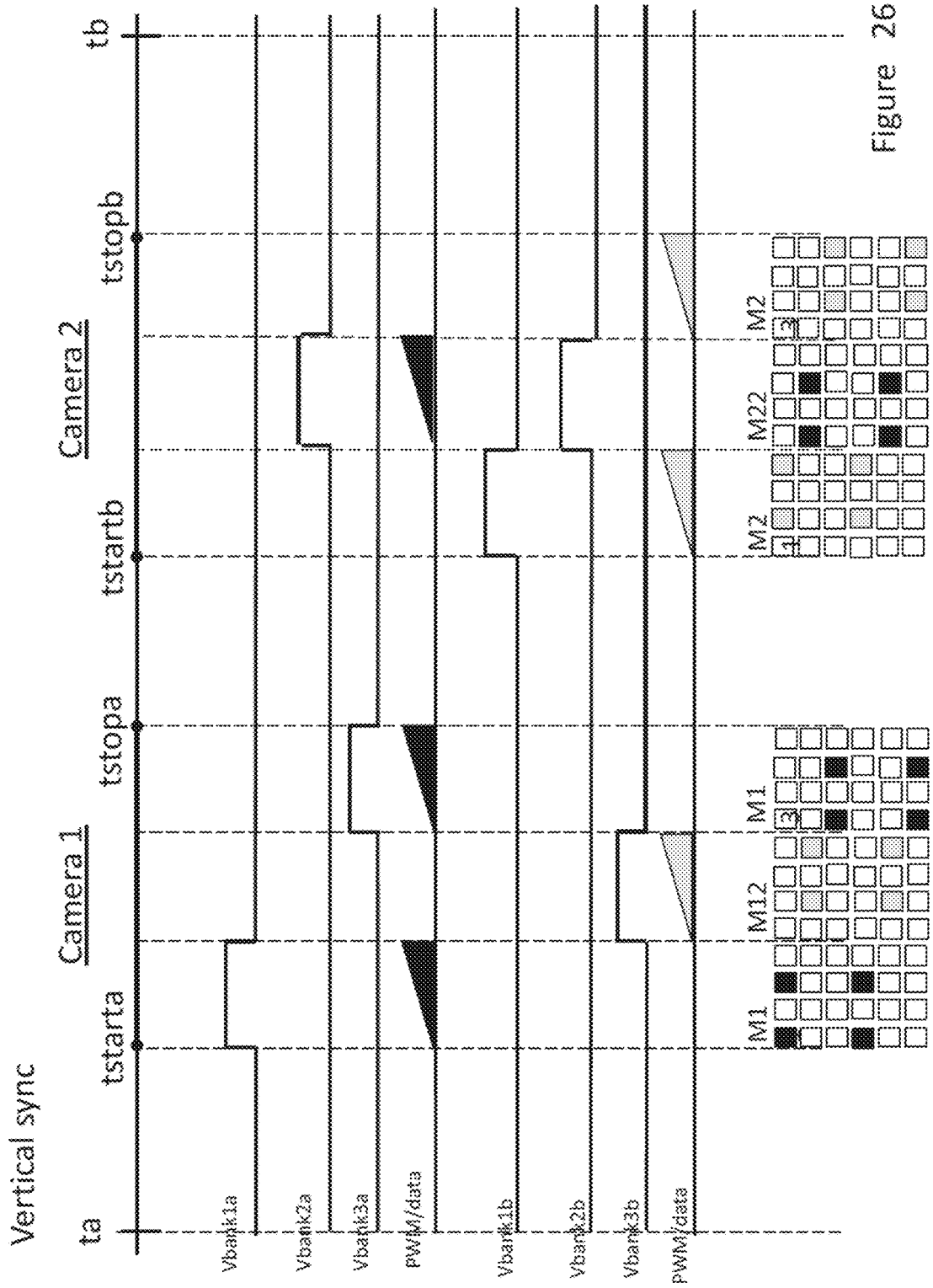
FIG. 26 shows another embodiment (with multiple datastreams for multiple cameras) in the time domain of the drive signals for lighting up the LEDs per row, and PWM generation, including corresponding display output, in accordance with the invention.
Figure 27:
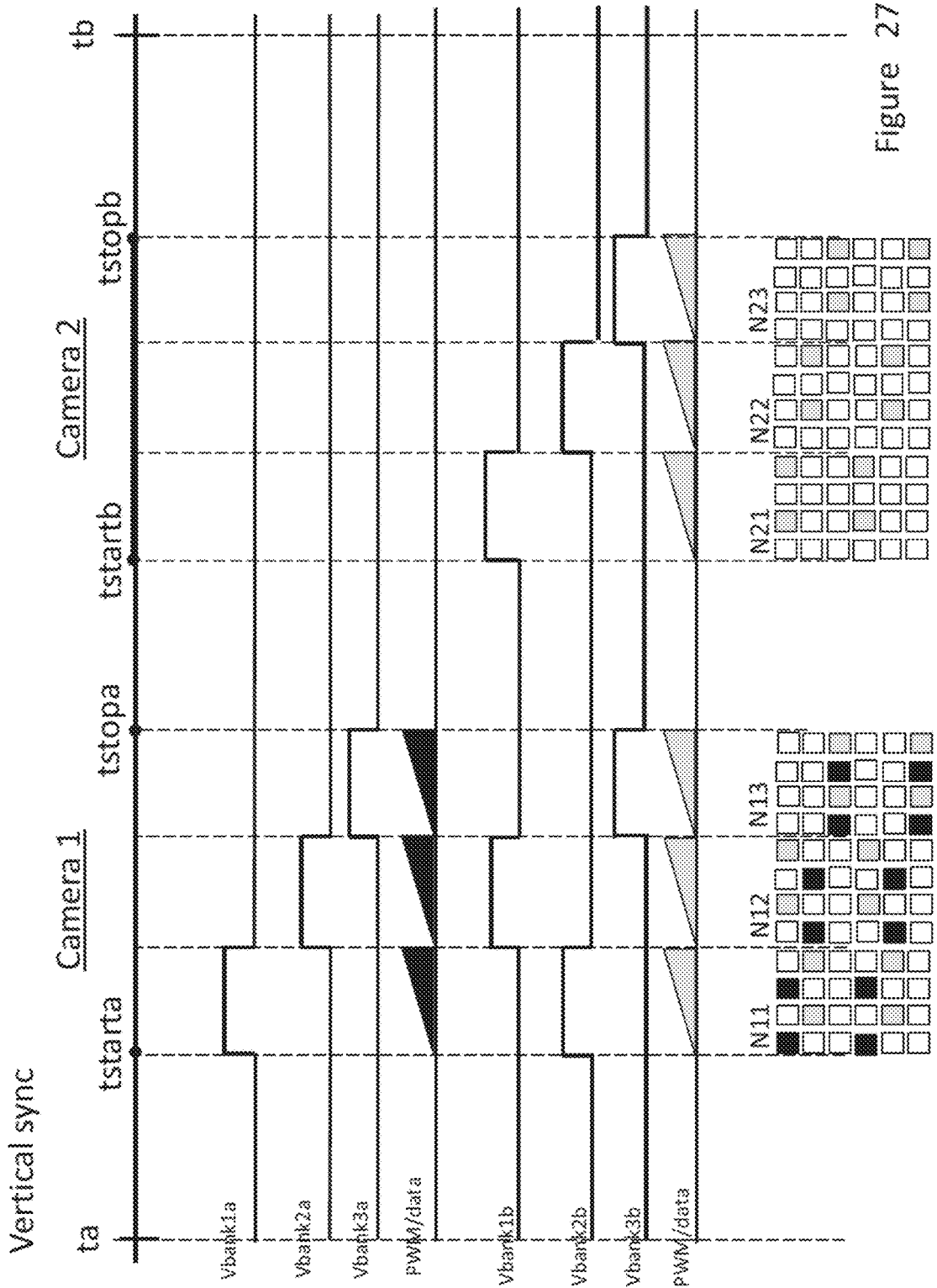
FIG. 27 shows yet another embodiment (with multiple datastreams for multiple cameras) in the time domain of the drive signals for lighting up the LEDs per row, and PWM generation, including corresponding display output, in accordance with the invention.

Yet another variation of the sequence on timing is shown in FIG. 26. This is an example wherein we have again a first camera with a first active shutter opening time, seeing and recording images during tstarta-tstopa period, and a second camera with a second active shutter opening time, seeing and recording images during tstartb-tstopb period. During both first and second camera shutter opening time, a mix of datastreams of Vbanka and Vbankb is seen, while the resulting light output seen for both cameras can be quite different (due to difference in PWM driving), as becomes clear when comparing below pictures M11, M12, M13 (cfr. physical layout of the LED board) for first camera with below pictures M21, M22, M23 (cfr. physical layout of the LED board) for second camera. It is noted that for the physical layout of the LED board, here again the configuration as depicted in FIG. 17 is chosen. A further variation related to mixed datastreams is illustrated in FIG. 27. With the two datastreams of Vbanka and Vbankb being visible for a first camera seeing and recording images during tstarta-tstopa period, the effect of sync-banding can be reduced. Recall for example the discussion of FIG. 22, wherein reduced banding effect was yet explained, (as here) based on the limited line jump. Possibly the mix of datastreams of Vbanka and Vbankb can also be applied to compensate for calibration. For example, the datastream of Vbankb has been set to a particular calibration, whereas the datastream of Vbanka can be used for compensating for this particular calibration to get light output right for the first camera. An alternative example for time dependent calibration is herewith presented, having the advantage that light output is substantially more as captured by the first camera (because of the two datastreams, leading to double light output of the LEDs). The second camera only will see half the amount of LEDs light output, as becomes clear when comparing below pictures N11, N12, N13 (cfr. physical layout of the LED board) for first camera with below pictures N21, N22, N23 (cfr. physical layout of the LED board) for second camera. According to an alternative embodiment, the first camera could be replaced by the human eye, leaving us in the situation wherein only one camera is used for recording (the datastream of Vbankb).

Figure 28A:
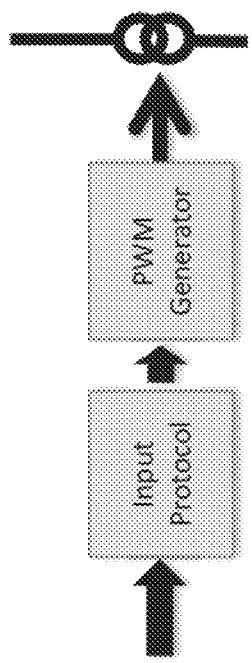
FIG. 28(a) illustrates an overall principal scheme of an oversimplified block diagram applicable for all existing (integrated or not) LED drivers.

FIG. 28(a) illustrates an embodiment and hence overall principal scheme of an oversimplified block diagram that may be applied to all existing (integrated or not) LED drivers. Herewith, an example is shown of a constant current driver with PWM generation. Oversimplified, the block diagrams are similar to all existing (integrated or not) LED drivers. The input protocol is directed to the PWM generator, which is driving the LED.

In earlier patent application, U.S. patent application Ser. No. 17/981,898, filed at the USPTO on Nov. 7, 2022 (which is referred to herein as the "Subdelta" application), which claims the benefit of priority to U.S. Provisional Patent Application 63/317,178, both of which are incorporated herein by reference, from the same Applicant, a system is described for a light-emitting display, in particular for driving light-emitting elements or pixels thereof, comprising an input protocol for receiving input and a PWM generating module for transferring the input into signals to be delivered to pixel drivers, herewith defining and controlling the light-emitting elements or pixels in the output to be emitted by them. In particular, the system comprises a module for determining and implementing non-linear display pixel driver compensation performed by a processing system of the display having one or more colors and comprising pixels being controlled by pixel drivers. Such a module is also referred to herein as the subdelta module or part.

Figure 28B:
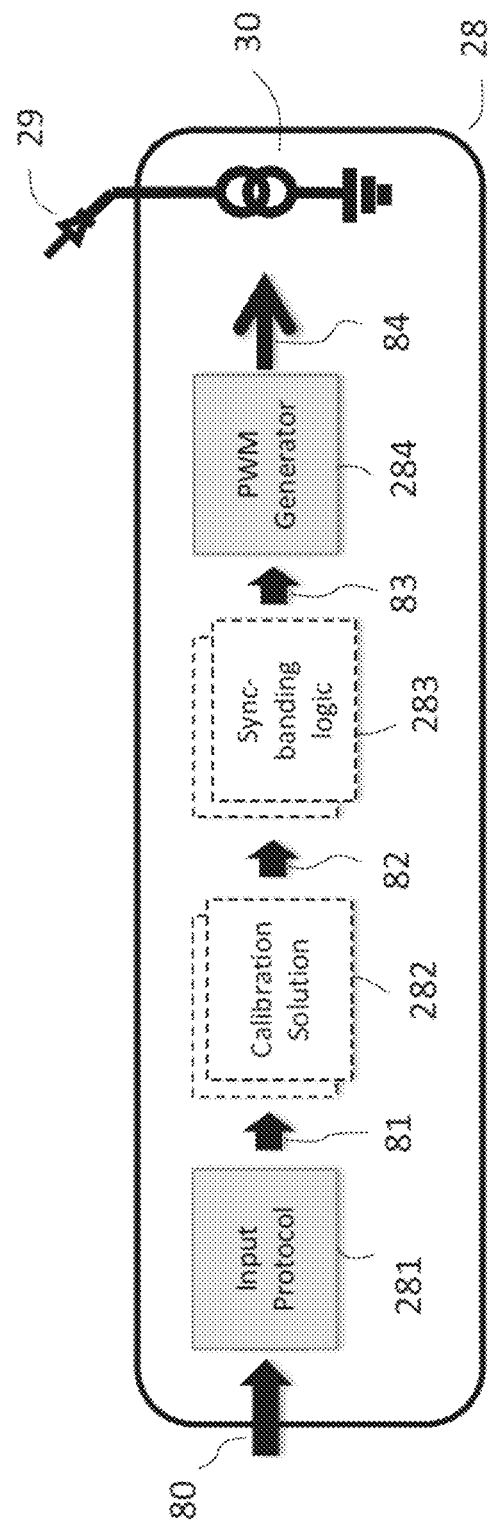
FIG. 28(b) illustrates an embodiment of a block diagram for a pixel driver, in accordance with the invention.

By analogy with the subdelta part, described in the same Applicant's "Subdelta" patent application (U.S. patent application Ser. No. 17/981,898), it is noted that the sync-banding logic (i.e. programmable start and programmable stop) can be part of the driver as well. FIG. 28(b) illustrates an embodiment of a block diagram for a pixel driver, comprising the sync-banding logic in accordance with the invention. Hence, it is part of the present disclosure to add functionality blocks in the 'constant current driver' chipsets with or without integrated LEDs, as illustrated in FIG. 28(b), showing again the overall principal scheme of FIG. 28(a) but now having also additional blocks (with dashed canvas) provided. A schematic embodiment is shown of the system 28 for a light-emitting display, in particular for driving light-emitting elements or pixels 29 thereof, with sync-banding logic. The system 28 comprises an input protocol 281 for receiving (video) input (to be displayed) and a PWM generating module 284 for transferring said input into signals to be delivered to pixel drivers 30, herewith defining and controlling the light-emitting elements or pixels 29 in the (light) output to be emitted by them (and displayed in the form of video). The system 28 also comprises an additional module 283 for determining and/or implementing sync-banding logic (due to banding effect as perceived by a camera and/or the human eye looking at the display). The system 28 may further comprise a module 282 for performing calibration (in advance) and herewith determining calibration matrices to be used in defining the eventual output to be emitted by the light-emitting elements or pixels 29.

Further referring to FIG. 28(b), at the input of the system 28, video input is received 80 and entered via the input protocol 281, from which e.g. RGB data (16-bit) is delivered 81. This RGB data can then be calibrated via the module 282, out of which calibrated RGB data is now outputted 82. The calibrated RGB data can then be used as input for the sync-banding logic 283, out of which data for reduced banding effect is coming 83. The calibrated data for reduced banding effect can now be directed to the PWM generator 284, for generating and delivering 84 appropriate PWM signals via the pixel drivers 30 towards the LEDs or pixels 29 and herewith controlling them (by means of putting them in) on or off (state).

For the additional blocks 282, 283, it may be (as shown here) that multiple layers (or versions or phases) for the calibration 282 and for the sync-banding logic 283 respectively are foreseen. Possibly such multiple layers need to be provided because of multiple colors and/or multiple types of LEDs for the calibration and/or the sync-banding logic has to be performed. It is noted that for each kind or set of colors, multiple instances can be added dependent on the complexity to solve.

In the above description, various embodiments are described based on or including LEDs or LED displays. However, the concepts described here are equally applicable to other forms of light-emitting diodes (LEEs) or other light-emitting devices, where applicable or possible, including, but not limited to, Liquid Crystal Displays (LCDs) implement an array of pixels like that of an LED display, Active Matrix Organic Light Emitting Diode (AMOLED) displays, Organic Light Emitting Diode (OLED) displays, Full-array LED displays, Mini-LED displays, Micro-LED displays, Quantum LED (QLED) displays, Quantum Dot-OLED (QD-OLED) displays, etc.

Combinability of Embodiments and Features

This disclosure provides various examples, embodiments, and features which improve a visual performance of a display and/or a camera recording an image from the display. Unless expressly stated, or unless such examples, embodiments, and features would be mutually exclusive, the various examples, embodiments, and features disclosed herein should be understood to be combinable with other examples, embodiments, or features described herein.

In addition to the above, further embodiments and examples include the following enumerated embodiments of displays and methods, including a first group of enumerated embodiments of displays with acoustic and/or light trap, and a second group of enumerated embodiments of displays and methods with stacked pixels, a third group of enumerated embodiments of displays and methods with macroblock with sync-banding (in 3D), and a fourth group of enumerated embodiments of displays and methods with multiplexing and staggered multiplexing. It is noted that the listed embodiments and examples of each of the four groups below can be combined with other listed embodiments and examples of the embodiments and examples of any, all, or a combination of the any or all the other groups.

Enumerated Embodiments of Displays with Acoustic and/or Light Trap

A first group of embodiments of acoustic and/or light trap for a display and methods, are enumerated and described below.

1. A display, comprising: a plurality of light-emitting elements (LEEs), an electronical interface including electrical connections that electrically connect a LEE drive circuit to the plurality of LEEs the electrical connections providing control signals the plurality of LEEs, wherein said display further comprises molding in between and/or on top of the LEEs, and wherein said molding comprises one or more notches between the LEEs or notches in areas where none of the LEEs are present.

2. The display according to any one or a combination of one or more of 1 above and 3-8 below, wherein said notches are characterized by removal of parts of the molding, defined as intermittent parts in areas where none of the LEEs are present.

3. The display according to any one or a combination of one or more of 1-2 above and 4-8 below, wherein the intermittent parts are randomly chosen.

4. The display according to any one or a combination of one or more of 1-3 above and 5-8 below, wherein the plurality of LEEs is arranged in an array, and the pattern of the array is rectangular.

5. The display according to any one or a combination of one or more of 1-4 above and 6-8 below, wherein the intermittent parts removed have regular or irregular shape.

6. The display according to any one or a combination of one or more of 1-5 above and 7-8 below, wherein the intermittent parts have a rectangular, triangular, circular or random cross section.

7. The display according to any one or a combination of one or more of 1-6 above and 8 below, further comprising a non-volatile memory.

8. The display according to any one or a combination of one or more of 1-7 above, wherein said LEEs are light-emitting diodes (LEDs), and hence the display being a LED display.

9. A method for enhancing the visual performance of a LED display module comprising a plurality of LEEs and electrical connections that electrically connect a LEE drive circuit to the plurality of LEEs, and further comprising molding in between and/or on top of the LEEs, the method comprising: (i) selecting in the molding areas between the LEEs or where none of the LEEs are present, and (ii) forming notches by in the molding by removing at least part of the molding in said areas, determined as intermittent parts.

10. The method according to 9 above, wherein said removing of intermittent parts includes carving or etching techniques.

11. A method for enhancing the acoustic and/or visual performance in a studio environment comprising at least one display in accordance with one or more of 1-8 above and at least one camera for at least in part recording what is displayed on said at least one display.

12. The method according to 11 above for enhancing visual performance being defined by minimizing light reflections in the studio environment, enabled by the notches of said at least one display absorbing light.

13. The method according to 11 above for enhancing acoustic performance being defined by minimizing audio waves reflections in the studio environment, enabled by the notches of said at least one display absorbing sound waves.

14. A method for manufacturing a display having improved visual performance, the method comprising: (i) providing said display comprising a plurality of LEEs, a LEE drive circuit and electronics, and molding in between and on top of the LEEs, (ii) selecting in the molding areas where none of the LEEs are present, and (iii) removing at least part of the molding in said areas, determined as intermittent parts.

15. The method according to 14 above, wherein said removing of intermittent parts is characterized by carving or etching techniques.

16. A method for using one or more displays in accordance with one or more of 1-8 above, being part of a studio environment comprising one or more cameras at least in part surveying what is displayed on said one or more displays.

17. The display according to any one or a combination of one or more of 1-8 above, further comprising a light and/or acoustic absorbing material provided within 18. A display, comprising: a plurality of light-emitting elements (LEEs), an electronical interface including electrical connections that electrically connect a LEE drive circuit to the plurality of LEEs the electrical connections providing control signals the plurality of LEEs, wherein said display further comprises molding in between and/or on top of the LEEs, and wherein said display further comprises light and/or an acoustic absorbing structures including light and/or an acoustic absorbing material provided on a surface of the molding.

19. The display according to any one or a combination of one or more of 18 above and 20-24 below, wherein said light and/or an acoustic absorbing material is applied directly to a top surface of the molding or is held to the top surface of the molding by an adhesive.

20. The display according to any one or a combination of one or more of 18-19 above and 21-24 below, wherein the plurality of LEEs is arranged in an array, and the pattern of the array is rectangular.

21. The display according to any one or a combination of one or more of 18-20 above and 22-24 below, wherein the light and/or acoustic absorbing material is provided having a regular or irregular shape.

22. The display according to any one or a combination of one or more of 18-21 above and 23-24 below, wherein the light and/or acoustic absorbing material is provided having a rectangular, triangular, circular or random cross section.

23. The display according to any one or a combination of one or more of 18-22 above and 24 below, further comprising a non-volatile memory.

24. The display according to any one or a combination of one or more of 18-23 above, wherein said LEEs are light-emitting diodes (LEDs), and hence the display being a LED display.

25. A method for enhancing the visual performance of a LED display module comprising a plurality of LEEs and electrical connections that electrically connect a LEE drive circuit to the plurality of LEEs, and further comprising molding in between and/or on top of the LEEs, the method comprising: (i) selecting in the molding areas between the LEEs or where none of the LEEs are present, and (ii) forming light and/or acoustic absorbing structures notches by light and/or an acoustic absorbing material provided on a surface of the molding in said areas.

26. A method for manufacturing a display having improved visual performance, the method comprising: (i) providing said display comprising a plurality of LEEs and electrical connections that electrically connect a LEE drive circuit to the plurality of LEEs, and further comprising molding in between and/or on top of the LEEs, the method comprising: (ii) selecting in the molding areas between the LEEs or where none of the LEEs are present, and (iii) forming light and/or acoustic absorbing structures notches by light and/or an acoustic absorbing material provided on a surface of the molding in said areas.

27. A method for using one or more displays in accordance with one or more of 1-8 above, being part of a studio environment comprising one or more cameras at least in part surveying what is displayed on said one or more displays.

Enumerated Embodiments of Displays and Methods with Stacked Pixels

A second group of embodiments of stacked LED dies for a display and methods are enumerated and described below.

1. A light-emitting diode (LED) display, comprising: a plurality of LEDs, wherein each of the LEDs comprises a plurality of LED dies, wherein the LED dies for each LED are configured in that they are stacked on top of each other.

2. The LED display according to any one or a combination of one or more of 1 above and 3-15 below, an electronical interface defined by a LED drive circuit having electrical connections that electrically connect to the LEDs, and electronics to light up the LEDs, and being controlled by signals via the electronical interface, 3. The LED display according to any one or a combination of one or more of 1-2 above and 4-15 below, wherein each of the LEDs comprises at least three color LED dies.

4. The LED display according to any or a combination of one or more of 1-2 above and 4-15 below, wherein, depending on the LED die fabrication, the LED dies are stacked according to a preferred or predetermined order.

5. The LED display according to any one or a combination of one or more of 1-4 above and 6-15 below, wherein, the LED die fabrication being defined by a level of transparency, the LED dies are stacked such that the LED die with highest level of transparency is on top of the stack.

6. The LED display according to any one or a combination of one or more of the 1-5 above and 7-15 below, wherein each of the LED dies is defined by a die size.

7. The LED display according to any one or a combination of one or more of the 1-6 above and 8-15 below, wherein each of the LED dies is defined by a die color.

8. The LED display according to any one or a combination of one or more of the 1-7 above and 9-15 below, wherein each of the LED dies are defined by a die size and a die color.

9. The LED display according to any one or a combination of one or more of the 1-8 above and 10-15 below, wherein two or more of the LED dies are different die size.

10. The LED display according to any one or a combination of one or more of the 1-9 above and 1-15 below, wherein two or more of the LED dies are different in die color.

11. The LED display according to any one or a combination of one or more of the 1-10 above and 12-15 below, wherein two or more of the LED dies are different in die size and die color.

12. The LED display according to any one or a combination of one or more of the 1-11 above and 13-15 below, wherein the die size of one or more of the LED dies is optimized in efficiency towards a predetermined color temperature.

13. The LED display according to any one or a combination of one or more of the items 1-12 above and 14-15 below, wherein said LED display comprises molding in between the LEDs.

14. The LED display according to any one or a combination of one or more of the 1-13 above and 15 below, further comprising a lenticular lens array applied in front of the LEDs.

15. The LED display according to any one or a combination of one or more of the 1-14 above, further comprising a non-volatile memory. 16. A method for increasing the light output of a LED display and/or reducing viewing angle differences in accordance with any one or a combination of one or more of the 1-15 above, wherein each of the LED dies is defined by a die size, the method comprising: (i) selecting one or more of the LED dies having maximum light output, (ii) increasing the die size of said one or more LED dies, herewith decreasing their maximum light output to a lower value, and (iii) tuning said lower value of said one or more LED dies again to a new maximum light output by the LED drive circuit.

17. A light-emitting element (LEE) display, comprising: a plurality of LEEs, wherein each of the LEEs comprises a plurality of LEE subunits, wherein the LEE subunits for each LEE are configured in that they are stacked on top of each other.

18. A method for increasing the light output of a LEE display and/or reducing viewing angle differences in accordance with 17 above, wherein each of the LEE subunits is defined by an area size, the method comprising: (i) selecting one or more of the LEE subunits having maximum light output, (ii) increasing the die size of said one or more LEE subunits, herewith decreasing their maximum light output to a lower value, and (iii) tuning said lower value of said one or more LED dies again to a new maximum light output by the LED drive circuit.

19. A method for manufacturing a LED display in accordance with any one or a combination of one or more of the 1-15 above, having increased light output and/or reduced viewing angle differences, wherein each of the LED dies is defined by a die size, the method comprising: (i) selecting one or more of the LED dies having maximum light output, (ii) increasing the die size of said one or more LED dies, herewith decreasing their maximum light output to a lower value, and (iii) tuning said lower value of said one or more LED dies again to a new maximum light output by the LED drive circuit.

Enumerated Embodiments of Displays and Methods with Macroblock with Sync-Banding (in 3D)

A third group of embodiments of macroblock sync-banding for a display configured to be imaged with a camera and methods are enumerated and described by items 1-4 below.

1. A system (28) for a light-emitting display, in particular for driving light-emitting elements or pixels (29) thereof, the system comprising an input protocol (281) for receiving input and a PWM generating module (284) for transferring said input into signals to be delivered to pixel drivers (30), herewith defining and controlling the light-emitting elements or pixels (29) in the output to be emitted by them, wherein the system (28) comprises a module (283) for improved interplay of the display with a camera recording an image that is displayed by the display, based on a light source input signal received by the display, receiving one or more values representing a programmable off-set relative to the operation of the camera having a shutter and corresponding shutter time, and applying the light source input signal to the display, based on the one or more programmable off-set values.

2. The display according to any one or a combination of one or more of 1 above and 3-9 below, wherein said programmable off-set is selected to improve said interplay of the display with said camera, in particular by reducing banding effects on said camera.

3. The display according to any one or a combination of 1-2 above and 4-9 below, wherein a logic for start and stop PWM generation is included.

4. The system (28) according any one or a combination of 1-3 above and 5-9 below, further comprising a module (282) for performing calibration and herewith determining calibration matrices to be used in defining the output to be emitted by the light-emitting elements or pixels (29).

5. The system (28) according to any one or a combination of 1-4 above and 6-9 below, further comprising memory to store said start and stop logic.

6. The system (28) according to any one or a combination of 1-5 above and 7-9 below, further comprising a processor configured to receive said input, generate and transfer said input into signals to be delivered to the pixel drivers, and perform said defining and controlling the light-emitting elements or pixels (29), and said applying the light source input signal to the display, based on instructions stored in a memory storage of the system.

7. The system (28) according to any one or a combination of 1-6 above and 8-9 below, wherein said modules are implemented on a processor of the system (28), based on instructions stored in a memory storage of the system.

8. The system (28) according to any one or a combination of 1-7 above and 9 below, wherein said input protocol (281) is a hardware input device.

9. The system according to any one or a combination of 1-8 above, further comprising a sync-banding module (283) or logic, that receives the output from the module (282) and applies reduced banding effect, which is output to the PWM generator (284).

10. A studio system comprising the system according to any one or a combination of one or more of 1-9 above, the display configured to be driven by the system, and the camera recording the image that is displayed by the display.

11. A method for driving light-emitting elements or pixels (29) of a light-emitting display thereof, the system comprising an input protocol (281) for receiving input and a PWM generating module (284) for transferring said input into signals to be delivered to pixel drivers (30), and wherein the system (28) comprises a module (283) for improved interplay of the display with a camera recording an image that is displayed by the display, the method comprising: defining and controlling the light-emitting elements or pixels (29) in the output to be emitted by them, based on a light source input signal received by the display, receiving one or more values representing a programmable off-set relative to the operation of the camera having a shutter and corresponding shutter time; and applying the light source input signal to the display, based on the one or more programmable off-set values.

12. The method according to any one or a combination of one or more of 11 above and 13-19 below, wherein said programmable off-set is selected to improve said interplay of the display with said camera, in particular by reducing banding effects on said camera.

13. The method according to any one or a combination of 1-12 above and 14-19 below, wherein a logic for start and stop PWM generation is included.

14. The method according any one or a combination of 11-13 above and 15-19 below, further comprising a module (282) performing calibration and herewith determining calibration matrices to be used in defining the output to be emitted by the light-emitting elements or pixels (29).

15. The method according to any one or a combination of 11-14 above and 16-19 below, further comprising storing in a memory said start and stop logic.

16. The method according to any one or a combination of 11-15 above and 17-19 below, wherein a processor that receives said input, generate and transfer said input into signals to be delivered to the pixel drivers, and performs said defining and controlling the light-emitting elements or pixels (29), and said applying the light source input signal to the display, based on instructions stored in a memory storage of the system.

17. The method according to any one or a combination of 11-16 above and 18-19 below, wherein said modules are implemented on a processor of the system (28), based on instructions stored in a memory storage of the system.

18. The method according to any one or a combination of 11-17 above and 19 below, wherein said input protocol (281) is a hardware input device.

19. The method according to any one or a combination of 1-8 above, further comprising a sync-banding module (283) or logic, that receives the output from the module (282) and applies reduced banding effect, which is output to the PWM generator (284).

One or more computer-readable mediums have instructions stored thereon, which, when executed by one or more processors of a system for driving light-emitting elements or pixels, causes the one or more processors to perform the method according to one or a combination of 1 to 19 above.

Enumerated Embodiments of Displays and Methods with Multiplexing and Staggered Multiplexing A fourth group of embodiments of Multiplexing and staggered multiplexing for a display and methods, are enumerated and described below.

1. A display comprising: a plurality of light-emitting elements (LEEs), each of the plurality of LEEs having a first connection point and a second connection point, each of the plurality of LEEs being connected at their first connection point to first lines and at their second connection point to second lines; at least two drive circuits, each of the drive circuits having electrical connections defined by rows and columns that electrically connect to the LEEs, each of the drive circuits being configured as a drive device, wherein each of said first lines is arranged to be connected to a current source, and wherein each of said second lines is arranged to be connected to a power supply, wherein each of the power supply drives one of the rows of the corresponding drive circuits, wherein each said current source drives one of the columns of the corresponding drive circuits, wherein per each of the respective drive circuits said current sources together are a constant current driver, wherein the at least two drive circuits include a first drive circuit having a first constant current driver, and a second drive circuit having a second constant current driver, and wherein at least one of the plurality of LEEs driven by the first constant current driver of the first drive circuit is residing physically within the second drive circuit, or at least one of the plurality of LEEs driven by the second constant current driver of the second drive circuit is residing physically within the first drive circuit.

2. The display according to any one or a combination of one or more of 1 above and 3-20 below, wherein said first connection point and said second connection point of each of said plurality of LEEs are respectively an anode and a cathode or are respectively a cathode and an anode, wherein said first lines and said second lines are respectively anode lines and cathode lines or are respectively anode lines and cathode lines.

3. The display according to any one or a combination of one or more of 1-2 above and 4-20 below, wherein the LEEs are arranged in a common anode configuration, wherein each of said drive circuits are configured as a common anode drive device, wherein said first lines are cathode lines connected to a cathode of each of said LEEs and said second lines are anode lines connected to an anode of each of said LEEs.

4. The display according to any one or a combination of one or more of 1-3 above and 5-20 below, wherein the LEEs are arranged in a common cathode configuration wherein each of said drive circuits are configured as a common cathode drive device, wherein said first lines are anode lines connected to an anode of each of said LEEs and said second lines are cathode lines connected to a cathode of each of said LEEs.

5. The display according to any one or a combination of one or more of 1-4 above and 6-20 below, wherein a respective first switch is provided to arrange each of said first lines to be connected to the current source, and a respective second switch is provided to arrange each of said second lines to be connected to the power supply.

6. The display according to any one or a combination of one or more of 1-5 above and 7-20 below, further comprising logic to generate separate data and separate logic received by the constant current drivers to drive the drive circuits.

7. The display according to any one or a combination of one or more of 1-6 above and 8-20 below, further comprising improved interplay of the display with a camera recording an image that is displayed by the display, based on a light source input signal received by the display, receiving one or more values representing a programmable off-set relative to the operation of the camera having a shutter and corresponding shutter time, and by applying the light source input signal to the display, based on the one or more programmable off-set values.

8. The display according to any one or a combination of one or more of 1-7 above and 9-20 below, wherein said programmable off-set being selected to improve said interplay of the display with said camera, in particular to reduce banding effects on said camera.

9. The display according to any one or a combination of one or more of 1-8 above and 10-20 below, wherein said plurality of LEEs are arranged in a matrix such that said LEEs are intermittently equally spaced in said at least two drive circuits.

10. The display according to any one or a combination of one or more of 1-9 above and 11-20 below, wherein said LEEs are light-emitting diodes (LEDs).

11. The display according to any one or a combination of one or more of 1-10 above and 12-20 below, further comprising one or more pulse-width modulation (PWM) drivers connected to the LEEs for controlling the power applied thereto, wherein pulse-width modulation (PWM) is generated at least two times during a programmable period such that bit depth of the display is improved.

12. The display according to any one or a combination of one or more of 1-11 above and 13-20 below, wherein the at least two drive circuits are each driven by corresponding constant current drivers receiving separate data and are part of a 3D display application, wherein the first drive circuit is configured to generate light output meant for a left eye, and the second drive circuit is configured to generate light output meant for a right eye.

13. The display according to any one or a combination of one or more of 1-12 above and 14-20 below, further comprising polarizers provided in front of the LEEs.

14. The display according to any one or a combination of one or more of 1-13 above and 15-20 below, further comprising a lenticular lens or lenticular lens array provided in front of LEEs.

15. The display according to any one or a combination of one or more of 1-14 above and 16-20 below, further comprising multiple blocks of LEEs with corresponding drive circuits and corresponding lenticular lenses or lenticular lens arrays, wherein each of the multiple blocks of LEEs is defined with a different point of view.

16. The display according to any one or a combination of one or more of 1-15 above and 17-20 below, wherein said display is configured to receive at least two different video streams including a first video stream for the first drive circuit and a second video stream for the second drive circuit.

17. The display according to any one or a combination of one or more of 1-16 above and 18-20 below, further comprising a processing system, wherein the processing system is configured to perform calibration over time, wherein the display is part of a studio environment comprising one or more cameras recording an image that is displayed by the display, said one or more cameras comprising each a shutter having a shutter opening time.

18. The display according to any one or a combination of one or more of 1-17 above and 19-20 below, further comprising a processing system, wherein the processing system is configured to perform calibration in relation to color points for a viewing angle of one or more cameras, wherein the display is part of a studio environment comprising said one or more cameras recording an image that is displayed by the display, said calibration being dependent on said viewing angle of said one or more cameras.

19. The display according to any one or a combination of one or more of 1-18 above and 20 below, wherein the power supply is a positive power supply and wherein each of said second lines is arranged to be connected to the positive power supply.

20. The display according to any one or a combination of one or more of 1-19 above, wherein each of the plurality of LEEs has the first connection point at a first side of the LEE and the second connection point at a second side of the LEE, and each of the plurality of LEEs is connected at their first side to the first lines and at their second side to the second lines.

21. A method of displaying an image, the method comprising: providing the display according to any one or a combination of one or more of 1-20 above; providing a current source; and providing the power supply.

22. A method of producing a display, the method comprising: forming a plurality of light-emitting elements (LEEs), each of the plurality of LEEs having a first connection point and a second connection point, each of the plurality of LEEs being connected at their first connection point to first lines and at their second connection point to second lines; providing at least two drive circuits, each of the drive circuits having electrical connections defined by rows and columns that electrically connect to the LEEs, each of the drive circuits being configured as a drive device, wherein each of said first lines is arranged to be connected to a current source, wherein each of said second lines is arranged to be connected to a power supply, wherein each of said power supply drives one of the rows of the corresponding drive circuits, wherein each said current source drives one of the columns of the corresponding drive circuits, wherein per each of the respective drive circuits said current sources together are a constant current driver; providing the at least two drive circuits to include a first drive circuit having a first constant current driver, and a second drive circuit having a second constant current driver; and arranging at least one of the plurality of LEEs driven by the first constant current driver of the first drive circuit to reside physically within the second drive circuit, or arranging at least one of the plurality of LEEs driven by the second constant current driver of the second drive circuit to reside physically within the first drive circuit.

The method of producing a display according to 22 above, further comprising the characteristics according to any one or a combination of one or more of the above-noted 2-20.

23. A display comprising: a plurality of light-emitting elements (LEEs) arranged in an array, including a first set of LEEs configured to be driven by a first drive circuit, and a second set of LEEs configured to be driven by a second drive circuit, wherein the first set of LEEs and the second set of LEEs are multiplexed in the array such that at least a first LEE of the first set of LEEs is arranged physically at least partly or wholly between a first LEE of the second set of LEEs and a second LEE of the second set of LEEs.

The display according to 23 above, further comprising the characteristics according to any one or a combination of one or more of the above-noted 1-20.

Certain terms are used throughout the description and claims to refer to particular methods, features, or components. As those having ordinary skill in the art will appreciate, different persons may refer to the same methods, features, or components by different names. This disclosure does not intend to distinguish between methods, features, or components that differ in name but not function. The figures are not necessarily drawn to scale. Certain features and components herein may be shown in exaggerated scale or in somewhat schematic form and some details of conventional elements may not be shown or described in interest of clarity and conciseness.

Although various example embodiments have been described in detail herein, those skilled in the art will readily appreciate in view of the present disclosure that many modifications are possible in the example embodiments without materially departing from the concepts of present disclosure. Accordingly, any such modifications are intended to be included in the scope of this disclosure. Likewise, while the disclosure herein contains many specifics, these specifics should not be construed as limiting the scope of the disclosure or of any of the appended claims, but merely as providing information pertinent to one or more specific embodiments that may fall within the scope of the disclosure and the appended claims. Any described features from the various embodiments disclosed may be employed in combination. In addition, other embodiments of the present disclosure may also be devised which lie within the scopes of the disclosure and the appended claims. Each addition, deletion, and modification to the embodiments that falls within the meaning and scope of the claims is to be embraced by the claims.

Certain embodiments and features may have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges may appear in one or more claims below. Any numerical value is "about" or "approximately" the indicated value, and takes into account experimental error and variations that would be expected by a person having ordinary skill in the art.

The invention claimed is:

1. A display, comprising:
a plurality of light-emitting elements (LEEs);
an electronical interface including electrical connections that electrically connect a LEE drive circuit to the plurality of LEEs the electrical connections providing control signals the plurality of LEEs; and
molding in between and/or on top of the LEEs,
wherein said molding has one or more notches between the LEEs or notches in areas where none of the LEEs are present, and
wherein said notches are characterized by removal of parts of the molding, defined as intermittent parts in areas where none of the LEEs are present.

2. The display according to claim 1, wherein the intermittent parts are randomly chosen.

3. The display according to claim 1, wherein the intermittent parts removed have regular or irregular shape.

4. The display according to claim 1, wherein the intermittent parts have a rectangular, triangular, circular or random cross section.

5. The display according to claim 1, wherein the plurality of LEEs are arranged in an array.

6. The display according to claim 1, wherein the array is rectangular.

7. The display according to claim 1, further comprising a non-volatile memory.

8. The display according to claim 1, wherein said LEEs are light-emitting diodes (LEDs), and hence the display being a LED display.

9. The display according to claim 1, further comprising a light and/or acoustic absorbing material provided within the notch.

10. The display according to claim 1, wherein 5% to 20% of a surface area of the molding comprises notches.

11. The display according to claim 1, further comprising an acoustic absorbing material provided within the notch.

12. The display according to claim 1, a depth of the notches is not greater than a depth of the molding.

13. A method for enhancing a visual performance of a module comprising:
providing a display in a studio environment, the display comprising a plurality of light-emitting elements (LEEs);
an electronical interface including electrical connections that electrically connect a LEE drive circuit to the plurality of LEEs the electrical connections providing control signals the plurality of LEEs; and
molding in between and/or on top of the LEEs,
wherein said molding has one or more notches between the LEEs or notches in areas where none of the LEEs are present;
displaying an image on said display; and
recording with a camera at least a part of said image displayed by the display.

14. A method for manufacturing a display having improved visual performance, the method comprising:
providing a display comprising a plurality of LEEs and molding in between and on top of the LEEs;
selecting areas in the molding where none of the LEEs are present; and
forming one or more notches within the molding by removing at least part of the molding in said selected areas, determined as intermittent parts.

15. The method according to claim 14, wherein said one or more notches are formed by a carving technique.

16. The method according to claim 14, wherein said plurality of LEEs are light-emitting diodes (LEDs), and hence the display being a LED display.

17. The method according to claim 14, further comprising providing a light absorbing material within the notches.

18. The display according to claim 14, wherein 5% to 20% of a surface area of the molding comprises notches.

19. The method according to claim 14, further comprising providing an acoustic absorbing material within the notches.

20. The method according to claim 14, wherein said one or more notches are formed by an etching technique.

21. A display, comprising:
a plurality of light-emitting elements (LEEs);
an electronical interface including electrical connections that electrically connect a LEE drive circuit to the plurality of LEEs the electrical connections providing control signals the plurality of LEEs;
molding in between and/or on top of the LEEs; and
light and/or an acoustic absorbing structures including light and/or an acoustic absorbing material provided on a surface of portions of the molding between the LEEs or notches in areas where none of the LEEs are present.

22. The display according to claim 21, wherein said light and/or an acoustic absorbing structures includes one or more notches in the molding between the LEEs or notches in areas where none of the LEEs are present.

23. The display according to claim 21, wherein said light and/or an acoustic absorbing material is applied directly to a top surface of the molding.

24. The display according to claim 21, wherein 5% to 20% of a surface area of the molding comprises said light and/or an acoustic absorbing structures.

25. The display according to claim 21, comprising light absorbing structures including light absorbing material provided on a surface of portions of the molding between the LEEs or notches in areas where none of the LEEs are present.

26. The display according to claim 21, comprising acoustic absorbing structures including an acoustic absorbing material provided on a surface of portions of the molding between the LEEs or notches in areas where none of the LEEs are present.

27. The display according to claim 21, wherein said light and/or an acoustic absorbing material is held to the top surface of the molding by an adhesive.

* * * * *